(12) United States Patent
Yamamoto

(10) Patent No.: US 12,015,319 B2
(45) Date of Patent: Jun. 18, 2024

(54) TRANSPORT SYSTEM

(71) Applicant: CANON KABUSHIKI KAISHA, Tokyo (JP)

(72) Inventor: Takeshi Yamamoto, Kanagawa (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 418 days.

(21) Appl. No.: 17/156,243

(22) Filed: Jan. 22, 2021

(65) Prior Publication Data

US 2021/0249943 A1 Aug. 12, 2021

(30) Foreign Application Priority Data

Feb. 7, 2020 (JP) ................................. 2020-019842

(51) Int. Cl.
| | | |
|---|---|---|
| H02K 41/03 | (2006.01) | |
| B65G 43/08 | (2006.01) | |
| B65G 54/02 | (2006.01) | |
| C23C 14/56 | (2006.01) | |
| H01L 21/677 | (2006.01) | |
| H02P 25/064 | (2016.01) | |

(52) U.S. Cl.
CPC ........... H02K 41/031 (2013.01); B65G 43/08 (2013.01); B65G 54/02 (2013.01); C23C 14/568 (2013.01); H01L 21/67709 (2013.01); H02P 25/064 (2016.02); B65G 2203/0283 (2013.01); B65G 2203/042 (2013.01)

(58) Field of Classification Search
CPC ..... H02K 41/031; H02P 25/064; B65G 43/08; B65G 54/02; B65G 2203/0283; B65G 2203/042
See application file for complete search history.

(56) References Cited

U.S. PATENT DOCUMENTS

| | | | | |
|---|---|---|---|---|
| 10,118,774 | B2 | 11/2018 | Tomoda et al. | ......... H02K 41/03 |
| 10,294,042 | B2 | 5/2019 | Tomoda et al. | ......... B65G 54/02 |
| 10,371,144 | B2 * | 8/2019 | Maruyama | ........... H02K 41/031 |
| 10,562,720 | B2 | 2/2020 | Yamamoto | ............. B65G 54/02 |
| 10,581,308 | B2 | 3/2020 | Yamamoto | ................ H02P 6/04 |
| 10,625,948 | B2 | 4/2020 | Fujii et al. | ............. B65G 35/06 |

(Continued)

FOREIGN PATENT DOCUMENTS

| | | |
|---|---|---|
| CN | 106612095 A | 5/2017 |
| CN | 108328249 A | 7/2018 |

(Continued)

OTHER PUBLICATIONS

WO 2016162288 A1 (Year: 2016).*

(Continued)

*Primary Examiner* — Gene O Crawford
*Assistant Examiner* — Lester Rushin, III
(74) *Attorney, Agent, or Firm* — VENABLE LLP

(57) ABSTRACT

A transport system includes: a mover that is movable in a transport direction; a stator that has a plurality of coils arranged in the transport direction and applies force to the mover by using the plurality of coils to which current is applied; an acquisition unit that acquires a position and an attitude of the mover moving in the transport direction; and a control unit that determines a current value applied to the plurality of coils and controls the force based on the position and the attitude of the mover.

19 Claims, 40 Drawing Sheets

(56) References Cited

U.S. PATENT DOCUMENTS

| | | | |
|---|---|---|---|
| 10,669,106 B2 | 6/2020 | Yamamoto | B65G 54/02 |
| 10,745,203 B2 | 8/2020 | Tomoda et al. | B60L 13/03 |
| 10,889,449 B2 | 1/2021 | Umeyama et al. | B65G 54/02 |
| 2004/0126907 A1 | 7/2004 | Korenaga | |
| 2018/0364593 A1* | 12/2018 | Nomoto | G03F 7/70875 |
| 2019/0092578 A1 | 3/2019 | Umeyama et al. | B60L 13/03 |
| 2019/0097515 A1 | 3/2019 | Ota et al. | B65G 43/00 |
| 2020/0052568 A1 | 2/2020 | Yamamoto | H02K 2201/18 |
| 2021/0094764 A1 | 4/2021 | Umeyama et al. | B65G 43/08 |

FOREIGN PATENT DOCUMENTS

| | | |
|---|---|---|
| CN | 108700831 A | 10/2018 |
| CN | 108946032 A | 12/2018 |
| JP | 9017846 A | 1/1997 |
| JP | 2003-052164 A | 2/2003 |
| JP | 2004-254489 A | 9/2004 |
| JP | 2017-507870 | 3/2017 |
| JP | 65-38710 B2 | 7/2019 |

OTHER PUBLICATIONS

KR 20100098639 A (Year: 2010).*
U.S. Appl. No. 17/161,981, filed Jan. 29, 2021.
U.S. Appl. No. 17/179,500, filed Feb. 19, 2021.
Japanese Office Action dated Oct. 31, 2023 during prosecution of related Japanese Application No. 2020-019842 (English translation included).
Chinese Office Action issued Mar. 28, 2024, during prosecution of related Chinese Application No. 202110154441.7 (English translation included).

* cited by examiner

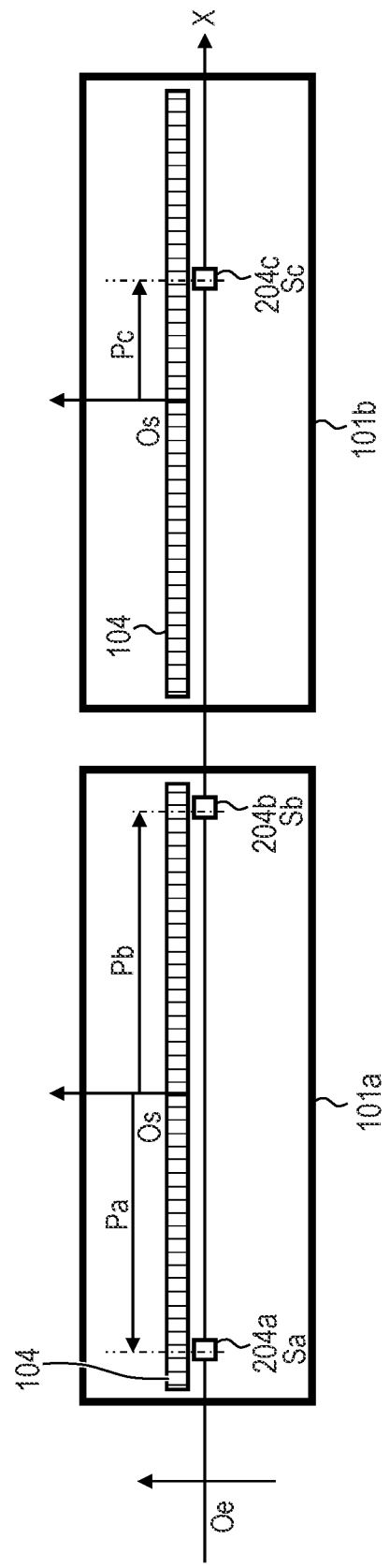

TRANSPORT SYSTEM

BACKGROUND OF THE INVENTION

Field of the Invention

The present invention relates to a transport system.

Description of the Related Art

In general, a transport system is used in a production line used for assembling industry products, a semiconductor exposure apparatus, or the like. In particular, a transport system in a production line transports workpieces such as components between a plurality of stations within a factory-automated production line or between factory-automated production lines. Further, such a transport system may be used as a transport apparatus within a process apparatus. As a transport system, a transport system with a movable magnet type linear motor has already been proposed.

In the transport system with a movable magnet type linear motor, the transport system is configured using a guiding apparatus involving mechanical contact, such as a linear guide. In the transport system using a guiding apparatus such as a linear guide, however, there is a problem of deteriorated productivity caused by a contaminant generated from a sliding portion of the linear guide, for example, a wear piece or a lubricant oil of a rail or a bearing, a volatilized substance thereof, or the like. Further, there is a problem of shortened life of a linear guide due to increased friction of a sliding portion at high speed transportation.

Accordingly, Japanese Patent No. 6538710 discloses a magnetic floating type transport apparatus that can transport a mover in a contactless manner. The magnetic floating type transport apparatus disclosed in Japanese Patent No. 6538710 realizes contactless transportation with coils for floating being arranged above a chamber and stator coils being arranged on the side face of the chamber at a constant interval along the transport direction of the mover.

In the transport apparatus as disclosed in Japanese Patent No. 6538710, however, control of the distance between the mover and the coil for floating is performed in a closed manner between the mover and individual coils, and it is therefore difficult to perform stable transportation of the mover.

SUMMARY OF THE INVENTION

According to one aspect of the present invention, provided is a transport system including: a mover that is movable in a transport direction; a stator that has a plurality of coils arranged in the transport direction and applies force to the mover by using the plurality of coils to which current is applied; an acquisition unit that acquires a position and an attitude of the mover moving in the transport direction; and a control unit that controls the force by current applied to the plurality of coils based on the acquired position and the acquired attitude of the mover.

Further features of the present invention will become apparent from the following description of exemplary embodiments with reference to the attached drawings.

BRIEF DESCRIPTION OF THE DRAWINGS

FIG. 7A is a schematic diagram illustrating a process using a mover position calculation function in the transport system according to the first embodiment of the present invention.

DESCRIPTION OF THE EMBODIMENTS

First Embodiment

A first embodiment of the present invention will be described below with reference to the drawings, FIG. 1 to FIG. 15.

Figure 1:
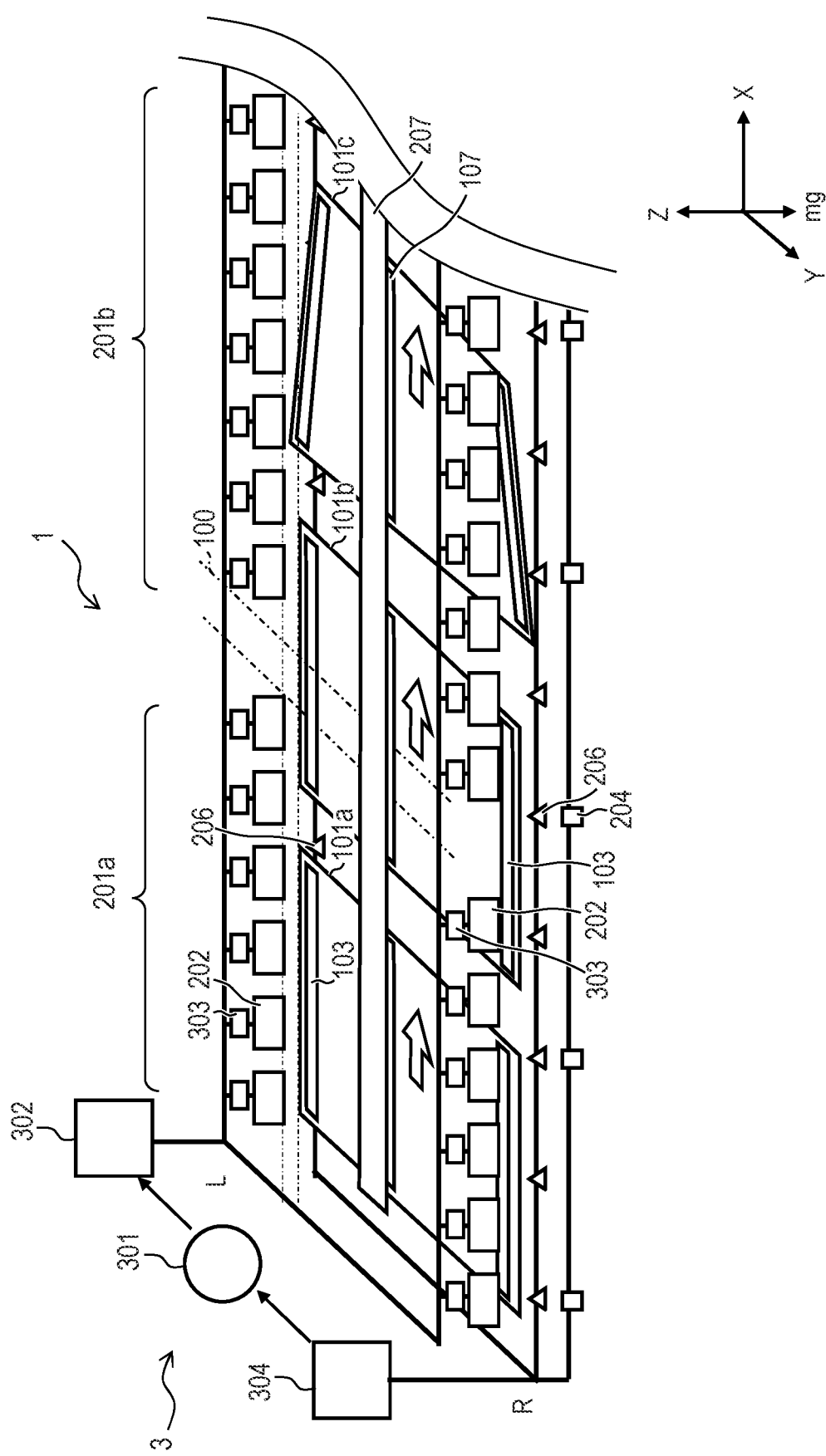
FIG. 1 is a schematic diagram illustrating a configuration of a transport system according to a first embodiment of the present invention.
Figure 2:
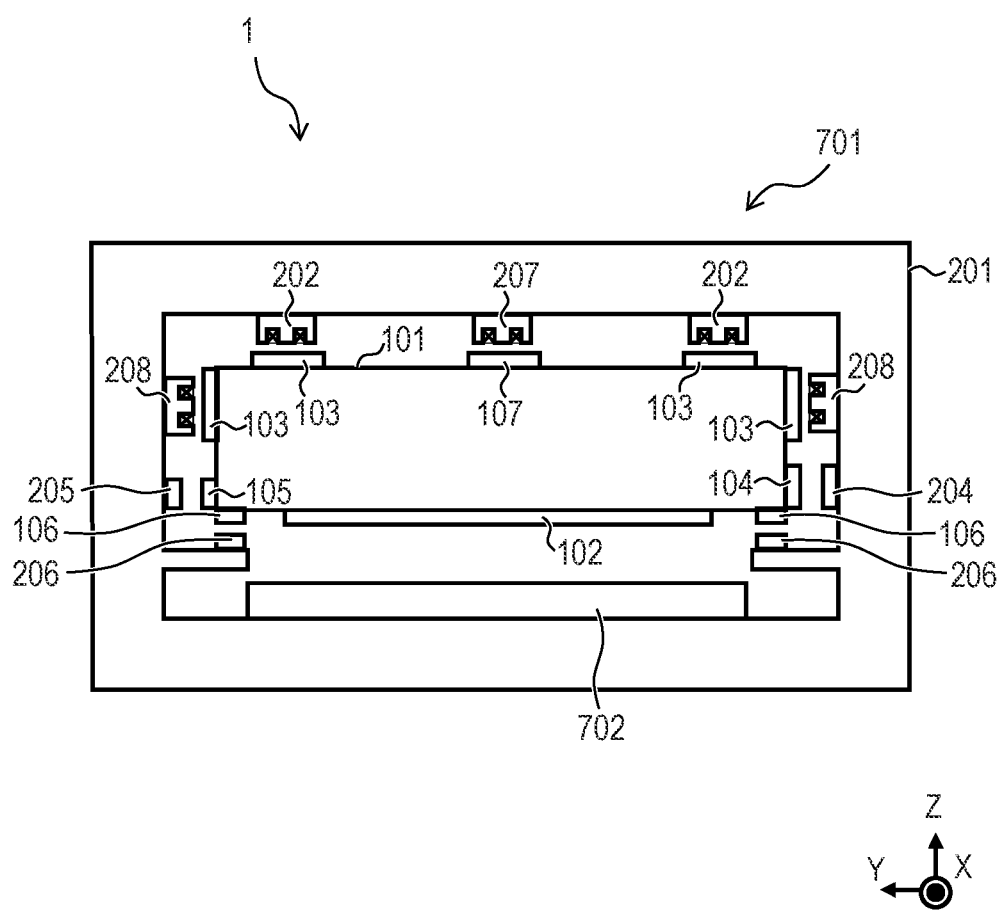
FIG. 2 is a schematic diagram illustrating a configuration of the transport system according to the first embodiment of the present invention.
Figure 3:
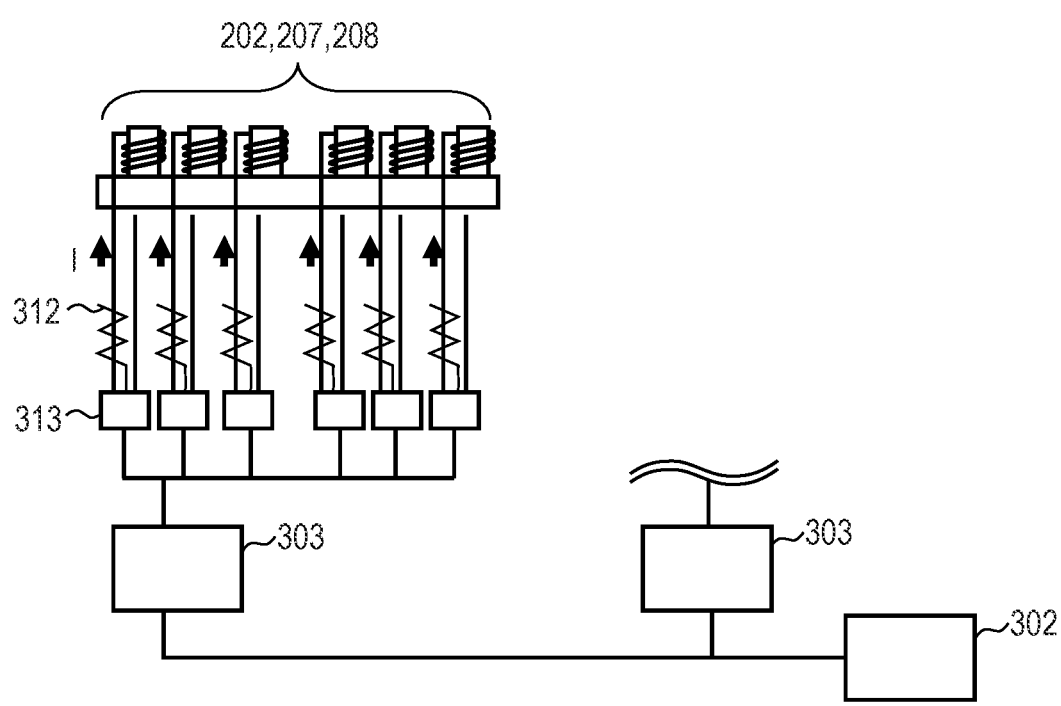
FIG. 3 is a schematic diagram illustrating coils and a configuration related to the coils in the transport system according to the first embodiment of the present invention.

First, a configuration of a transport system 1 according to the present embodiment will be described with reference to FIG. 1 to FIG. 3. FIG. 1 and FIG. 2 are schematic diagrams illustrating the configuration of the transport system 1 including movers 101 and stators 201 according to the present embodiment. Note that FIG. 1 and FIG. 2 are views of extracted main portions of each mover 101 and each stator 201, respectively. Further, FIG. 1 is a diagram of the mover 101 when viewed from a diagonally upper side, and FIG. 2 is a diagram of the mover 101 and the stator 201 when viewed from the X direction described later. FIG. 3 is a schematic diagram illustrating coils 202, 207, and 208 and a configuration related to the coils 202, 207, and 208 in the transport system 1.

As illustrated in FIG. 1 and FIG. 2, the transport system 1 according to the present embodiment has the mover 101 forming a carrier, a carriage, or a slider and the stator 201 forming a transport path. Further, the transport system 1 has an integration controller 301, coil controllers 302, coil unit controllers 303, and a sensor controller 304. Note that FIG. 1 illustrates three movers 101a, 101b, and 101c as the mover 101 and two stators 201a and 201b as the stator 201. In the following description, a reference including only the numeral common to others is used when it is not particularly required to distinguish components that may be present as multiple components, such as the mover 101 and the stator 201, and a lowercase alphabet is appended to a numeral reference to distinguish the individuals if necessary. Further, when a component of the mover 101 on the R side and a component on the L side of the mover 101 are distinguished from each other, "R" indicating the R side or "L" indicating the L side is appended to the lowercase alphabet.

The transport system 1 according to the present embodiment is a transport system with an inductive type linear motor that generates electromagnetic force between the coil 207 of the stator 201 and a conductive plate 107 of the mover 101 and applies the thrust in the X direction to the mover 101. Further, the transport system 1 according to the present embodiment is a magnetic floating type transport system that causes the mover 101 to float and transports the mover 101 in a contactless manner. The transport system 1 according to the present embodiment forms a part of a processing system having a process apparatus together that performs processing on a workpiece 102 transported by the mover 101.

The transport system 1 transports the workpiece 102 held by the mover 101 to a process apparatus that performs a processing operation on the workpiece 102 by transporting the mover 101 by the stator 201, for example. The process apparatus is not particularly limited and may be, for example, a film forming apparatus such as a vapor deposition apparatus, a sputtering apparatus, or the like to form a film on a glass substrate that is the workpiece 102. Note that, although FIG. 1 illustrates three movers 101 for two stators 201, the number is not limited thereto. In the transport system 1, one or a plurality of movers 101 may be transported on one or a plurality of stators 201.

Herein, coordinate axes, directions, and the like used in the following description are defined. First, the X-axis is taken along the horizontal direction that is the transport direction of the mover 101, and the transport direction of the mover 101 is defined as the X direction. Further, a Z-axis is taken along the perpendicular direction that is a direction orthogonal to the X direction, and the perpendicular direction is defined as a Z direction. The perpendicular direction corresponds to a direction of the gravity (mg direction). Further, a Y-axis is taken is taken along a direction orthogonal to the X direction and the Z direction, and the direction orthogonal to the X direction and the Z direction is defined as a Y direction. Furthermore, a rotation direction around the X-axis is defined as a Wx direction, a rotation direction around the Y-axis is defined as a Wy direction, and a rotation direction around the Z-axis is defined as a Wz direction. Further, "*" is used as a multiplication symbol. Further, the center of the mover 101 is defined as origin Oc, the Y+ side is denoted as R side, and the Y− side is denoted as L side. Note that, although the transport direction of the mover 101 is not necessarily required to be a horizontal direction, the Y direction and the Z direction can be similarly defined also in such a case with the transport direction being defined as the X direction. Note that the X direction, the Y direction, and the Z direction are not necessarily limited to directions orthogonal to each other and can be defined as directions crossing each other.

Further, a displacement in the transport direction is defined as a position, and a displacement in other directions is defined as a state together with an attitude, a position and the attitude, and a displacement in a twist direction described later. Further, denotation of the q-axis and the d-axis used in the following description is the same as the denotation of the q-axis and the d-axis in vector control generally used in synchronous motor control, respectively. A direction along the q-axis is defined as the q-axis direction, and a direction along the d-axis is defined as the d-axis direction.

Further, symbols used in the following description are as follows. Note that each symbol is used for respective cases of the coils 202, 207, and 208 in a duplicated manner.

Oc: the origin of the mover 101
Os: the origin of the linear scale 104
Oe: the origin of stator 201
   j: index for identifying a coil
(Note that j is an integer satisfying $1 \le j \le N$, where N is an integer greater than or equal to two.)
N: the number of installed coils
Ij: current amount applied to the j-th coil
   P: state including the position and the attitude of the mover 101 (X, Y, Z, Wx, Wy, Wz)
X (j, P): X-coordinate of the j-th coil when viewed from the center of the mover 101 in a state P
Y (j, P): Y-coordinate of the j-th coil when viewed from the center of the mover 101 in a state P
Z (j, P): Z-coordinate of the j-th coil when viewed from the center of the mover 101 in a state P
T: force applied to the mover 101
Tx: force component in the X direction of force T
Ty: force component in the Y direction of force T
Tz: force component in the Z direction of force T
Twx: torque component in the Wx direction of force T
Twy: torque component in the Wy direction of force T
Twz: torque component in the Wz direction of force T
   Ez (j, P): force in the Z direction working on the mover 101 in the state P when unit current is applied to the j-th coil
   Ex (j, P): force in the X direction working on the mover 101 in the state P when unit current is applied to the j-th coil
   Ey (j, P): force in the Y direction working on the mover 101 in the state P when unit current is applied to the j-th coil
   Eq (j, P): force in the q-axis direction working on the mover 101 in the state P when unit current is applied to the j-th coil
   Ed (j, P): force in the d-axis direction working on the mover 101 in the state P when unit current is applied to the j-th coil
   Eh (j, P): force in the h-axis direction working on the mover 101 in the state P when unit current is applied to the j-th coil
$\Sigma$: sum when the index j is changed from 1 to N
$\Sigma L$: sum when the index of a coil on the L side is changed
$\Sigma R$: sum when the index of a coil on the R side is changed
   *: product of matrixes, vectors, or matrix and vector
M: torque contribution matrix
K: pseudo-current vector (column vector)
Tq: torque vector (column vector)
Is: coil current vector (column vector)
Fs: coil force vector (column vector)
M (a, b): element on the a-th row and on the b-th column of the matrix M
   Inv ( ): inverse matrix
Tr ( ): transpose matrix
Tr (element 1, element 2, . . . ): column vector whose elements are element 1, element 2, . . .
   WyR: displacement in the Wy direction on the R side of the mover 101
WyL: displacement in the Wy direction on the L side of the mover 101

As indicated by arrows in FIG. 1, the mover 101 is configured to be movable in the X direction that is the transport direction. The mover 101 has yoke plates 103 and the conductive plate 107. Further, the mover 101 has the linear scale 104, a Y-target 105, and Z-targets 106.

A plurality of yoke plates 103 are attached and installed on a plurality of portions of the mover 101. Specifically, the yoke plates 103 are attached and installed along the X direction at respective ends on the R side and the L side on the top face of the mover 101. Further, the yoke plates 103 are attached and installed along the X direction at respective side faces on the R side and the L side of the mover 101. Each yoke plate 103 is an iron plate made of a substance having a large magnetic permeability, for example, iron.

The conductive plate 107 is attached and installed along the X direction at the center part on the top face of the mover 101. The conductive plate 107 is not particularly limited as long as it has conductivity, such as a conductive metal plate, and an aluminum plate or the like having a small electric resistance is preferable.

Note that the installation places of yoke plates 103 and conductive plates 107 and the number thereof are not limited to the example described above and may be changed as appropriate.

The linear scale 104, the Y-target 105, and the Z-target 106 are attached and installed in the mover 101 at positions that can be read by the linear encoder 204, the Y-sensor 205, and the Z-sensor 206 installed on the stator 201, respectively.

The stator 201 has the coils 202, 207, and 208, the linear encoder 204, the Y-sensor 205, and the Z-sensor 206.

A plurality of coils 202 are attached and installed along the X direction on the stator 201 so as to be able to face, along the Z direction, the yoke plate 103 installed on the top face of the mover 101. Specifically, the plurality of coils 202 are arranged and installed in two lines parallel to the X direction so as to be able to face, from the top in the Z direction, the two yoke plates 103 installed at respective ends on the R side and the L side on the top face of the mover 101.

A plurality of coils 208 are attached and installed along the X direction to the stator 201 so as to be able to face, along the Y direction, the yoke plate 103 installed on the side face of the mover 101. Specifically, the plurality of coils 208 are arranged and installed in two lines parallel to the X direction so as to be able to face, from the side in the Y direction, the two yoke plates 103 installed on respective side faces on the R side and the L side of the mover 101.

A plurality of coils 207 are attached and installed along the X direction on the stator 201 so as to be able to face, along the Z direction, the conductive plate 107 installed on the top face of the mover 101. Specifically, the plurality of coils 207 are arranged and installed in a single line parallel to the X direction so as to be able to face, from the top in the Z direction, the conductive plates 107 installed at the center part on the top face of the mover 101.

The stator 201 applies force to the mover 101 that is movable in the transport direction by respective coils 202, 207, and 208 to which current is applied. Thereby, the mover 101 is transported in the transport direction while the position and the attitude thereof are controlled.

Note that the installation places of the coils 202, 207, and 208 are not limited to the examples described above and may be changed as appropriate. Further, the number of installed coils 202, 207, and 208 may be changed as appropriate.

The linear encoder 204, the Y-sensor 205, and the Z-sensor 206 function as a detection unit that detects the position and the attitude of the mover 101 that moves in the transport direction.

The linear encoder 204 is attached and installed on the stator 201 so as to be able to read the linear scale 104 installed on the mover 101. The linear encoder 204 detects the relative position to the linear encoder 204 of the mover 101 by reading the linear scale 104.

The Y-sensor 205 is attached and installed on the stator 201 so as to be able to detect the distance in the Y direction to the Y-target 105 installed on the mover 101.

The Z-sensor 206 is attached and installed on the stator 201 so as to be able to detect the distance in the Z direction to the Z-target 106 installed on the mover 101.

The mover 101 is configured to be transported with the workpiece 102 attached or held above or under the mover 101, for example. Note that FIG. 2 illustrates a state where the workpiece 102 is attached under the mover 101. Note that the mechanism used for attaching or holding the workpiece 102 to the mover 101 is not particularly limited, and a general attaching mechanism, a general holding mechanism, or the like such as a mechanical hook, an electrostatic chuck, or the like may be used.

Note that FIG. 2 illustrates a case where the mover 101 and the stator 201 are embedded inside a chamber of a vapor deposition apparatus 701 that is an example of the process apparatus that performs a processing operation on the workpiece 102. The vapor deposition apparatus 701 has a vapor deposition source 702 that performs deposition on the workpiece 102 attached to the mover 101. The vapor deposition source 702 is installed on a lower part inside the chamber of the vapor deposition apparatus 701 so that the vapor deposition source 702 can face the workpiece 102 attached under the mover 101. With vapor deposition using the vapor deposition source 702, a thin film of a metal, an oxide, or the like is formed on a substrate that is the workpiece 102 attached under the mover 101 transported to an installation place of the vapor deposition source 702. In such a way, the workpiece 102 together with the mover 101 is transported, processing is performed on the transported workpiece 102 by the process apparatus, and an article is manufactured.

Further, FIG. 1 illustrates a region including a place where a structure 100 such as a gate valve, for example, is present between the stator 201a and the stator 201b. The place where the structure 100 is present is a place which is located between a plurality of stations within a production line or between production lines and where continuous arrangement of electromagnets or coils is not possible.

A control system 3 that controls the transport system 1 is provided to the transport system 1. Note that the control system 3 may form a part of the transport system 1. The control system 3 has the integration controller 301, the coil controllers 302, the coil unit controllers 303, and the sensor controller 304. The coil controllers 302 and the sensor controller 304 are connected to the integration controller 301 in a communicable manner. The plurality of coil unit controllers 303 are connected to the coil controller 302 in a communicable manner. The plurality of linear encoders 204, the plurality of Y-sensors 205, and the plurality of Z-sensors 206 are connected to the sensor controller 304 in a communicable manner. The coils 202, 207, and 208 are connected to each coil unit controller 303 (see FIG. 3).

The integration controller 301 determines current instruction values to be applied to the plurality of coils 202, 207, and 208 based on the output from the linear encoder 204, the Y-sensor 205, and the Z-sensor 206 transmitted from the sensor controller 304. The integration controller 301 transmits the determined current instruction values to the coil controllers 302. The coil controller 302 transmits the current instruction values received from the integration controller 301 to respective coil unit controllers 303. The coil unit controller 303 controls the current amounts of the connected coils 202, 207, and 208 based on the current instruction values received from the coil controller 302.

As illustrated in FIG. 3, one or a plurality of coils 202, 207, and 208 are connected to each coil unit controller 303.

A current sensor 312 and a current controller 313 are connected to each of the coils 202, 207, and 208. The current sensor 312 detects the current value flowing in the connected coils 202, 207, and 208. The current controller 313 controls the current amount flowing in the connected coils 202, 207, and 208.

The coil unit controller 303 instructs the current controller 313 for a desired current amount based on the current instruction value received from the coil controller 302. The current controller 313 detects the current value detected by the current sensor 312 and controls the current amount so that current of a desired current amount flows in individual coils 202, 207, and 208.

Figure 4:
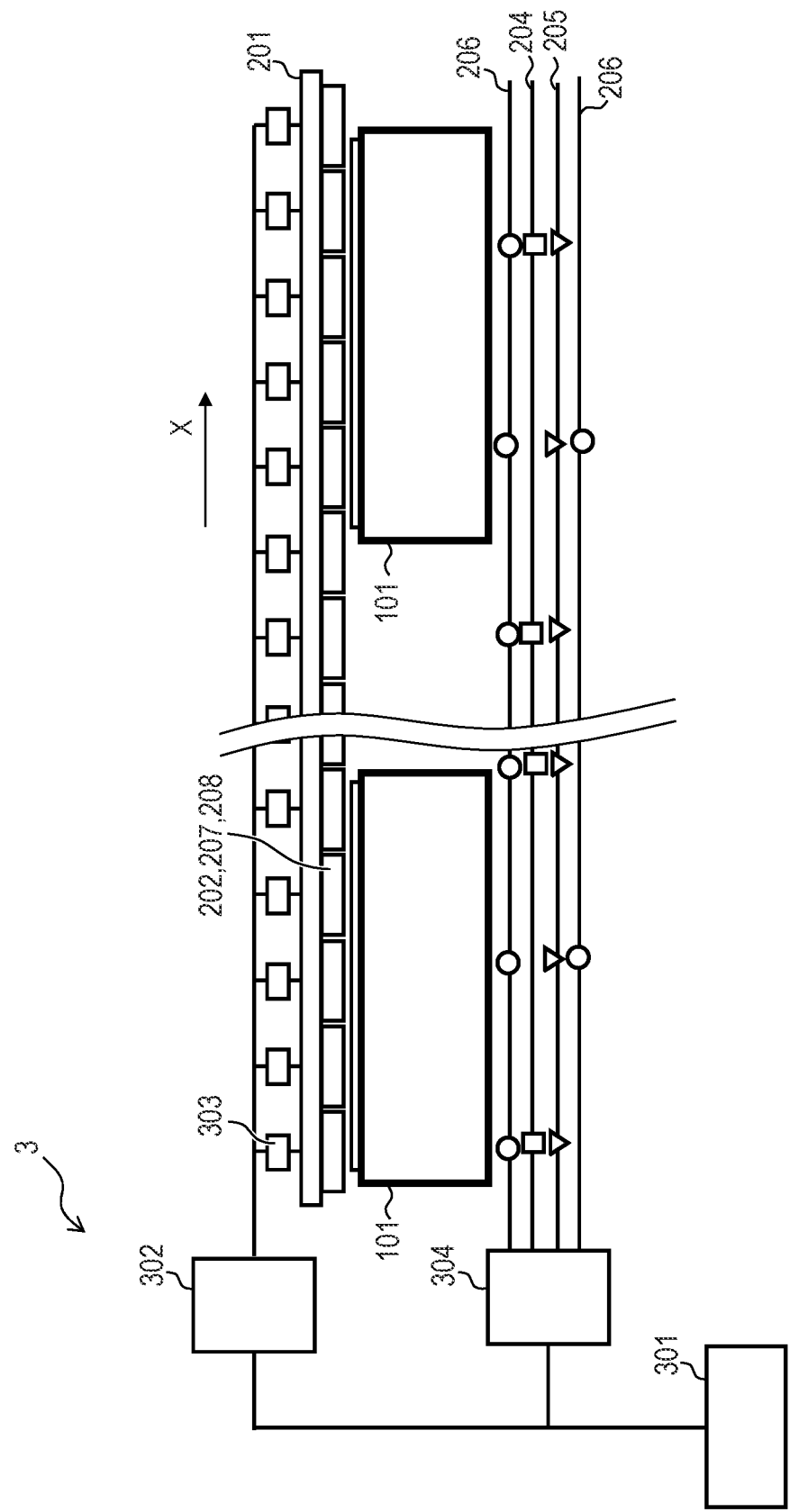
FIG. 4 is a schematic diagram illustrating a control system that controls the transport system according to the first embodiment of the present invention.

Next, the control system 3 that controls the transport system 1 according to the present embodiment will be further described with reference to FIG. 4. FIG. 4 is a schematic diagram illustrating the control system 3 that controls the transport system 1 according to the present embodiment.

As illustrated in FIG. 4, the control system 3 has the integration controller 301, the coil controller 302, the coil unit controllers 303, and the sensor controller 304. The control system 3 functions as a control apparatus that controls the transport system 1 including the mover 101 and the stator 201. The coil controller 302 and the sensor controller 304 are connected to the integration controller 301 in a communicable manner.

The plurality of coil unit controllers 303 are connected to the coil controller 302 in a communicable manner. The coil controller 302 and the plurality of coil unit controllers 303 connected thereto are provided in association with respective columns of the coils 202, 207, and 208. The coils 202, 207, and 208 are connected to each coil unit controller 303. The coil unit controller 303 can control the level of the current of the connected coils 202, 207, and 208.

The coil controller 302 instructs target current values to each of the connected coil unit controllers 303. The coil unit controller 303 controls the current amount of the connected coils 202, 207, and 208.

The plurality of linear encoders 204, the plurality of Y-sensors 205, and the plurality of Z-sensors 206 are connected to the sensor controller 304 in a communicable manner.

The plurality of linear encoders 204 are attached to the stator 201 at intervals such that one of the linear encoders 204 can always measure the position of one mover 101 even during transportation of the mover 101. Further, the plurality of Y-sensors 205 are attached to the stator 201 at intervals such that two of the Y-sensors 205 can always measure the Y-target 105 of one mover 101. Further, the plurality of Z-sensors 206 are attached to the stator 201 at intervals such that three of the two lines of Z-sensors 206 can always measure the Z-target 106 of one mover 101 and so as to form a plane.

The integration controller 301 determines current instruction values to be applied to the plurality of coils 202 based on the output from the linear encoders 204, the Y-sensors 205, and the Z-sensors 206 and transmits the current instruction values to the coil controllers 302. The coil controller 302 instructs the coil unit controllers 303 for the current values based on the current instruction values from the integration controller 301 as described above. Accordingly, the integration controller 301 functions as a control unit to transport the mover 101 in a contactless manner along the stator 201 and control the attitude of the transported mover 101 in six axes.

Figure 5:
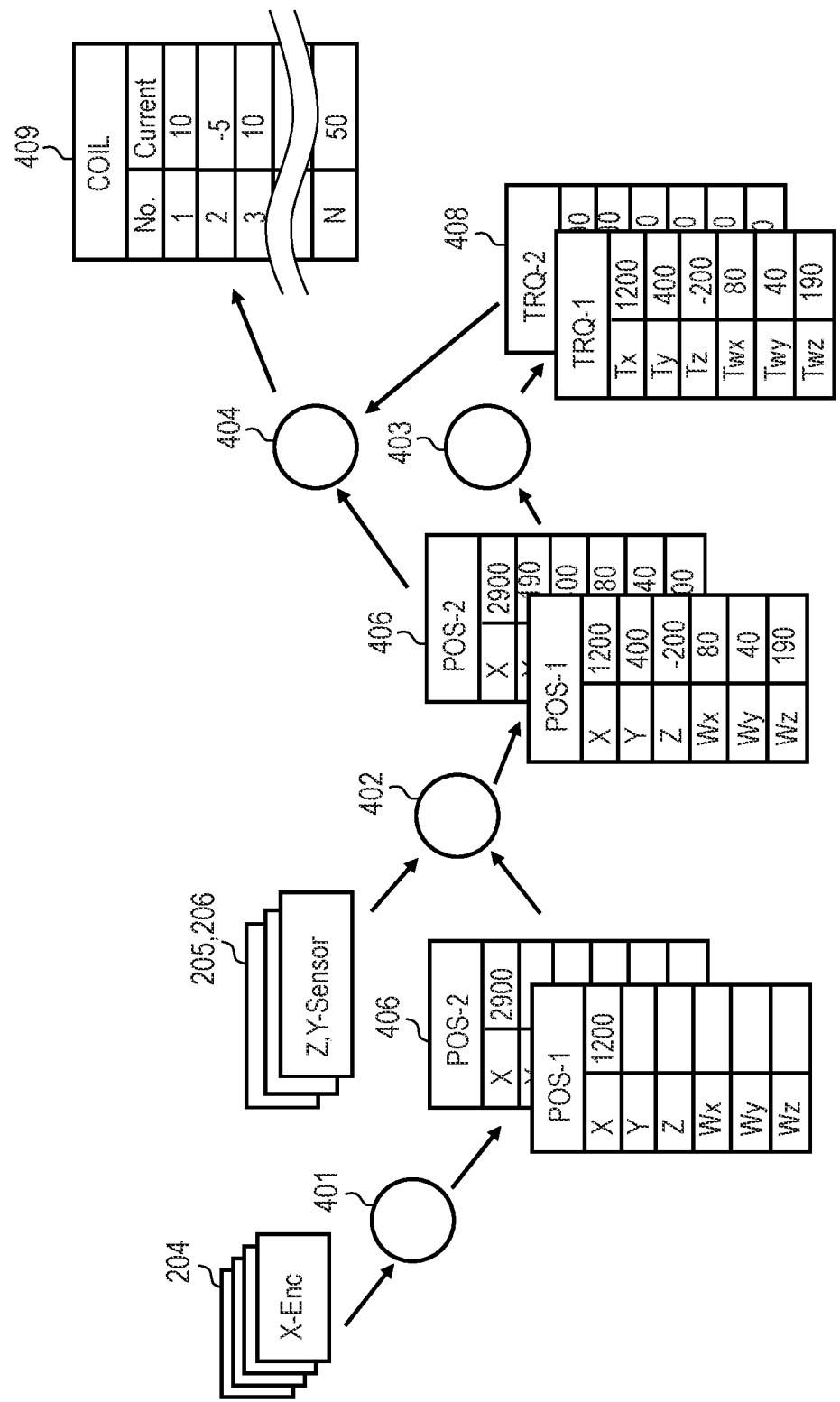
FIG. 5 is a schematic diagram illustrating an attitude control method of a mover in the transport system according to the first embodiment of the present invention.

The attitude control method of the mover 101 performed by the integration controller 301 will be described below with reference to FIG. 5. FIG. 5 is a schematic diagram illustrating the attitude control method of the mover 101 in the transport system 1 according to the present embodiment. FIG. 5 illustrates the overview of the attitude control method of the mover 101 by mainly focusing on the data flow. The integration controller 301 functions as a control unit that performs a process using a mover position calculation function 401, a mover attitude calculation function 402, a mover attitude control function 403, and a coil current calculation function 404 as described below. Accordingly, the integration controller 301 controls transportation of the mover 101 while controlling the attitude of the mover 101 in six axes. Note that, instead of the integration controller 301, the coil controller 302 can perform the same process as the integration controller 301.

First, the mover position calculation function 401 is used to calculate the number and the positions of the movers 101 on the stator 201, which forms a transport path, in accordance with the measured values from the plurality of linear encoders 204 and information on the attachment position thereof. Thereby, the mover position calculation function 401 updates mover position information (X) and number information in mover information 406 that is information on the mover 101. The mover position information (X) illustrates the position in the X direction that is the transport direction of the mover 101 on the stator 201. The mover information 406 is prepared for each mover 101 on the stator 201 as indicated as POS-1, POS-2, . . . in FIG. 5, for example.

Next, the mover attitude calculation function 402 is used to determine the Y-sensor 205 and the Z-sensor 206 that can measure respective movers 101 from the mover position information (X) in the mover information 406 updated by the mover position calculation function 401. Next, the mover attitude calculation function 402 calculates attitude information (Y, Z, Wx, Wy, Wz) that is information on the attitude of each mover 101 based on the values output from the determined Y-sensor 205 and the determined Z-sensor 206 and updates the mover information 406. The mover information 406 updated by the mover attitude calculation function 402 includes the mover position information (X) and the attitude information (Y, Z, Wx, Wy, Wz).

Next, the mover attitude control function 403 is used to calculate application force information 408 for each mover 101 from the current mover information 406 including the mover position information (X) and the attitude information (Y, Z, Wx, Wy, Wz) and an attitude target value. The application force information 408 is information related to the magnitude of force to be applied to each mover 101. The application force information 408 includes information related to three-axis components of force T (Tx, Ty, Tz) and three-axis components of torque (Twx, Twy, Twz) to be applied. The application force information 408 is prepared for each mover 101 on the stator 201 as indicated as TRQ-1, TRQ-2, . . . in FIG. 5, for example.

Herein, Tx, Ty, and Tz, which are three-axis components of force, are an X direction component, a Y direction component, and a Z direction component of force, respectively. Further, Twx, Twy, and Twz, which are three-axis components of torque, are a component around the X-axis, a component around the Y-axis, and a component around the Z-axis of torque, respectively. The transport system 1 according to the present embodiment controls transportation of the mover 101 while controlling the attitude of the mover 101 in six axes by controlling these six-axis components (Tx, Ty, Tz, Twx, Twy, Twz) of force T.

Next, the coil current calculation function 404 is used to determine a current instruction value 409 applied to respective coils 202, 207, and 208 based on the application force information 408 and the mover information 406.

In such a way, the integration controller 301 determines the current instruction value 409 by performing a process using the mover position calculation function 401, the mover attitude calculation function 402, the mover attitude control function 403, and the coil current calculation function 404. The integration controller 301 transmits the determined current instruction value 409 to the coil controller 302.

Control of the position and the attitude of the mover 101 will be further described in detail with reference to FIG. 6.

Figure 6:
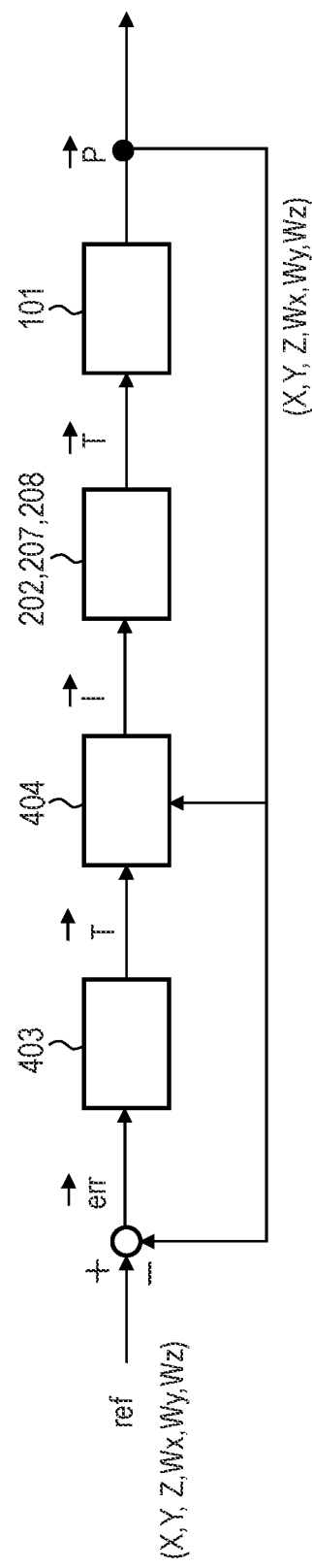
FIG. 6 is a schematic diagram illustrating an example of a control block used for controlling the position and the attitude of the mover in the transport system according to the first embodiment of the present invention.

FIG. 6 is a schematic diagram illustrating an example of a control block used for controlling the position and the attitude of the mover 101.

In FIG. 6, the symbol P denotes the position and the attitude (also referred to as a position and attitude or a state) of the mover 101 and has components (X, Y, Z, Wx, Wy, Wz). The symbol ref denotes a target value of (X, Y, Z, Wx, Wy, Wz). The symbol err denotes a deviation between the target value ref and the position and the attitude P.

The mover attitude control function 403 is used to calculate force T to be applied to the mover 101 for achieving the target value ref based on the level of the deviation err, the change in the deviation err, an accumulation value of the deviation err, or the like. The coil current calculation function 404 is used to calculate coil current I to be applied to the coils 202, 207, and 208 for applying the force T to the mover 101 based on the force T to be applied and the position and the attitude P. The coil current I calculated in such a way is applied to the coils 202, 207, and 208, and thereby the force T works on the mover 101, and the position and the attitude P changes to the target value ref.

By configuring the control block in such a way, it is possible to control the position and the attitude P of the mover 101 to a desired target value ref.

Figure 7B:
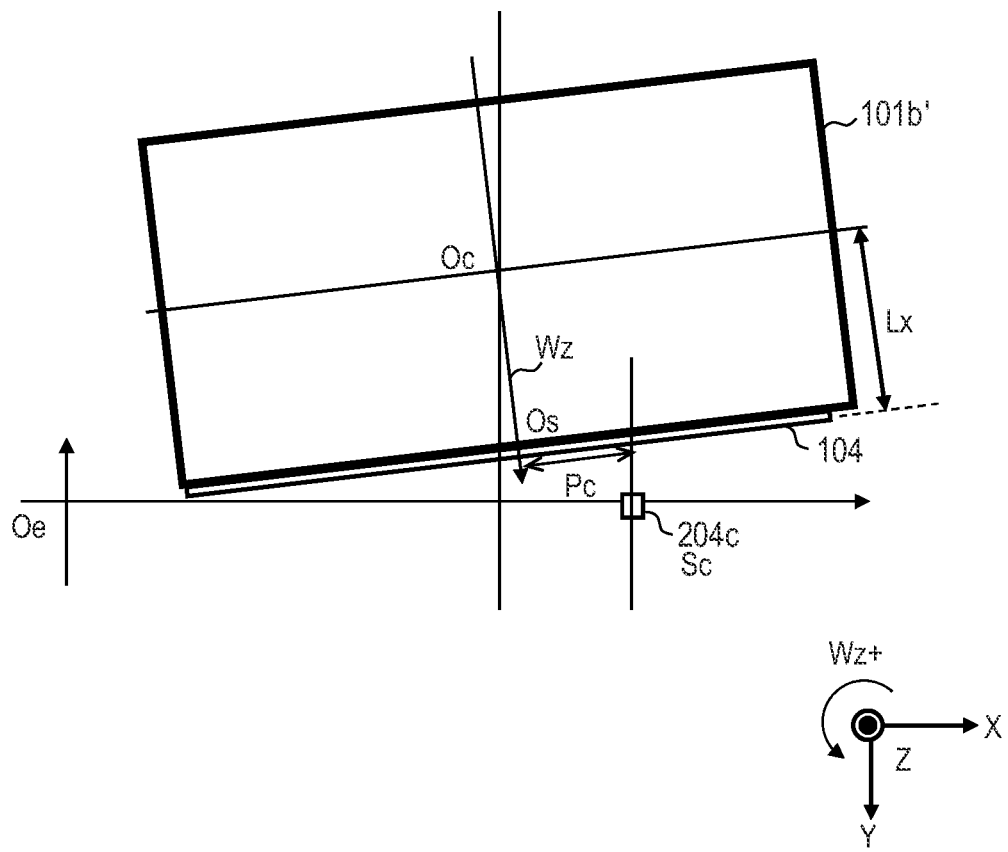
FIG. 7B is a schematic diagram illustrating a process using a mover position calculation function in the transport system according to the first embodiment of the present invention.

The process in accordance with the mover position calculation function 401 will now be described with reference to FIG. 7A and FIG. 7B. FIG. 7A and FIG. 7B are schematic diagrams illustrating a process in accordance with the mover position calculation function.

In FIG. 7A, the reference point Oe corresponds to a position reference of the stator 201 to which the linear encoder 204 is attached. Further, the reference point Os corresponds to a position reference of the linear scale 104 attached to the mover 101. FIG. 7A illustrates a case where two movers 101a and 101b are transported as the mover 101, and three linear encoders 204a, 204b, and 204c are arranged as the linear encoder 204. Note that the linear scales 104 are attached to the same positions of respective movers 101a and 101b along the X direction.

For example, the single linear encoder 204c faces the linear scale 104 of the mover 101b illustrated in FIG. 7A. The linear encoder 204c reads the linear scale 104 of the mover 101b and outputs a distance Pc. Further, the position of the linear encoder 204c on the X-axis whose origin is the reference point Oe is Sc. Therefore, the position Pos(101b) of the mover 101b can be calculated by the following Equation (1).

$$Pos(101b) = Sc - Pc \qquad \text{Equation (1)}$$

For example, two linear encoders 204a and 204b face the linear scale 104 of the mover 101a illustrated in FIG. 7A. The linear encoder 204a reads the linear scale 104 of the mover 101a and outputs the distance Pa. Further, the position of the linear encoder 204a on the X-axis whose origin is the reference point Oe is Sa. Therefore, the position Pos(101a) on the X-axis of the mover 101a based on the output of the linear encoder 204a can be calculated by the following Equation (2).

$$Pos(101a) = Sa - Pa \qquad \text{Equation (2)}$$

Further, the linear encoder 204b reads the linear scale 104 of the mover 101a and outputs the distance Pb. Further, the position of the linear encoder 204b on the X-axis whose origin is the reference point Oe is Sb. Therefore, the position Pos(101a)' on the X-axis of the mover 101a based on the output of the linear encoder 204b can be calculated by the following Equation (3).

$$Pos(101a)' = Sb - Pb \qquad \text{Equation (3)}$$

Herein, since respective positions of the linear encoders 204a and 204b have been measured accurately in advance, the difference of two values Pos(101a) and Pos(101a)' is sufficiently small. When the difference of the positions of the mover 101 on the X-axis based on the output of the two linear encoders 204 is sufficiently small in such a way, it can be determined that these two linear encoders 204 are observing the linear scale 104 of the same mover 101.

Note that, when a plurality of linear encoders 204 face the same mover 101, it is possible to uniquely determine the position of the observed mover 101 by calculating the average value of the positions based on the output of the plurality of linear encoders 204 or the like.

Further, the mover 101 may rotate around the Z-axis by a rotation amount Wz. A case where correction of the position of the mover 101 using the displacement of this rotation amount Wz is required will be described with FIG. 7B.

FIG. 7B illustrates a case where the linear scale 104 is attached to one of the side faces in the Y direction of the mover 101b'. The position Os is the origin of the linear scale 104, and the position Oc is the origin of the mover 101b'. When the distance from the center Oc of the mover 101 to the linear scale 104 is Lx, more accurate position of the mover 101b' can be obtained by calculating the position Pos(101b') of the mover 101b' by using the following Equation (1b).

$$Pos(101b') = Sc - Pc - Wz*Lx + Wy*Lz \qquad \text{Equation (1b)}$$

The mover position calculation function 401 is used to calculate and determine the position X in the X direction of the mover 101 as the mover position information based on the output of the linear encoder 204 as described above.

Next, the process by using the mover attitude calculation function 402 will be described with reference to FIG. 8, FIG. 9A, and FIG. 9B.

Figure 8:
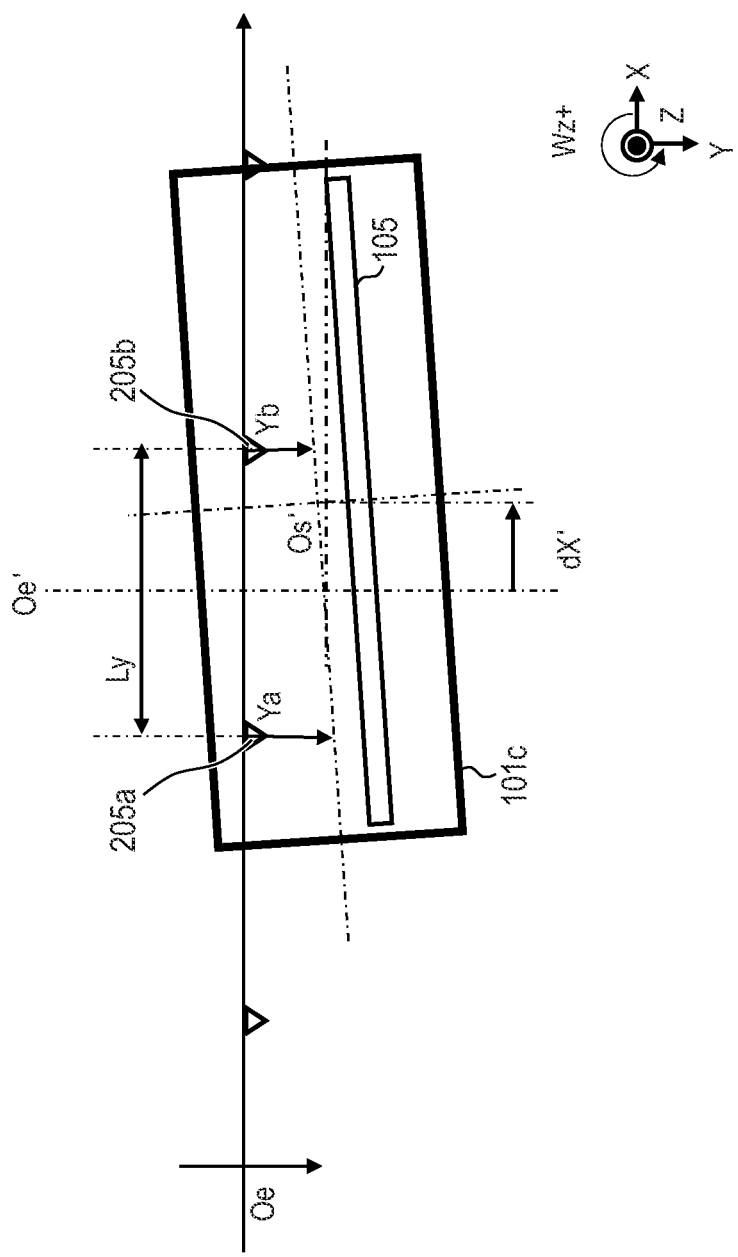
FIG. 8 is a schematic diagram illustrating a process using a mover attitude calculation function in the transport system according to the first embodiment of the present invention.

FIG. 8 illustrates a case where a mover 101c is transported as the mover 101, and Y-sensors 205a and 205b are arranged as the Y-sensor 205. The two Y-sensors 205a and 205b face the Y-target 105 of the mover 101c illustrated in FIG. 8. The rotation amount Wz around the Z-axis of the mover 101c is calculated by the following Equation (4), where the values of relative distances output by the two Y-sensors 205a and 205b are Ya and Yb, respectively, and the spacing between the Y-sensors 205a and 205b is Ly.

$$Wz = (Ya - Yb)/Ly \qquad \text{Equation (4)}$$

Note that three or more Y-sensors 205 may face the Y-target 105 for a particular position of the mover 101. In such a case, the inclination of the Y-target 105, that is, the rotation amount Wz around the Z-axis can be calculated by using a least-squire method or the like.

Figure 9A:
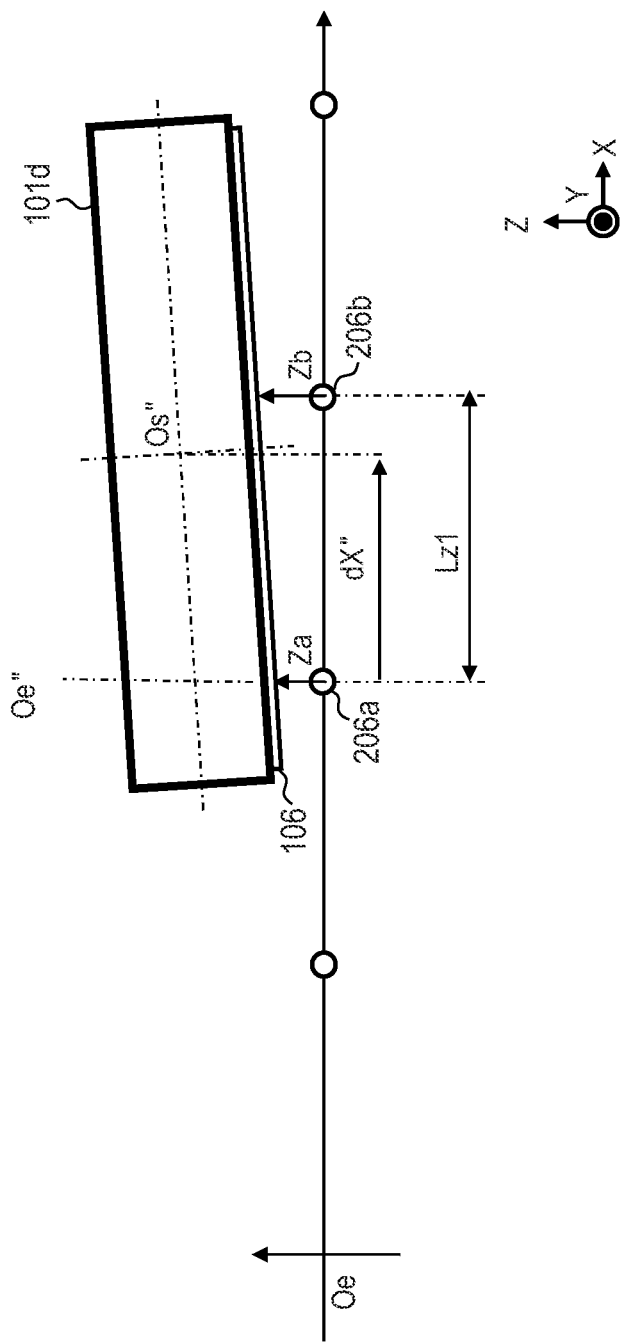
FIG. 9A is a schematic diagram illustrating a process using a mover attitude calculation function in the transport system according to the first embodiment of the present invention.
Figure 9B:
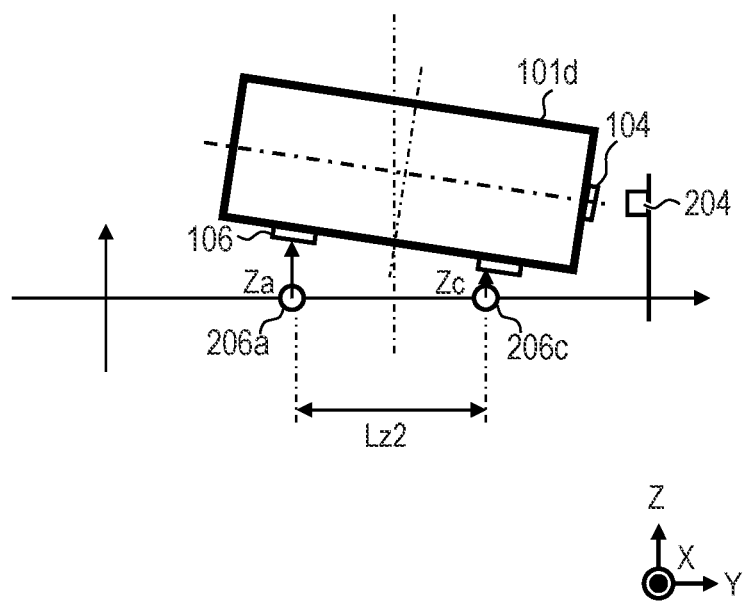
FIG. 9B is a schematic diagram illustrating a process using a mover attitude calculation function in the transport system according to the first embodiment of the present invention.

Further, FIG. 9A and FIG. 9B illustrate a case where a mover 101d is transported as the mover 101, and Z-sensors 206a, 206b, and 206c are arranged as the Z-sensor 206. The three Z-sensors 206a, 206, and 206c face the Z-target 106 of the mover 101d illustrated in FIG. 9A and FIG. 9B. Herein, the values of relative distances output by the three Z-sensors 206a, 206b, and 206c are Za, Zb, and Zc, respectively. Further, the distance between sensors in the X direction, that is, the distance between the Z-sensors 206a and 206b is Lz1. Further, the distance between sensors in the Y direction, that is, the distance between the Z-sensors 206a and 206c is Lz2. Then, the rotation amount Wy around the Y-axis and the rotation amount Wx around the X-axis can be calculated by the following Equations (5a) and (5b), respectively.

$$Wy=(Zb-Za)/Lz1 \quad \text{Equation (5a)}$$

$$Wx=(Zc-Za)/Lz2 \quad \text{Equation (5b)}$$

With the mover attitude calculation function 402, it is possible to calculate the rotation amounts Wx, Wy, and Wz around respective axes as attitude information on the mover 101, as described above.

Further, with the mover attitude calculation function 402, it is possible to calculate the position Y in the Y direction and the position Z in the Z direction of the mover 101 as attitude information on the mover 101 as follows.

First, calculation of the position Y in the Y direction of the mover 101 will be described with reference to FIG. 8. In FIG. 8, two Y-sensors 205 faced by the mover 101c are Y-sensors 205a and 205b, respectively. Further, the measured values of the Y-sensors 205a and 205b are Ya and Yb, respectively. Further, the middle point of the position of the Y-sensor 205a and the position of the Y-sensor 205b is denoted as Oe'. Furthermore, the position of the mover 101c obtained by Equations (1) to (3) is denoted as Os', and the distance from Oe' to Os' is denoted as dX'. At this time, the position Y in the Y direction of the mover 101c can be calculated by approximate calculation with the following Equation (6).

$$Y=(Ya+Yb)/2-Wz*dX' \quad \text{Equation (6)}$$

Next, calculation of the position Z in the Z direction of the mover 101 will be described with reference to FIG. 9A and FIG. 9B. Three Z-sensors 206 faced by the mover 101d are Z-sensors 206a, 206b, and 206c, respectively. Further, the measured values of the Z-sensors 206a, 206b, and 206c are Za Zb, and Zc, respectively. Further, the X-coordinate of the Z sensor 206a and the X-coordinate of the Z-sensor 206c are the same. Further, the position X of the Z-sensor 206a and the Z-sensor 206c is denoted as Oe". Furthermore, the distance from Oe" to the center Os" of the mover 101 is denoted as dX". At this time, the position Z in the Z direction of the mover 101 can be calculated by approximate calculation with the following Equation (7).

$$Z=(Za+Zb)/2+Wy*dX'' \quad \text{Equation (7)}$$

Note that, when both the rotation amounts of Wz and Wy are large for the position Y and the position Z, calculation can be performed at higher approximation accuracy.

In such a way, the integration controller 301 functions as an acquisition unit that acquires the position and the attitude (X, Y, Z, Wx, Wy, Wz) of the mover 101 by performing the process using the mover position calculation function 401 and the mover attitude calculation function 402.

Next, a method of determining current values to be applied to the coils 202, 207, and 208 used for applying desired force T to the mover 101 will be described. The force T applied to the mover 101 includes Tx, Ty, and Tz, which are three-axis components of force, and Twx, Twy, and Twz, which are three-axis components of torque, as described above. The integration controller 301 that performs a process using the coil current calculation function 404 can determine current values to be applied to the coils 202, 207, and 208 in accordance with the method of determining current values described below.

Note that, out of the force components and the torque components applied by the coils 202, 207, and 208, influence from one force component or torque component caused to the other force components or torque components may be sufficiently negligible for some cases. Specifically, the force and torque applied by the coils 202, 207, and 208 is formed of the force in X direction applied by the coil 207, the force in the Y direction and the torque in the Wz direction applied by the coil 208, and the force in the Z direction, the torque in the Wx direction, and the torque in the Wy direction applied by the coil 202. The force in the Y direction and the torque in the Wz direction applied by the coil 208 work in the horizontal direction. The force in the Z direction, the torque in the Wx direction, and the torque in the Wy direction applied by the coil 202 work in the floating direction. When the influence is sufficiently negligible, the current values can be calculated taking into consideration of only the force in the X direction for the coil 207, the force in the Y direction and the torque in the Wz direction for the coil 208, and the force in the Z direction, the torque in the Wx direction, and the torque in the Wy direction for the coil 202. A case where the influence can be sufficiently neglected will be described below.

First, current applied to each coil 202 for applying the force component Tz in the Z direction, the torque component Twx in the Wx direction, and the torque component Twy in the Wy direction to the mover 101 will be described with reference to FIG. 10 to FIG. 13.

Figure 10:
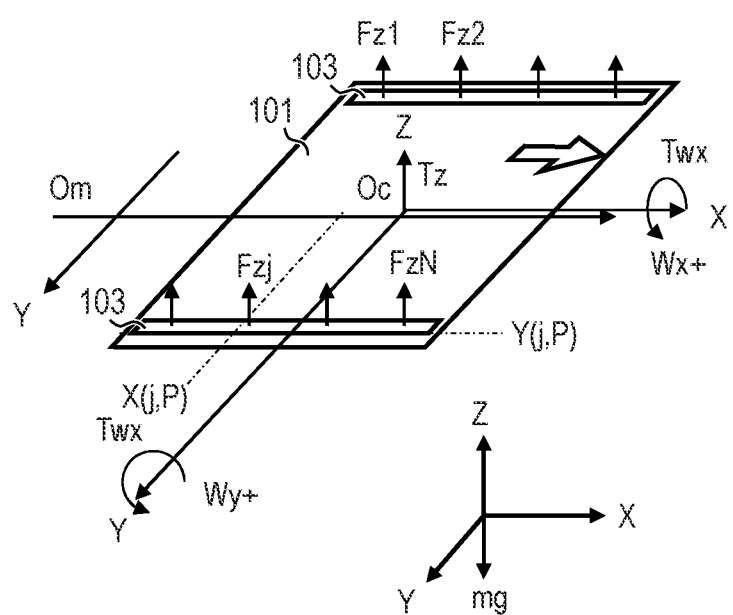
FIG. 10 is a schematic diagram illustrating a relationship between force working on a yoke plate attached to the mover and the force component and the torque component working on the mover 101 in the transport system according to the first embodiment of the present invention.

FIG. 10 is a schematic diagram illustrating a relationship between the force working on the yoke plate 103 attached to the mover 101 and the force component Tz and the torque components Twx and Twy working on the mover 101.

In FIG. 10, Fzj denotes force applied to the yoke plate 103 by the j-th coil 202. Note that j is an integer satisfying $1 \leq j \leq N$, where the number N of installed coils 202 is an integer greater than or equal to two. The torque applied by each force Fzj contributes to the torque components Twx and Twy. The torque applied by each force Fzj is determined in accordance with the force Fzj and the distance between the point of action and the center Oc of the mover 101.

Figure 11:
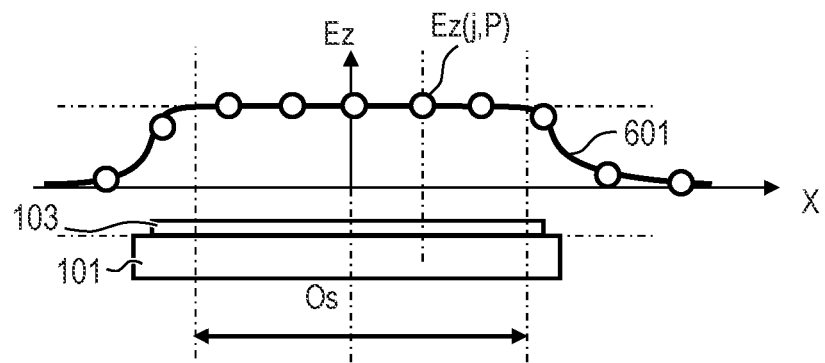
FIG. 11 is a graph schematically illustrating a thrust constant profile in the Z direction in the transport system according to the first embodiment of the present invention.

FIG. 11 is a graph schematically illustrating a thrust constant profile 601 in the Z direction. The thrust constant profile 601 schematically illustrates attractive force working on the yoke plate 103 when unit current is applied to the coil 202 used for floating that faces the yoke plate 103. The magnitude of the attractive force continuously changes with respect to the motion in the X direction.

Figure 12A:
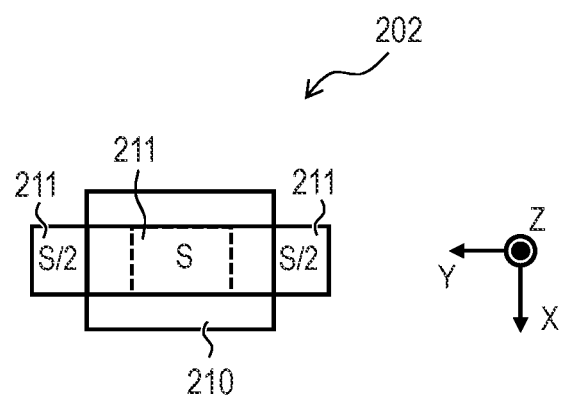
FIG. 12A is a schematic diagram illustrating a coil of a stator in the transport system according to the first embodiment of the present invention.
Figure 12B:
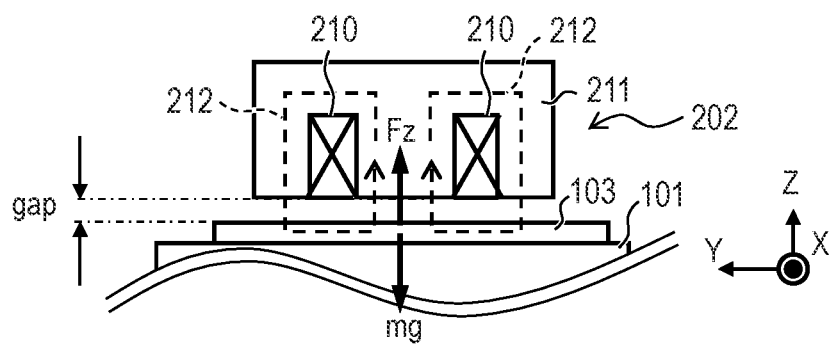
FIG. 12B is a schematic diagram illustrating the coil of the stator in the transport system according to the first embodiment of the present invention.

An example of a configuration of the coil 202 will now be described with reference to FIG. 12A and FIG. 12B. FIG. 12A and FIG. 12B are schematic diagrams illustrating the coil 202. FIG. 12A is a diagram of the coil 202 when viewed from the Z-axis direction, and FIG. 12B is a diagram of the coil 202 when viewed from the X-axis direction.

As illustrated in FIG. 12A and FIG. 12B, the coil 202 has a winding 210 and a core 211. Current is applied to the winding 210 by the current controller 313. In response to application of current to the winding 210, a magnetic path 212 that is a path of a magnetic flux is formed. Attractive force works between the coil 202 and the yoke plate 103 due to the magnetic flux in the magnetic path 212 formed in such a way.

Figure 13:
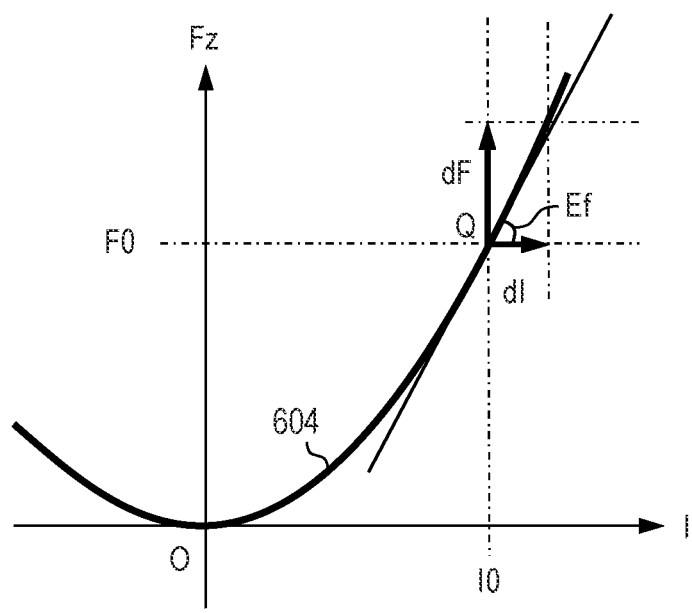
FIG. 13 is a graph schematically illustrating a relationship between the current amount applied to a coil and the magnitude of attractive force working between the coil and the yoke plate in the transport system according to the first embodiment of the present invention.

The relationship between the current applied to the coil 202 and the magnitude of the attractive force working between the coil 202 and the yoke plate 103 will be described in more detail with reference to FIG. 12A to FIG. 13. FIG. 13 is a graph schematically illustrating the relationship between the current applied to the coil 202 and the magnitude of the attractive force working between the coil 202 and the yoke plate 103. In the graph illustrated in FIG. 13, the horizontal axis represents the current amount I applied to the coil 202, and the vertical axis represents the magnitude of attractive force Fz working between the coil 202 and the yoke plate 103. The graph illustrated in FIG. 13 indicates an attractive force profile 604 indicating the magnitude of attractive force Fz to the current amount I.

When the spacing in the Z direction between the coil 202 and the yoke plate 103 is constant, the attractive force Fz is approximately proportional to the square of the current amount I. Herein, in the graph illustrated in FIG. 13, F0 represents an average magnitude of force working on each coil 202 required for compensating the gravity mg working on the mover 101.

Herein, numeric values and symbols are set as follows.
Bottom area of the core 211 of one coil 202: S=0.01 [m$^2$]
A part of the mass of the mover 101 compensated by one coil 202: F0=100 [N] (around 10 [kg])
Vacuum magnetic permeability: $\mu 0 = 4\pi \times 10^{-7}$
Airgap: gap [m]
Number of turns of the winding 210 of the coil 202: n [turn]
Coil current: I [A]
Magnetic flux density between the core 211 and the yoke plate 103: B [T]

If the magnetic permeability of the core 211 and the yoke plate 103 is sufficiently large relative to the vacuum magnetic permeability, Fz and B can be approximately calculated by the following Equation (8a) and (8b), respectively.

$$Fz = S*B^2/(2*\mu 0) \quad \text{Equation (8a)}$$

$$B = N*I*\mu 0/(2*gap) \quad \text{Equation (8b)}$$

Herein, when the number of turns is 500 [turn] and the coil current I0 is 1.0 [A], the airgap "gap" can be calculated to be 0.006266 [m] by Equation (8a) and Equation (8b).

Herein, in the attractive force profile 604, a point where I=I0 leading to Fz=F0 is Q. A part around this point Q will be described.

If the "gap" changes in the expansion direction by 0.25 [mm] from 0.006266 [m], it is necessary to generate larger magneto-motive force in the coil 202 in order to compensate the expanding "gap". If the "gap" is 0.006516 m and Equations (8a) and (8b) are calculated so as to generate the same Fz, the coil current I is calculated to be 1.0399 [A]. Because of such a level of current value, the variation in the current value of the coil current during transportation of the mover 101 is sufficiently small compared to the coil current I0 that is a reference.

Therefore, around the point Q, the relationship expressed in the following Equation (8c) is met between current dI applied in addition to the current I0 and the magnitude of force dF additionally generated in the Z-axis direction by application of current dI. Note that the relationship expressed by Equation (8c) is not met around the origin O.

$$dF \propto dI \quad \text{Equation (8c)}$$

Herein, the ratio of dF and dI is defined by the following Equation (8d).

$$dF/dI = Ez \quad \text{Equation (8d)}$$

In the thrust constant profile 601 illustrated in FIG. 11, Ez(j, P) is indicated. Ez(j, P) has a ratio indicated by Equation (8d). That is, Ez(j, P) represents the ratio of the magnitude of force dF additionally generated in the Z-axis direction to the current Id when the additional current dI is applied to the current I0 being applied on average to the j-th coil 202 when the mover 101 is in the position and attitude P.

Description is provided with reference to FIG. 10 in accordance with the denotation described above, where j is the index identifying the coil 202. In the following, for simplified illustration, additional force dFzj in the Z direction is simply denoted as Fzj, and the additional current dIj is denoted as Ij.

The additional force Fzj generated in the Z direction by the j-th coil 202 is expressed by the following Equation (9a), where Ij represents additional current applied to the j-th coil 202.

$$Fzj = Ez(j,P)*Ij \quad \text{Equation (9a)}$$

Furthermore, X(j, P) is defined as the relative position in the X direction of the j-th coil 202 when viewed from the origin Oc of the mover 101, and Y(j, P) is defined as the relative position in the Y direction of the j-th coil 202 when viewed from the origin Oc of the mover 101. Then, the force component Tz in the Z direction, the torque component Twx in the Wx direction, and the torque component Twy in the Wy direction are expressed by the following Equations (9b), (9c), and (9d), respectively.

$$Tz = \Sigma(Ez(j,P)*Ij) \quad \text{Equation (9b)}$$

$$Twx = \Sigma(-Ez(j,P)*Y(j,P)*Ij) \quad \text{Equation (9c)}$$

$$Twy = \Sigma(Ez(j,P)*X(j,P)*Ij) \quad \text{Equation (9d)}$$

If the current Ij satisfying the above Equations (9b), (9c), and (9d) is applied to each coil 202, desired force component and torque component (Tz, Twx, Twy) can be obtained.

The torque contribution matrix M is defined here. The torque contribution matrix M is a matrix indicating the magnitude of contribution to each force component and torque component (Tz, Twx, Twy) when unit current is applied to each of the first to j-th coils 202 when the mover is in the position and attitude P. In such a way, the torque contribution matrix M is used and information related to contribution to each component of the force component and the torque component (Tz, Twx, Twy) caused by unit current applied to each coil 202 is used to determine the current value applied to each coil 202.

In the torque contribution matrix M, the first row is associated with the Z direction, the second row is associated with the Wx direction, and the third row is associated with the Wy direction. Then, respective elements M(1, j), M(2, j), and M(3, j) on the first row on the j-th column, the second row on the j-th column, and the third row on the j-th column of the torque contribution matrix M are expressed by the following Equations (10a), (10b), and (10c), respectively. The torque contribution matrix M is a matrix of three rows by N columns Note that respective rows of the torque contribution matrix M are linearly independent of each other.

$$M(2,j) = -Ez(j,P)*Y(j,P) \quad \text{Equation (10b)}$$

$$M(3,j) = Ez(j,P)*X(j,P) \quad \text{Equation (10c)}$$

On the other hand, a column vector whose elements are current amounts I1 to IN to be applied to the first to N-th coils 202 is introduced with a coil current vector Is. The coil current vector Is is a column vector on the N-th row on the first column expressed by the following Equation (10d).

$$Is = Tr(I1, I2, \ldots, Ij, \ldots, IN) \quad \text{Equation (10d)}$$

The torque vector Tq is defined here as the following Equation (11).

$$Tq = Tr(Tz, Twx, Twy) \quad \text{Equation (11)}$$

Then, the following Equation (12) is obtained from Equations (9b) to (9d), (10a) to (10d), and (11).

$$Tq = M*Is \qquad \text{Equation (12)}$$

The pseudo current vector K is introduced here. The pseudo current vector K is a column vector having three rows by one column and is a vector satisfying the following Equation (13) when Tr(M) is a transpose matrix of the torque contribution matrix M.

$$Tr(M)*K = Is \qquad \text{Equation (13)}$$

Since it is possible to apply a larger current value to the coil 202 which more contributes to Tz, Twx, and Twy by defining the coil current vector Is as a vector expressed by Equation (13), it is possible to apply current efficiently.

Equation (12) can be transformed into the following Equation (14) by using Equation (13).

$$Tq = M*Tr(M)*K \qquad \text{Equation (14)}$$

In Equation (14), M*Tr(M) is a product of a matrix of three rows by N columns and a matrix of N rows and three columns and thus is a square matrix of three rows by three columns. Further, respective rows of the torque contribution matrix M are linearly independent of each other. Therefore, an inverse matrix can be obtained from M*Tr(M) in any cases. Thus, Equation (14) can be transformed into the following Equation (15).

$$K = \text{Inv}(M*Tr(M))*Tq \qquad \text{Equation (15)}$$

The coil current vector Is expressed by the following Equation (16) is finally obtained from Equations (13) and (15). In such a way, the coil current vector Is can be uniquely found.

$$Tr(M)*\text{Inv}(M*Tr(M))*Tq = Is \qquad \text{Equation (16)}$$

By calculating the coil current vector Is as described above, it is possible to determine current to be applied to each coil 202. Accordingly, since it is possible to independently apply the force component Tz in Z direction, the torque component Twx in the Wx direction, and the torque component Twy in the Wy direction to the mover 101, it is possible to stabilize the attitude of the mover 101 in the Z direction, the Wx direction, and the Wy direction.

Figure 14:
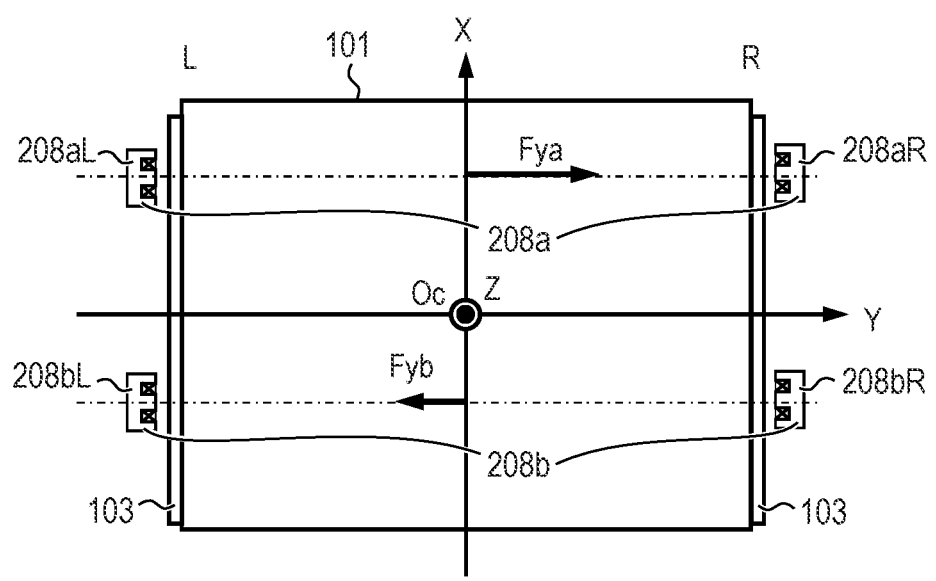
FIG. 14 is a schematic diagram of the mover in the transport system according to the first embodiment of the present invention when viewed from the top to the bottom in the Z direction.
Figure 15:
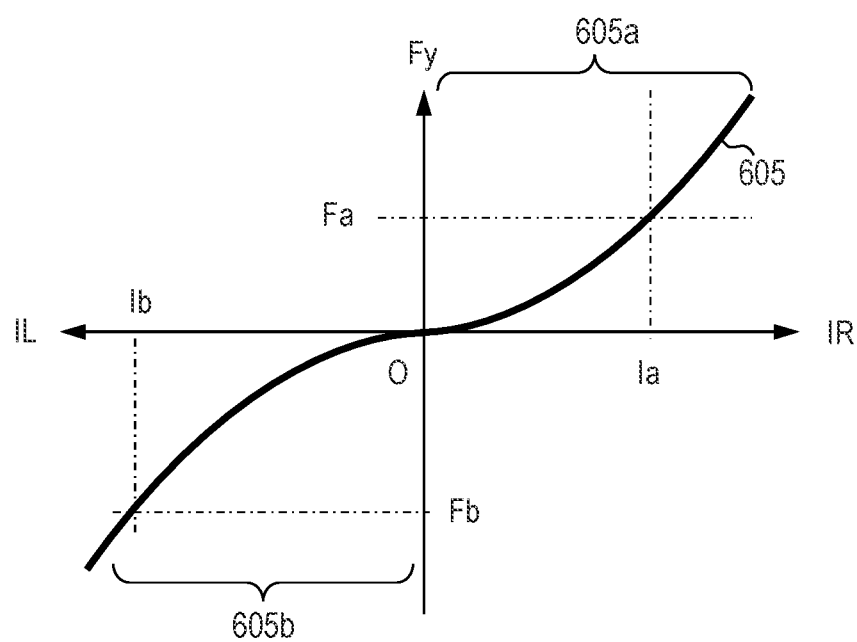
FIG. 15 is a graph schematically illustrating an attractive force profile in the Y direction in the transport system according to the first embodiment of the present invention.

Next, current applied to the coil 208 for applying the force component Ty in the Y direction and the torque component Twz in the Wz direction to the mover 101 will be described with reference to FIG. 14 and FIG. 15. The force component Ty and the torque component Twz work in the horizontal direction, respectively. FIG. 14 is a schematic diagram of the mover 101 when viewed from the top to the bottom in the Z direction. FIG. 15 is a graph schematically illustrating an attractive force profile 605 in the Y direction. In the graph illustrated in FIG. 15, the horizontal axis represents current applied to the coil 208, and the vertical axis represents force working on the mover 101.

Note that, for simplified illustration, FIG. 14 illustrates a case where, as the coils 208 installed on the stator 201, four coils 208aR, 208bR, 208aL, and 208bL face the mover 101. Further, the coil 208aL and the coil 208aR are paired to operate as one coil 208a. Further, the coil 208bL and the coil 208bR are paired to operate as one coil 208b. In such a way, the j-th paired coil 208jR and coil 208jL are paired to operate as one coil 208j.

The attractive force profile 605 illustrated in FIG. 15 indicates the relationship between the level of current IL and IR applied to the j-th pair of coils 208j and the magnitude of the force Fy working on the mover 101. No repulsive force works and only the attractive force works between the coil 208 and the yoke plate 103. Thus, when force is applied in Y+ direction to the mover 101, current is applied to the coil 208jR on the R side in a range 605a of the attractive force profile 605. Further, when force is applied in Y− direction to the mover 101, current is applied to the coil 208jL on the L side in a range 605b of the attractive force profile 605.

For example, when force Fa in the Y+ direction is applied, current Ia can be applied to the coil 208jR on the R side. Further, for example, when force Fb in the Y− direction is applied, current Ib can be applied to the coil 208jL on the L side.

The index j is defined as an index identifying a pair of coils 208. Further, X(j, P) is defined as the relative position in the X direction of the j-th pair of coils 208 when viewed from the origin Oc of the mover 101. Further, force in the Y direction applied by the j-th pair of coils 208 is denoted as Fyj. Then, the force component Ty in the Y direction and the torque component Twz in the Wz direction that correspond to the horizontal direction are expressed by the following Equations (17a) and (17b), respectively.

$$Ty = \Sigma Fyj \qquad \text{Equation (17a)}$$

$$Twz = \Sigma(-Fyj*X(j,P)) \qquad \text{Equation (17b)}$$

A Y direction force vector Fys having elements of force Fy1, Fy2, ..., FyN in the Y direction applied by the first to N-th coils 208 is defined here by the following Equation (17c).

$$Fys = Tr(Fy1, Fy2, \ldots, Fyj, \ldots, FyN) \qquad \text{Equation (17c)}$$

Furthermore, the torque vector Tq is defined by the following Equation (17d).

$$Tq = Tr(Ty, Twz) \qquad \text{Equation (17d)}$$

In the torque contribution matrix M, the first row is associated with the Y direction, and the second row is associated with the Wz direction. Then, respective elements M(1, j) and M(2, j) on the first row on the j-th column and the second row on the j-th column of the torque contribution matrix M are expressed by the following Equations (17e) and (17f), respectively.

$$M(1,j) = 1 \qquad \text{Equation (17e)}$$

$$M(2,j) = X(j,P) \qquad \text{Equation (17f)}$$

To calculate current to be applied to the coil 208, first, the Y direction force vector Fys satisfying the following Equation (17g) is determined.

$$Tq = M*Fys \qquad \text{Equation (17g)}$$

Since Tq is a vector of two rows by one column and M is a matrix of two rows by N columns, there are innumerable combinations of elements of the Y direction force vector Fys satisfying Equation (17g), however, the combination can be calculated uniquely in accordance with the following method.

Herein, the pseudo current vector K of two rows by one column is introduced. The pseudo current vector K is a vector satisfying the following Equation (17h), where Tr(M) is a transpose matrix of the torque contribution matrix M.

$$Tr(M)*K = Fys \qquad \text{Equation (17h)}$$

Equation (17g) can be transformed into the following Equation (17i) by using Equation (17h).

$$Tq = M*Tr(M)*K \qquad \text{Equation (17i)}$$

The item M*Tr(M) is a product of a matrix of two rows by N columns and a matrix of N rows by two columns and thus is a square matrix of two rows by two columns. Further, respective rows of the torque contribution matrix M are linearly independent of each other. Therefore, an inverse matrix can be obtained from M*Tr(M) in any cases. Thus, Equation (17i) can be transformed into the following Equation (17j).

$$K=\text{Inv}(M*Tr(M))*Tq \qquad \text{Equation (17j)}$$

The Y direction force vector Fys expressed by the following Equation (17k) is finally obtained from Equations (17h) and (17j). Accordingly, the Y direction force vector Fys can be uniquely calculated.

$$Tr(M)*\text{Inv}(M*Tr(M))*Tq=Fys \qquad \text{Equation (17k)}$$

After the Y direction force vector Fys is obtained, current to be applied to each coil 208 can be calculated by counting backward from the attractive force profile 605 calculated or measured in advance.

As described above, the current to be applied to each coil 208 can be determined. Accordingly, since the force component Ty in the Y direction and the torque component Twz in the Wz direction can be independently applied to the mover 101, the attitude of the mover 101 can be stabilized in the Y direction and the Wz direction. For example, current can be applied to the coil 208 so that the torque in the Wz direction is always 0.

Next, a control method of the coil 207 that applies thrust in the X direction, which is the transport direction, to the mover 101 will be described. The transport system 1 according to the present embodiment is a transport system with an induction type linear motor. The coil 207 generates electromagnetic force between the coil 207 and the conductive plate 107 of the mover 101 and applies thrust in the X direction, that is, the force component Tx in the X direction to the mover 101. The conductive plate 107 is not particularly limited, and a plate whose electric resistance is relatively small, for example, an aluminum plate is used.

When current is applied, each coil 207 generates a moving magnetic field in the X direction, which is the transport direction, to generate electromagnetic force between the coil 207 and the conductive plate 107. Thereby, each coil 207 causes the mover 101 to generate the force component Tx as the thrust in the X direction, which is the transport direction. When the speed of the mover 101 is insufficient, it is possible to increase the current to be applied to each coil 207 or change the timing of application of current to each coil 207 so that the speed at which the moving magnetic field moves becomes higher.

As described above, the integration controller 301 determines and controls the current instruction values of current to be applied to respective coils 202, 207, and 208. Accordingly, the integration controller 301 controls transportation of the mover 101 on the stator 201 in a contactless manner while controlling in six axes the attitude of the mover 101 being transported by the stator 201. Note that all or a part of the function of the integration controller 301 as the control apparatus may be replaced with the coil controller 302 as well as other control apparatuses.

Note that, although the case where the current of the coil 207 is controlled in the same manner as the current of the coil 202 and the coil 208 has been described in the present embodiment, the embodiment is not limited thereto. For example, in a simpler configuration, an induction motor controller may be connected to the integration controller 301, and the current of each coil 207 may be controlled by the induction motor controller so that a constant moving magnetic field is generated.

In the conventional transport apparatus as disclosed in Japanese Patent No. 6538710, it is difficult to change the overall attitude such as to tilt a mover, for example. Further, in the conventional transport apparatus, since the attitude of a mover is not controlled as a whole, conflicted instructions, one of which instructs a particular coil to apply upward force and the other instructs another coil to apply downward force, may be issued, for example, when the mover is deformed. Such conflicted instructions cause unstable transportation of the mover.

Further, in the conventional transport apparatus, since the attitude is not controlled taking the whole mover into consideration, the height or deformation of the mover results in disturbance as the mover moves, which causes an unstable attitude of the mover. Further, in particular, when coils used for floating of the mover are arranged in a discrete manner, the conventional transport apparatus has a problem of a change in the effective gain on the control resulting in unstable transportation of the mover as a result of a change in the number of coils involved in the control for a particular position of the mover. Further, in the conventional transport apparatus, since more current than is required in the control is applied, this causes a large energy loss, and the coil is more heated than is required, there is a problem such as a need for a cooling system.

In contrast, in the present embodiment, since it is possible to apply the force component and the torque component in the six axes (Tx, Ty, Tz, Twx, Twy, Twz) to the mover 101, it is possible to control the attitude of the mover 101 as a whole. Therefore, in the present embodiment, it is possible to stabilize the attitude of the mover 101, and it is possible to apply current to respective coils 202, 207, and 208 in a required range.

As described above, according to the present embodiment, it is possible to apply the force component and the torque component in the six axes (Tx, Ty, Tz, Twx, Twy, Twz) independently to the mover 101. Thus, according to the present embodiment, it is possible to transport the mover 101 in a contactless manner stably in the X direction while stabilizing the attitude of the mover 101 in the Y direction, the Z direction, the Wx direction, the Wy direction, and the Wz direction.

Second Embodiment

A second embodiment of the present invention will be described with reference to FIG. 16 to FIG. 17C. Note that the same components as those in the above first embodiment are labeled with the same references, and the description thereof will be omitted or simplified.

First, the configuration of the transport system 1 according to the present embodiment will be described with reference to FIG. 16. FIG. 16 is a schematic diagram illustrating the configuration of the transport system 1 including the mover 101 and the stator 201 according to the present embodiment. FIG. 16 is a diagram of the mover 101 and the stator 201 when viewed from the X direction.

The transport system 1 according to the present embodiment differs from the configuration of the first embodiment in the configuration for applying the force component Tx in the X direction, the force component Ty in the Y direction, and the torque component Twz in the Wz direction to the mover 101.

Figure 16:
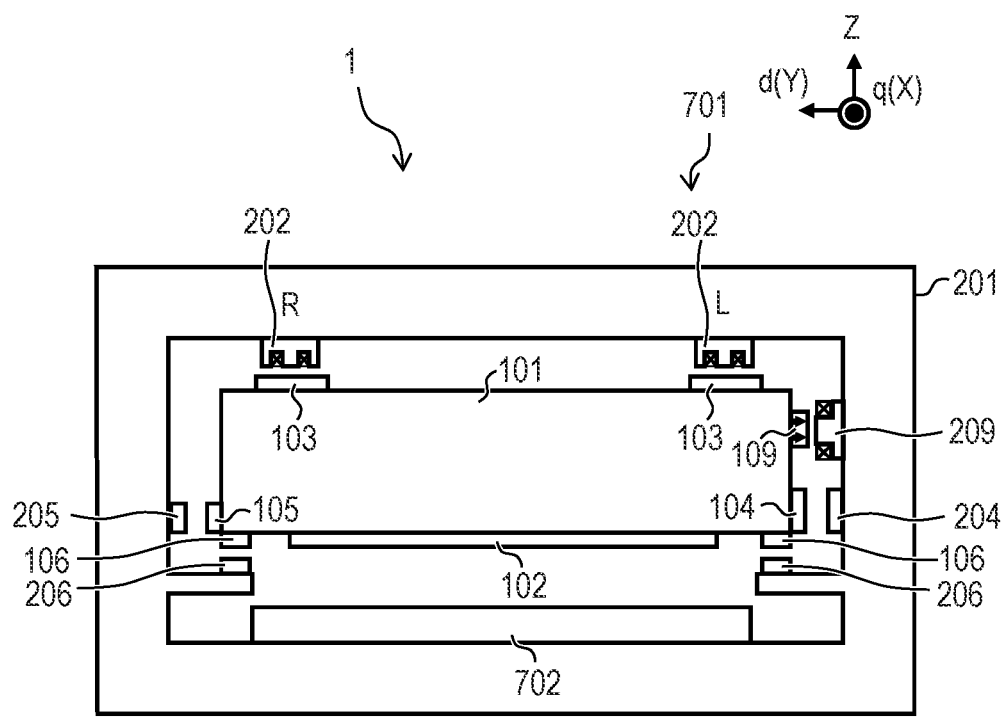
FIG. 16 is a schematic diagram illustrating a configuration of a transport system according to a second embodiment of the present invention.

As illustrated in FIG. 16, the mover 101 according to the present embodiment has a permanent magnet array 109 including a plurality of permanent magnets instead of the yoke plate 103 on the side face of the mover 101 and the conductive plate 107 on the top face of the mover 101 as used in the first embodiment. Further, the stator 201 according to the present embodiment has a coil 209 instead of the coils 207 and 208 as used in the first embodiment.

The permanent magnet array 109 is installed such that the plurality of permanent magnets are aligned along the X direction on one side face of the side faces on the R side and the L side of the mover 101. FIG. 16 illustrates a case as an example where the permanent magnet array 109 is installed on the side face of the L-side of the mover 101. The plurality of permanent magnets included in the permanent magnet array 109 are installed such that the polarities of the outer magnetic poles facing the side on the stator 201 side differ alternatingly and the S-pole polarity and the N-pole polarity are arranged outside alternatingly in the X direction.

A plurality of coils 209 are attached and installed on the stator 201 along the X direction so as to be able to face the permanent magnet array 109 installed along the Y direction on the side face of the mover 101. Specifically, the plurality of coils 209 are aligned and installed along the X direction so as to be able to face the permanent magnet array 109, which is installed on the side face of one of the R side and the L side of the mover 101, from the side along the Y direction.

Current is applied to each coil 209 by the control system 3 including the integration controller 301, the coil controller 302, and the like in the same manner as the case of the coils 202, 207, and 208 described in the first embodiment.

In the present embodiment, force is applied to the permanent magnet array 109 by the coils 209, and thereby the force component Tx in the X direction, the force component Ty in the Y direction, and the torque component Twz in the Wz direction are independently applied to the mover 101. The transport system 1 according to the present embodiment is a transport system with a synchronous linear motor that generates electromagnetic force between the coil 209 of the stator 201 and the permanent magnet array 109 of the mover 101 and applies thrust in the X direction to the mover 101. Further, the transport system 1 according to the present embodiment is a magnetic floating type transport system that causes the mover 101 to float and transports the mover 101 in a contactless manner.

A method of independently applying the force component Tx in the X direction, the force component Ty in the Y direction, and the torque component Twz in the Wz direction to the mover 101 will be described below with reference to FIG. 17A to FIG. 17C.

Figure 17A:
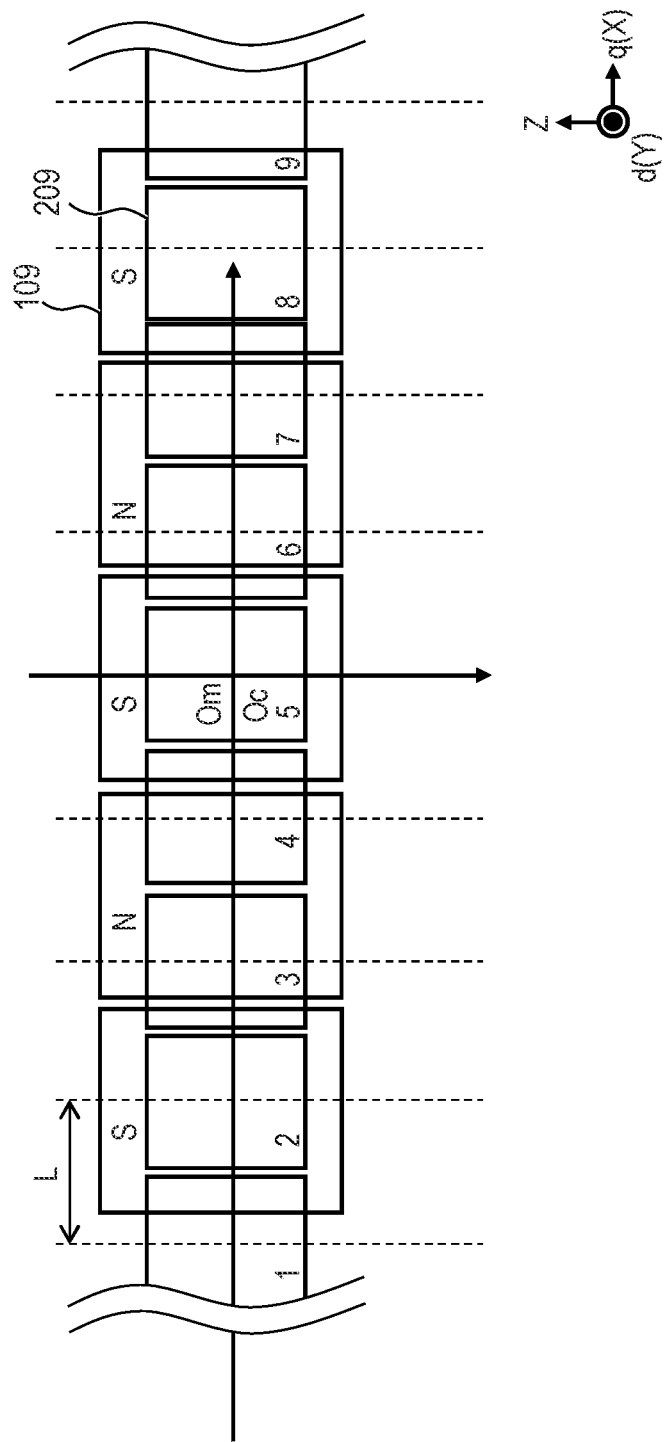
FIG. 17A is a schematic diagram illustrating a method of applying force components Tx and Ty and a torque component Twz to a mover independently by using coils and a permanent magnet array in the transport system according to the second embodiment of the present invention.
Figure 17B:
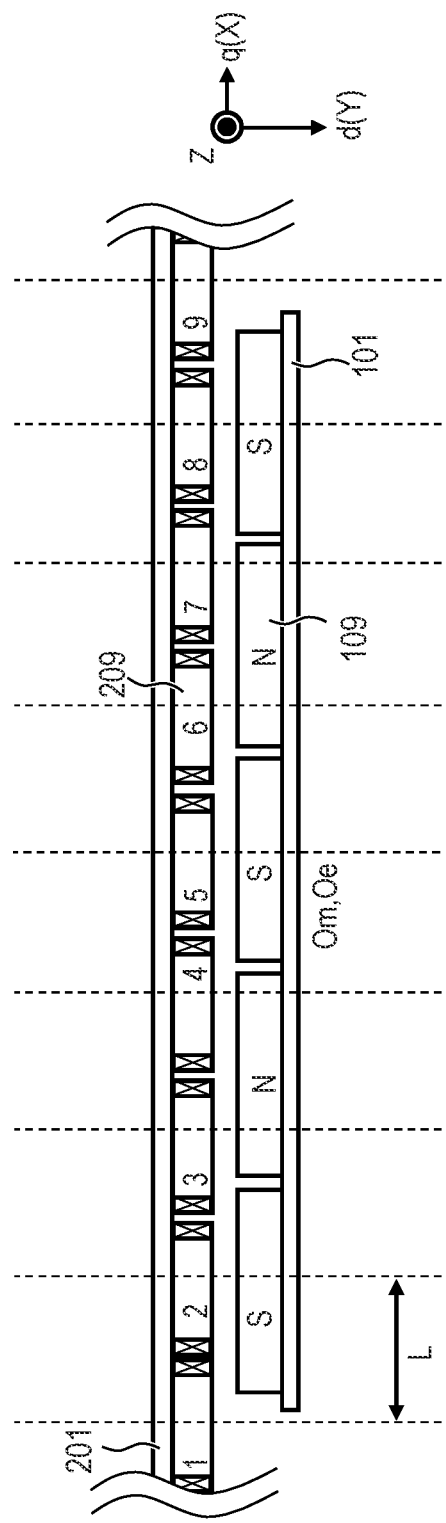
FIG. 17B is a schematic diagram illustrating the method of applying force components Tx and Ty and a torque component Twz to the mover independently by using the coils and the permanent magnet array in the transport system according to the second embodiment of the present invention.
Figure 17C:
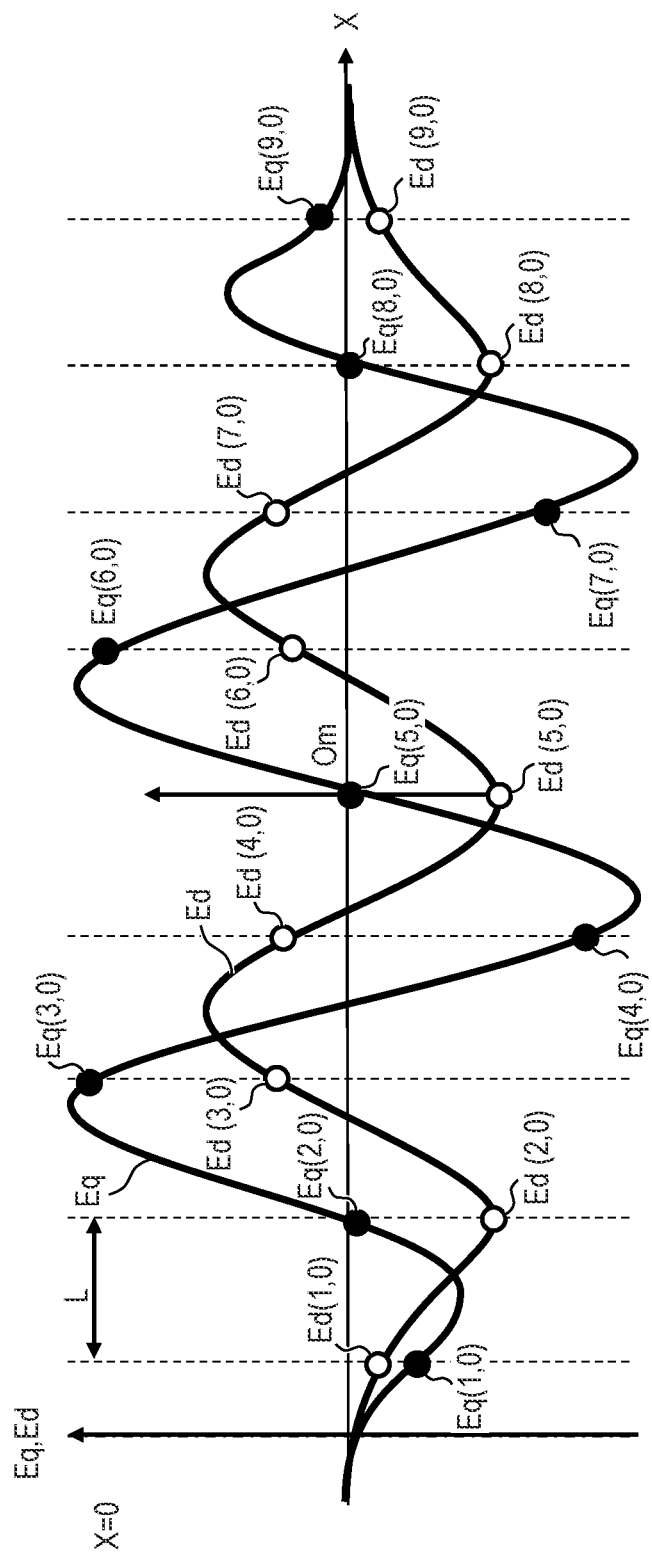
FIG. 17C is a schematic diagram illustrating the method of applying force components Tx and Ty and a torque component Twz to the mover independently by using the coils and the permanent magnet array in the transport system according to the second embodiment of the present invention.

FIG. 17A to FIG. 17C are schematic diagrams illustrating the method of independently applying the force components Tx and Ty and the torque component Twz in the Wz direction to the mover 101 by using the coils 209 and the permanent magnet array 109. The coil current calculation function 404 is used to determine current instruction values to be applied to the coils 209 used for independently applying the force components Tx and Ty and the torque component Twz to the permanent magnet array 109 of the mover 101 in accordance with the following method. Note that, for simplified illustration, in FIG. 17A to FIG. 17C, the permanent magnet array 109 includes five permanent magnets. Note that the dashed lines arranged laterally in FIG. 17A to FIG. 17C indicate corresponding positions in the X direction.

Further, in the following description, the q-axis and the d-axis are used as coordinate axes as appropriate. The q-axis and the d-axis are expression generally used in the vector control theory of a synchronous motor. The q-axis is an axis along a direction in which the permanent magnet array 109 extends. The d-axis is an axis orthogonal to the q-axis and along a direction faced by the surface of the permanent magnet included in the permanent magnet array 109. In the present embodiment, the q-axis corresponds to the X-axis, and the d-axis corresponds to the Y-axis.

Herein, the magnitudes of force working in the q-axis direction (X direction) and the d-axis direction (Y direction) of the j-th coil 209 per unit current are denoted as Eq(j, P) and Ed(j, P), respectively, where P is defined as the position and the attitude of the mover 101, and j is defined as a number of one of the coils 209 aligned in a line. Further, the level of the current in the j-th coil 209 is denoted as I(j).

FIG. 17A is a diagram in which the q-axis (X-axis) is taken horizontally, the Z-axis is taken vertically, and nine coils 209 facing the permanent magnet array 109 are picked out for illustration and is a diagram when viewed from Y+ direction. FIG. 17B is a diagram when FIG. 17A is viewed from the Z direction. The coils 209 are provided with the number j from 1 to 9 in the order of alignment in the X direction to identify each coil 209 by denotation such as coil 209(1), for example, in the following description.

As illustrated in FIG. 17A and FIG. 17B, the coils 209 are arranged at a pitch of distance L. On the other hand, the permanent magnets included in the permanent magnet array 109 of the mover 101 are arranged at a pitch of distance 3/2*L.

FIG. 17C is a graph schematically illustrating the magnitudes of force Eq in the q-axis direction (X direction) and force Ed in the d-axis direction (Y direction) generated when unit current is applied to each of the coils 209 illustrated in FIG. 17A and FIG. 17B.

For simplified illustration, in FIG. 17A to FIG. 17C, the origin Om of the position in the X direction of the coils 209 is defined as the middle point in the coil 209(5), and the center in the X direction of the permanent magnet array 109 is defined as the origin Oc of the mover 101. Thus, FIG. 17C illustrates a case where Os and Om are matched, that is, a case of X=0.

At this time, for example, the force per unit current working on the coil 209(4) is the magnitude of Eq(4, 0) in the q-axis direction (X direction) and Ed(4, 0) in the d-axis direction (Y direction).

The force component Tx in the X direction, the force component Ty in the Y direction, and the torque component Twz in the Wz direction working on the permanent magnet array 109 of the mover 101 are expressed by the following Equations (20a), (20b), and (20c), respectively.

$$Tx = \Sigma Eq(j,P)*Ij \qquad \text{Equation (20a)}$$

$$Ty = \Sigma Ed(j,P)*Ij \qquad \text{Equation (20b)}$$

$$Twz = \Sigma\{-Ed(j,P)*X(j,P)*Ij\} \qquad \text{Equation (20c)}$$

After this calculation, in the same manner as in the first embodiment, by defining and calculating the torque contribution matrix M, it is possible to obtain the coil current vector Is indicating current to be applied to each coil 209 for applying desired Tx, Ty, and Twz to the mover 101.

In the torque contribution matrix M defined in the present embodiment, the first row is associated with the X direction, the second row is associated with the Y direction, and the third row is associated with Wz direction. Then, respective elements M(1, j) to M(3, j) on the first row on the j-th column, the second row on the j-th column, and the third row on the j-th column of the torque contribution matrix M defined in the present embodiment are expressed by the following Equations (20d) to (20f), respectively. The torque contribution matrix M is a matrix of three rows by N columns. Note that respective rows of the torque contribution matrix M are linearly independent of each other.

$$M(1,j)=Eq(j,P) \quad \text{Equation (20d)}$$

$$M(2,j)=Ed(j,P) \quad \text{Equation (20e)}$$

$$M(3,j)=-Ed(j,P)*X(j,P) \quad \text{Equation (20f)}$$

Further, in the present embodiment, a column vector having elements of current amounts I1 to IN to be applied to the first to N-th coils 209 is introduced as the coil current vector Is. The coil current vector Is is a column vector of N rows by one column expressed by the following Equation (20g).

$$Is=Tr(I1,I2,\ldots,Ij,\ldots,IN) \quad \text{Equation (20g)}$$

Further, in the present embodiment, the torque vector Tq is defined by the following Equation (20h).

$$Tq=Tr(Tx,Ty,Twz) \quad \text{Equation (20h)}$$

Then, the following Equation (20i) is obtained.

$$Tq=M*Is \quad \text{Equation (20i)}$$

Also in the present embodiment, calculation using the pseudo current vector K is performed in the same manner as in the first embodiment. In the present embodiment, the pseudo current vector K of three rows by one column is introduced. The pseudo current vector K introduced in the present embodiment satisfies the following Equation (20j).

$$Tr(M)*K=Is \quad \text{Equation (20j)}$$

Equation (20i) can be transformed into the following Equation (20k) by using Equation (20j).

$$Tq=M*Tr(M)*K \quad \text{Equation (20k)}$$

In Equation (20k), M*Tr(M) is a product of a matrix of three rows by N columns and a matrix of N rows by three columns and thus is a square matrix of three rows by three columns. Further, respective rows of the torque contribution matrix M are linearly independent of each other. Therefore, an inverse matrix can be obtained from M*Tr(M) in any cases. Thus, Equation (20k) can be transformed into the following Equation (20l).

$$K=Inv(M*Tr(M))*Tq \quad \text{Equation (20l)}$$

The coil current vector Is expressed by the following Equation (20m) is finally obtained from Equations (20j) and (20l). In such a way, the coil current vector Is can be uniquely found.

$$Tr(M)*Inv(M*Tr(M))*Tq=Is \quad \text{Equation (20m)}$$

By calculating the coil current vector Is as described above, it is possible to determine current to be applied to each coil 209. Accordingly, since it is possible to independently apply the force component Tx in the X direction, the force component Ty in the Y direction, and the torque component Twz in the Wz direction to the mover 101. It is therefore possible to transport the mover 101 in the X direction while stabilizing the attitude of the mover 101 in the Y direction and the Wz direction.

Note that, also in the present embodiment, it is possible to independently apply the force component Tz in the Z direction, the torque component Twx in the Wx direction, and the torque component Twy in the Wy direction to the mover 101 by applying current to each coil 202 in the same manner as in the first embodiment. Therefore, also in the present embodiment, by using the coil 202 and the coil 209 in combination, it is possible to apply the six-axis components of the force T (Tx, Ty, Tz, Twx, Twy, Twz) to the mover 101.

Third Embodiment

A third embodiment of the present invention will be described with reference to FIG. 18 to FIG. 19B. Note that the same components as those in the above first and second embodiments are labeled with the same references, and the description thereof will be omitted or simplified.

First, the configuration of the transport system 1 according to the present embodiment will be described with reference to FIG. 18. FIG. 18 is a schematic diagram illustrating the configuration of the transport system 1 including the mover 101 and the stator 201 according to the present embodiment. FIG. 18 is a diagram of the mover 101 and the stator 201 when viewed from the X direction.

The transport system 1 according to the present embodiment differs from the configuration of the first embodiment in the configuration for applying the force component Tx in the X direction, the force component Tz in the Z direction, the torque component Twx in the Wx direction, the torque component Twy in the Wy direction, and the torque component Twz in the Wz direction to the mover 101.

Figure 18:
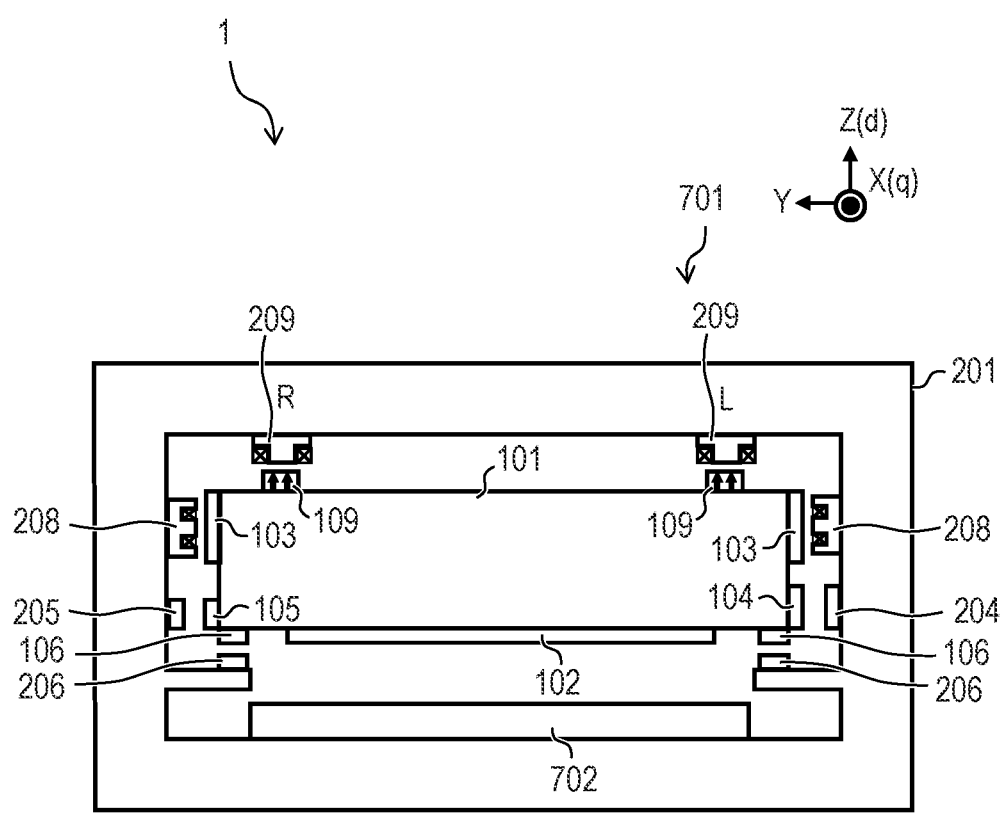
FIG. 18 is a schematic diagram illustrating a configuration of a transport system according to a third embodiment of the present invention.

As illustrated in FIG. 18, the mover 101 according to the present embodiment has permanent magnet arrays 109 including a plurality of permanent magnets instead of the yoke plate 103 on the top face of the mover 101 and the conductive plate 107 on the top face of the mover 101 as used in the first embodiment. Further, the stator 201 according to the present embodiment has a coil 209 instead of the coils 202 and 207 as used in the first embodiment.

The permanent magnet arrays 109 are installed in two lines such that the plurality of permanent magnets are arranged in the X direction at respective ends on the R side and the L side on the top face of the mover 101. The plurality of permanent magnets included in the permanent magnet arrays 109 are installed such that the polarities of the outer magnetic poles facing the top on the stator 201 side differ alternatingly and the S-pole polarity and the N-pole polarity are arranged outside alternatingly in the X direction.

A plurality of coils 209 are attached and installed on the stator 201 along the X direction so as to be able to face, along the Z direction, the two lines of permanent magnet arrays 109 installed on the top face of the mover 101. Specifically, the plurality of coils 209 are arranged and installed in two lines parallel to the X direction so as to be able to face the two lines of permanent magnet arrays 109, which are installed on the top face of the mover 101, from the top along the Z direction.

Current is applied to each coil 209 by the control system 3 including the integration controller 301, the coil controller 302, and the like in the same manner as the case of the coils 202, 207, and 208 described in the first embodiment.

The coils 209 function as coils used for floating and transportation of the mover 101. As such a coil 209, a coil with a core can be used. With the use of a coil with a core as the coil 209, since large attractive force works between the coil 209 and the permanent magnet array 109 without applying current to the coil 209, the current amount applied to the coils 209 can be significantly reduced.

Note that the relationship between the coil 209 and the permanent magnet array 109 in the present embodiment is the same as the relationship between the coil 209 and the permanent magnet array 109 described in the second embodiment except for respective installation places. Note that, while the q-axis corresponds to the X-axis and the d-axis corresponds to the Y-axis in the second embodiment illustrated in FIG. 16 to FIG. 17B, the q-axis corresponds to the X-axis and the d-axis corresponds to the Z-axis in the present embodiment illustrated in FIG. 18 and FIG. 19A.

In the present embodiment, force is applied to the permanent magnet array 109 by the coils 209, and thereby the force component Tx in the X direction, the force component Tz in the Z direction, the torque component Twx in the Wx direction, the torque component Twy in the Wy direction, and the torque component Twz in the Wz direction are independently applied to the mover 101. The transport system 1 according to the present embodiment is a transport system with a synchronous linear motor that generates electromagnetic force between the coil 209 of the stator 201 and the permanent magnet array 109 of the mover 101 and applies thrust in the X direction to the mover 101 in the same manner as in the second embodiment.

Figure 19A:
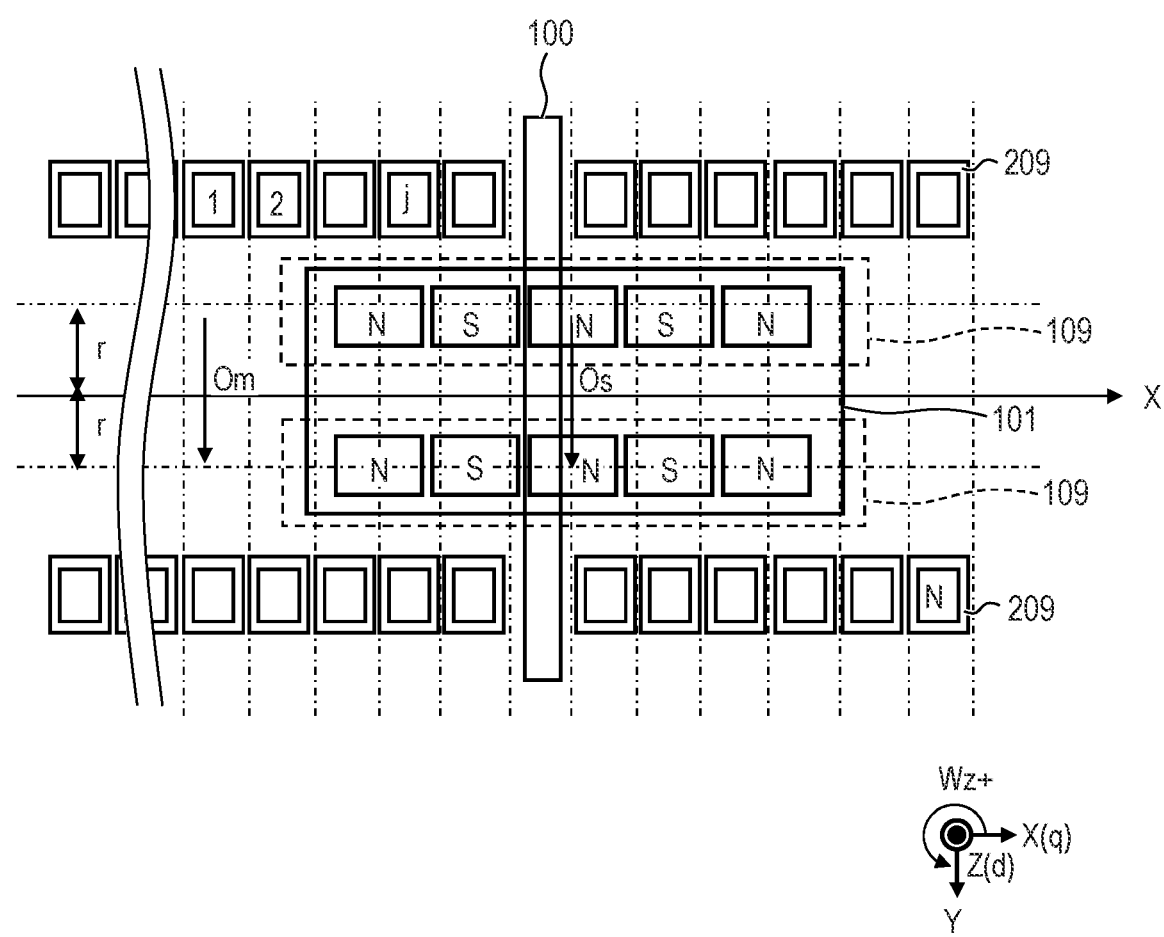
FIG. 19A is a schematic diagram illustrating a method of applying force components Tx and Tz and torque components Twx, Twy, and Twz to a mover 101 independently by using coils and a permanent magnet array in the transport system according to the third embodiment of the present invention.

A method of independently applying the force component Tx in the X direction, the force component Tz in the Z direction, the torque component Twx in the Wx direction, the torque component Twy in the Wy direction, and the torque component Twz in the Wz direction to the mover 101 will be described below with reference to FIG. 19A and FIG. 19B. FIG. 19A and FIG. 19B are schematic diagrams illustrating the method of independently applying the force components Tx and Tz and the torque components Twx, Twy, and Twz to the mover 101 by using the coils 209 and the permanent magnet arrays 109. Note that the dot-dashed lines arranged laterally in FIG. 19A and FIG. 19B indicate corresponding positions in the X direction. The coil current calculation function 404 is used to determine current instruction values to be applied to the coils 209 for independently applying the force components Tx and Tz and the torque components Twx, Twy, and Twz to the permanent magnet array 109 of the mover 101 in accordance with the following method.

Herein, the magnitudes of force working in the q-axis direction (X direction) and the d-axis direction (Z direction) of the j-th coil 209 per unit current are denoted as Eq(j, P) and Ed(j, P), respectively, where P is defined as the position and the attitude of the mover 101, and j is defined as a number of one of the coils 209 aligned in a line. Further, the level of the current in the j-th coil 209 is denoted as I(j).

FIG. 19A is a diagram of the stator 201 and the mover 101 when viewed from the top to the bottom in the Z direction. Note that FIG. 19A illustrates the coils 209 shifted outward with respect to the permanent magnet arrays 109 for better visibility. In the present embodiment, the q-axis corresponds to the X-axis, and the d-axis corresponds to the Z-axis, as described above.

Figure 19B:
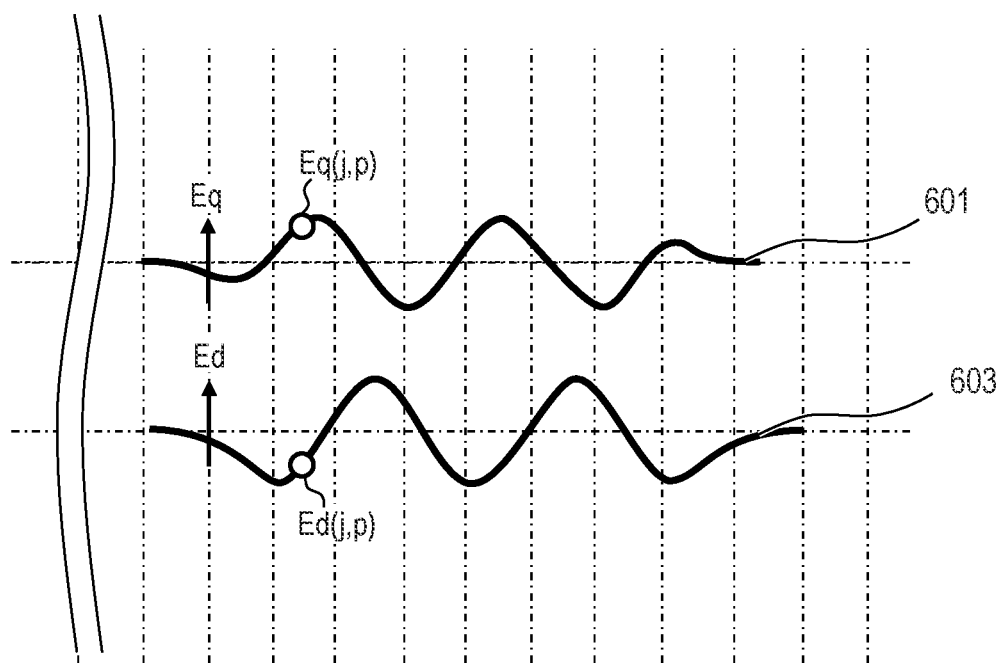
FIG. 19B is a schematic diagram illustrating a method of applying force components Tx and Tz and torque components Twx, Twy, and Twz to a mover 101 independently by using the coils and the permanent magnet array in the transport system according to the third embodiment of the present invention.

FIG. 19B illustrates a q-axis thrust constant profile 601 indicating Eq(j, P) and a d-axis thrust constant profile 603 indicating Ed(j, P). Eq(j, P) can be found from the q-axis thrust constant profile 601, and Ed(j, P) can be found from the d-axis thrust constant profile 603.

It is possible to apply force and rotation direction torque in five axes (Tx, Tz, Twx, Twy, Twz) by using two lines of coils 209 in accordance with the following method.

In the present embodiment, Equations (20a), (20b), and (20c) in the second embodiment are expanded taking the presence of the two lines of coils 209 into consideration.

When j is taken as the index of the coils 209 on both sides of the L side and the R side, the force component Tx in the X direction and the force component Tz in the Z direction working on the permanent magnet array 109 of the mover 101 are expressed by the following Equations (21a) an (21b), respectively. Further, the torque component Twx in the Wx direction, the torque component Twy in the Wy direction, and the torque component Twz in the Wz direction working on the permanent magnet array 109 of the mover 101 are expressed by the following Equations (21c), (21d), and (21e), respectively.

$$Tx = \Sigma Eq(j,P)*Ij \qquad \text{Equation (21a)}$$

$$Tz = \Sigma Ed(j,P)*Ij \qquad \text{Equation (21b)}$$

$$Twx = \Sigma\{-Ed(j,P)*Y(j,P)*Ij\} \qquad \text{Equation (21c)}$$

$$Twy = \Sigma Ed(j,P)*X(j,P)*Ij \qquad \text{Equation (21d)}$$

$$Twz = \Sigma Eq(j,P)*Y(j,P)*Ij \qquad \text{Equation (21e)}$$

After this calculation, in the same manner as in the first embodiment, by defining and calculating the torque contribution matrix M, it is possible to obtain the coil current vector Is indicating current to be applied to each coil 209 for applying desired Tx, Tz, Twx, Twy, and Twz to the mover 101.

In the torque contribution matrix M defined in the present embodiment, the first row is associated with the X direction, the second row is associated with the Z direction, the third row is associated with Wx direction, the fourth row is associated with Wy direction, and the fifth row is associated with Wz direction.

Then, respective elements M(1, j) to M(5, j) on the first row on the j-th column, the second row on the j-th column, the third row on the j-th column, the fourth row on the j-th column, and the fifth row on the j-th column of the torque contribution matrix M defined in the present embodiment are expressed by the following Equations (21f) to (21j), respectively.

The torque contribution matrix M is a matrix of five rows by N columns. Note that respective rows of the torque contribution matrix M are linearly independent of each other.

$$M(1,j) = Eq(j,P) \qquad \text{Equation (21f)}$$

$$M(2,j) = Ed(j,P) \qquad \text{Equation (21g)}$$

$$M(3,j) = -Ed(j,P)*Y(j,P) \qquad \text{Equation (21h)}$$

$$M(4,j) = Ed(j,P)*X(j,P) \qquad \text{Equation (21i)}$$

$$M(5,j) = Eq(j,P)*Y(j,P) \qquad \text{Equation (21j)}$$

Further, in the present embodiment, a column vector having elements of current amounts I1 to IN to be applied to the first to N-th coils 209 is introduced as the coil current vector Is. The coil current vector Is is a column vector of N rows by one column expressed by the following Equation (21k).

$$Is = Tr(I1, I2, \ldots, Ij, \ldots, IN) \qquad \text{Equation (21k)}$$

Further, in the present embodiment, the torque vector Tq is defined by the following Equation (21l).

$$Tq = Tr(Tx, Tz, Twx, Twy, Twz) \qquad \text{Equation (21l)}$$

Then, the following Equation (21m) is obtained.

$$Tq = M*Is \qquad \text{Equation (21m)}$$

Also in the present embodiment, calculation using the pseudo current vector K is performed in the same manner as in the first embodiment. In the present embodiment, the pseudo current vector K of five rows by one column is introduced. The pseudo current vector K introduced in the present embodiment satisfies the following Equation (21n).

$$Tr(M)*K=Is \qquad \text{Equation (21n)}$$

Equation (21m) can be transformed into the following Equation (21o) by using Equation (21n).

$$Tq=M*Tr(M)*K \qquad \text{Equation (21o)}$$

In Equation (21o), M*Tr(M) is a product of a matrix of five rows by N columns and a matrix of N rows by five columns and thus is a square matrix of five rows by five columns. Further, respective rows of the torque contribution matrix M are linearly independent of each other. Therefore, an inverse matrix can be obtained from M*Tr(M) in any cases. Thus, Equation (21o) can be transformed into the following Equation (21p).

$$K=\text{Inv}(M*Tr(M))*Tq \qquad \text{Equation (21p)}$$

The coil current vector Is expressed by the following Equation (21q) is finally obtained from Equations (21n) to (21p). In such a way, the coil current vector Is can be uniquely found.

$$Tr(M)*\text{Inv}(M*Tr(M))*Tq=Is \qquad \text{Equation (21q)}$$

By calculating the coil current vector Is as described above, it is possible to determine current to be applied to each coil 209. Accordingly, it is possible to independently apply the force component Tx in the X direction, the force component Tz in the Z direction, the torque component Twx in the Wx direction, the torque component Twy in the Wy direction, and the torque component Twz in the Wz direction to the mover 101. That is, the force components and the torque components for the five axes can be independently applied to the mover 101. It is therefore possible to transport the mover 101 in the X direction while stabilizing the attitude of the mover 101 in the Z direction, the Wx direction, the Wy direction, and the Wz direction.

Note that, also in the present embodiment, it is possible to independently apply the force component Ty in the Y direction and the torque component Twz in the Wz direction to the mover 101 by applying current to each coil 208 in the same manner as in the first embodiment. Therefore, also in the present embodiment, with the use of the coil 208 and the coil 209 in combination, it is possible to apply the six-axis components of the force T (Tx, Ty, Tz, Twx, Twy, Twz) to the mover 101.

Fourth Embodiment

A fourth embodiment of the present invention will be described with reference to FIG. 20 to FIG. 22. Note that the same components as those in the above first to third embodiments are labeled with the same references, and the description thereof will be omitted or simplified.

First, the configuration of the transport system 1 according to the present embodiment will be described with reference to FIG. 20 and FIG. 21A. FIG. 20 and FIG. 21A are schematic diagrams illustrating the configuration of the transport system 1 including the mover 101 and the stator 201 according to the present embodiment. FIG. 20 is a diagram of the mover 101 and the stator 201 when viewed from the X direction. FIG. 21A is a diagram when FIG. 20 is viewed from the top to the bottom in the Z direction. Note that the right part of FIG. 20 represents a cross section (A) taken along a line (A)-(A) in FIG. 21A. Further, the left part of FIG. 20 represents a cross section (B) taken along a line (B)-(B) in FIG. 21A. Further, FIG. 21A illustrates the coils 209 shifted outward with respect to the permanent magnet arrays 110 (110a, 110b) for better visibility.

The transport system 1 according to the present embodiment differs from the configuration according to the third embodiment in the configuration for applying force in the Y direction to the mover 101.

Figure 20:
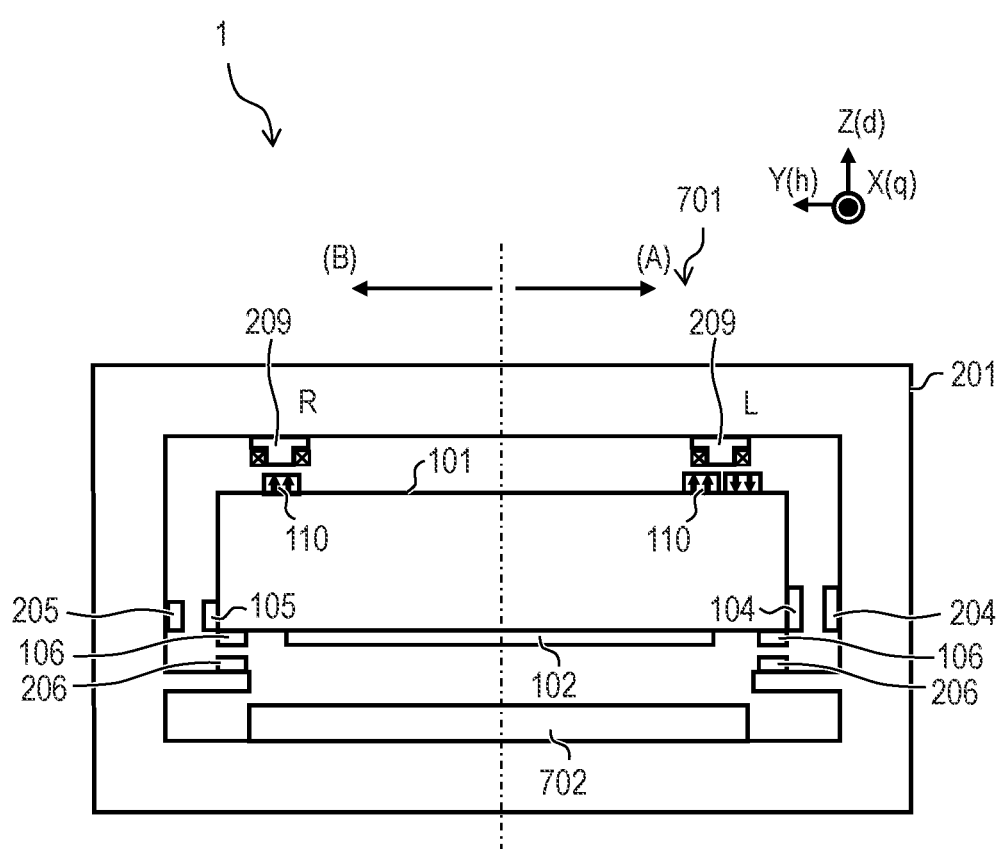
FIG. 20 is a schematic diagram illustrating a configuration of a transport system according to a fourth embodiment of the present invention.
Figure 21A:
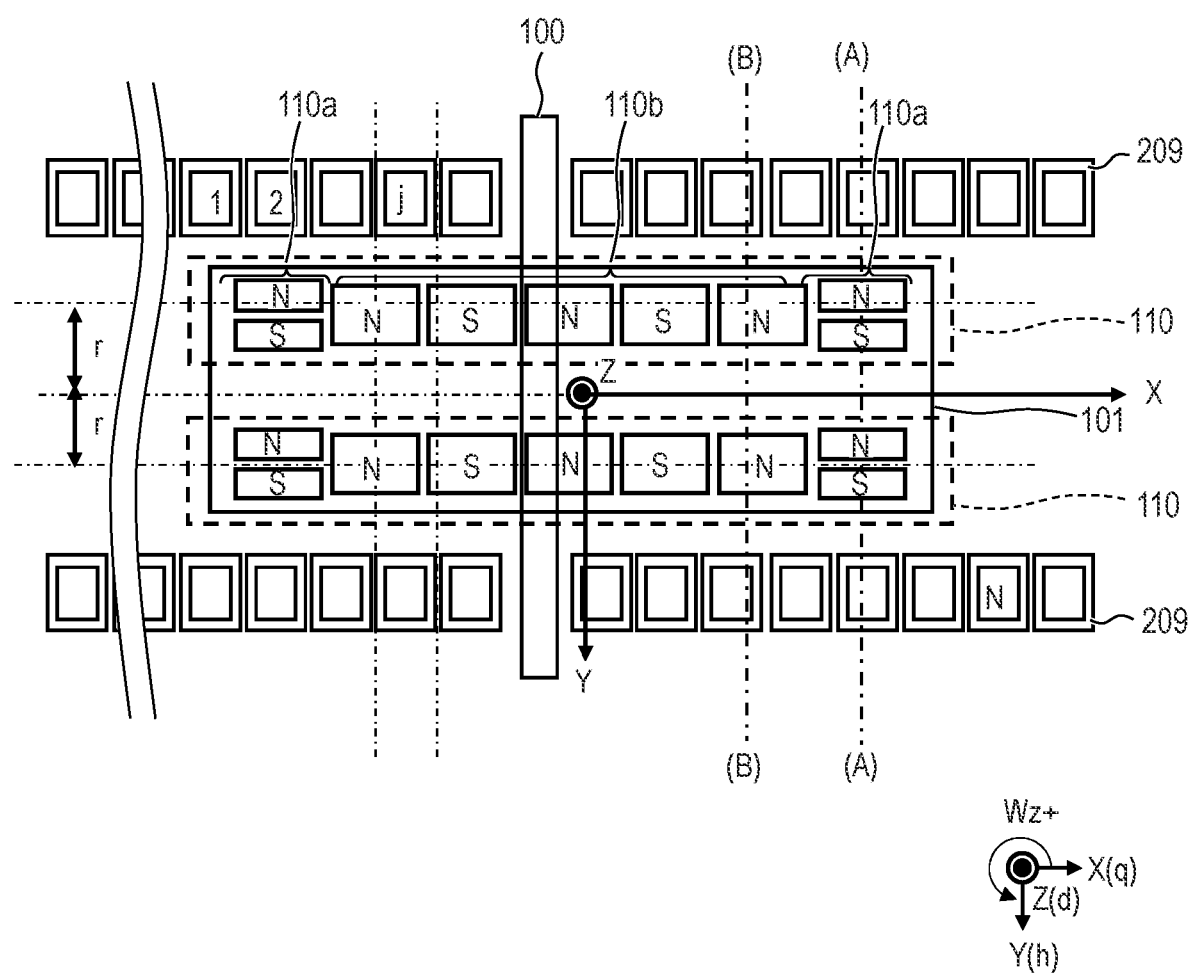
FIG. 21A is a schematic diagram illustrating a configuration of the transport system according to the fourth embodiment of the present invention.

As illustrated in FIG. 20 and FIG. 21A, the mover 101 according to the present embodiment has permanent magnet arrays 110 including a plurality of permanent magnets instead of the permanent magnet arrays 109 as used in the third embodiment. Note that, unlike the third embodiment, no yoke plate 103 is installed on both sides of the L side and the R side in the mover 101 in the present embodiment. Further, the stator 201 according to the present embodiment has the coils 209 in the same manner as in the third embodiment. Note that, unlike the third embodiment, no coil 208 is installed in the stator 201 according to the present embodiment.

The permanent magnet arrays 110 are installed in two lines such that the plurality of permanent magnets are arranged in the X direction at respective ends on the R side and the L side on the top face of the mover 101. However, two permanent magnets are installed so as to be arranged in the Y direction at a part of each array of the two lines of permanent magnet arrays 110, that is, at each of both ends of the permanent magnet arrays 110. Each array of such two lines of permanent magnet arrays 110 has a permanent magnet array 110b magnetized to the N-pole and the S-pole alternatingly in the X direction in which the mover 101 is transported and a permanent magnet array 110a magnetized to the N-pole and the S-pole alternatingly in the Y direction orthogonal to the X direction. In the permanent magnet array 110b, the plurality of permanent magnets are installed such that the polarities of the outer magnetic poles facing the top on the stator 201 side differ alternatingly and the S-pole polarity and the N-pole polarity are arranged outside alternatingly in the X direction. In the permanent magnet array 110a, two permanent magnets are installed such that the polarities of the outer magnetic poles facing the top on the stator 201 side differ alternatingly and the S-pole polarity and the N-pole polarity are arranged outside alternatingly in the Y direction. Note that the permanent magnet array 110a may include two or more multiple permanent magnets. Herein, the Y-axis is defined as h-axis, and the Y direction is defined as the h-axis direction.

A plurality of coils 209 are attached and installed on the stator 201 along the X direction so as to be able to face, along the Z direction, the two lines of permanent magnet arrays 110 installed on the top face of the mover 101. Specifically, the plurality of coils 209 are aligned and installed in two lines parallel to the X direction so as to be able to face the two lines of permanent magnet arrays 110, which are installed on the top face of the mover 101, from the top along the Z direction.

Current is applied to each coil 209 by the control system 3 including the integration controller 301, the coil controller 302, and the like in the same manner as the case of the coils 202, 207, and 208 described in the first embodiment.

Figure 21B:
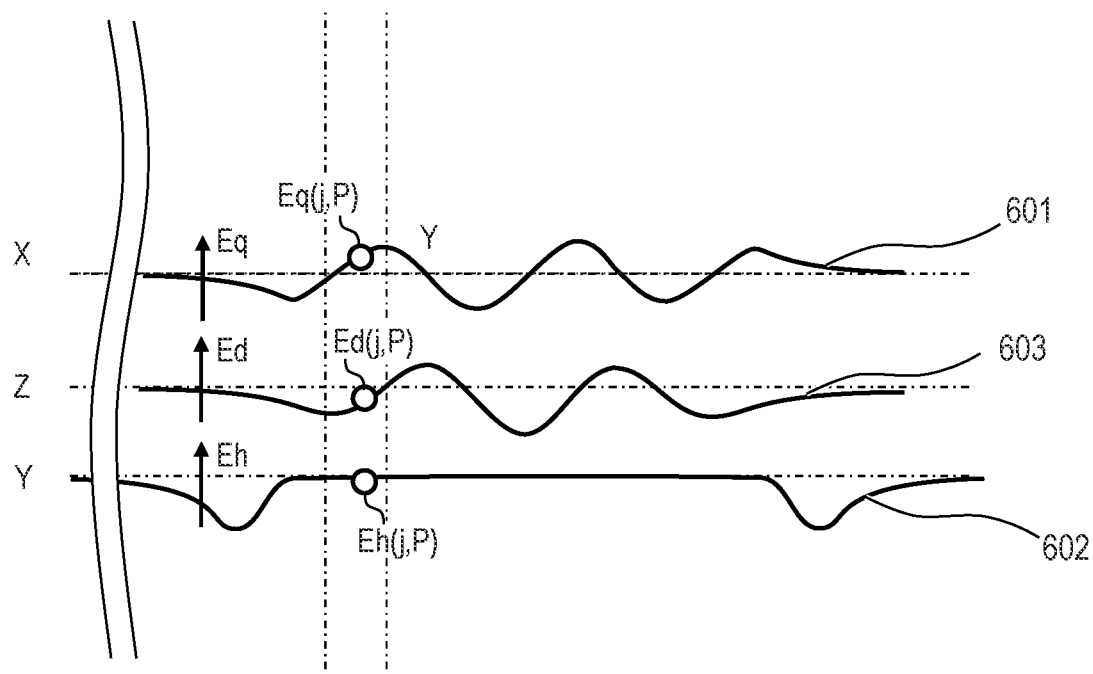
FIG. 21B is a schematic diagram illustrating a q-axis thrust constant profile, an h-axis constant profile, and a d-axis thrust constant profile in the transport system according to the fourth embodiment of the present invention.

FIG. 21B schematically illustrates respective magnitudes of force Eq(j, P), Eh(j, P), and Ed(j, P) of the q-axis direction (X direction), the h-axis direction (Y direction), and the d-axis (Z-axis) per unit current generated in each coil 209. Note that the dot-dashed lines arranged laterally in FIG. 21A and FIG. 21B indicate corresponding positions in the X direction. The q-axis thrust constant profile 601 represents Eq(j, P), the h-axis constant profile 602 represents Eh(j, P), and the d-axis thrust constant profile 603 represents Ed(j, P).

In the present embodiment, the principle of generating force in the h-axis direction (Y direction) will be described with reference to FIG. 22. FIG. 22 is a schematic diagram illustrating the principle of generating force in the h-axis direction (Y direction). FIG. 22 illustrates a portion including one of the permanent magnet arrays 110a of the R side and L side in a cross section taken along a line (A)-(A) of the permanent magnet array 110 in FIG. 21A.

Figure 22:
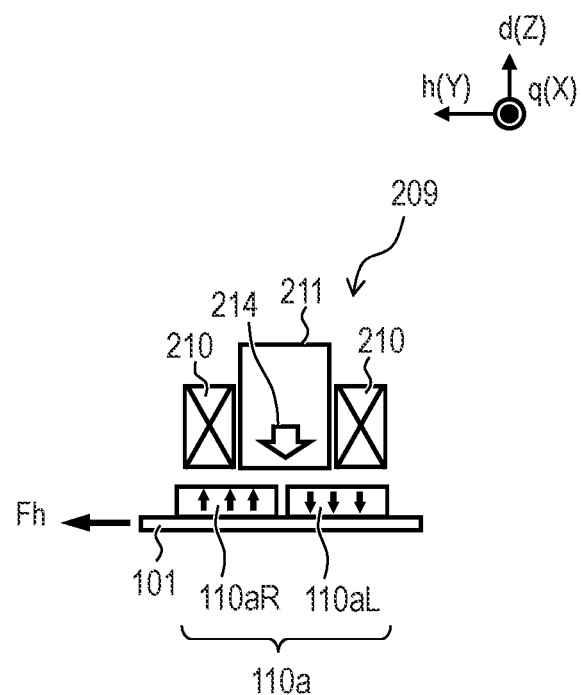
FIG. 22 is a schematic diagram illustrating a principle of generating force in the h-axis direction (Y direction) in the transport system according to the fourth embodiment of the present invention.

As illustrated in FIG. 22, the coil 209 has the core 211 and the winding 210. The coil 209 is installed so as to face the permanent magnet array 110a from the top along the Z direction. The arrow 214 in the core 211 indicates a magnetization direction of the coil 209, and the head of the arrow 214 indicates the N-pole. In the permanent magnet array 110a, the permanent magnets 110aR and 110aL are aligned in the h-axis direction (Y direction). The arrows in the permanent magnets 110aR and 110aL indicate the magnetization direction of the permanent magnets, and the head of each arrow indicates the N-pole.

As illustrated in FIG. 22, when current is applied so that the N-pole appears on the surface on the permanent magnet array 110a side of the core 211 of the coil 209, repulsive force is generated between the coil 209 and the permanent magnet 110aR, and attractive force is generated between the coil 209 and the permanent magnet 110aL. Thus, force works in the + direction (Y+ direction) of the h-axis direction to the mover 101.

In more quantitative expression, interlinkage flux Φ of the winding 210 passing through the core 211 has a relationship expressed by the following Expression (22a) with respect to the position h in the h-axis direction of the mover 101.

$$\Phi = \Phi(h) \qquad \text{Equation (22a)}$$

In such a case, the magnitude of force Fh working in the h-axis direction (Y direction) is expressed by the following Equation (22b) in general, where i denotes the level of current flowing in the coil 209.

$$Fh = i * \partial \Phi / \partial h \qquad \text{Equation (22b)}$$

As described above, in the present embodiment, it is possible to apply force in the h-axis direction (Y direction) to the mover 101 by the force working between the coil 209 and the permanent magnet array 110a.

Also in the present embodiment, force components and torque components applied in respective axis directions are expressed by the following Equation (23a), (23b), (23c), (23d), (23e), and (23f), respectively, in the same manner as in the first to third embodiments.

$$Tx = \Sigma(Eq(j,P)*Ij) \qquad \text{Equation (23a)}$$

$$Ty = \Sigma(Eh(j,P)*Ij) \qquad \text{Equation (23b)}$$

$$Tz = \Sigma(Ed(j,P)*Ij) \qquad \text{Equation (23c)}$$

$$Twx = \Sigma\{(Eh(j,P)*Z(j,P) - Ed(j,P)*Y(j,P))*Ij\} \qquad \text{Equation (23d)}$$

$$Twy = \Sigma\{(Ed(j,P)*X(j,P) - Eq(j,P)*Z(j,P))*Ij\} \qquad \text{Equation (23e)}$$

$$Twz = \Sigma\{(Eq(j,P)*Y(j,P) - Eh(j,P)*X(j,P))*Ij\} \qquad \text{Equation (23f)}$$

Herein, also in the present embodiment, it is possible to obtain the coil current vector Is indicating current to be applied to the coil 209 by using the following Equation (21q) by performing calculation in which the torque contribution matrix M and the pseudo current vector K of six rows by one column are introduced in a similar manner to in the first to third embodiments.

$$Tr(M)*Inv(M*Tr(M))*Tq = Is \qquad \text{Equation (21q)}$$

Fifth Embodiment

A fifth embodiment of the present invention will be described with reference to FIG. 23A and FIG. 23B. Note that the same components as those in the above first to fourth embodiments are labeled with the same references, and the description thereof will be omitted or simplified.

In the present embodiment, a case where the Wy torque required to be applied is different between the L side and the R side of the mover 101 in the fourth embodiment will be described with reference to FIG. 23A and FIG. 23B.

Figure 23A:
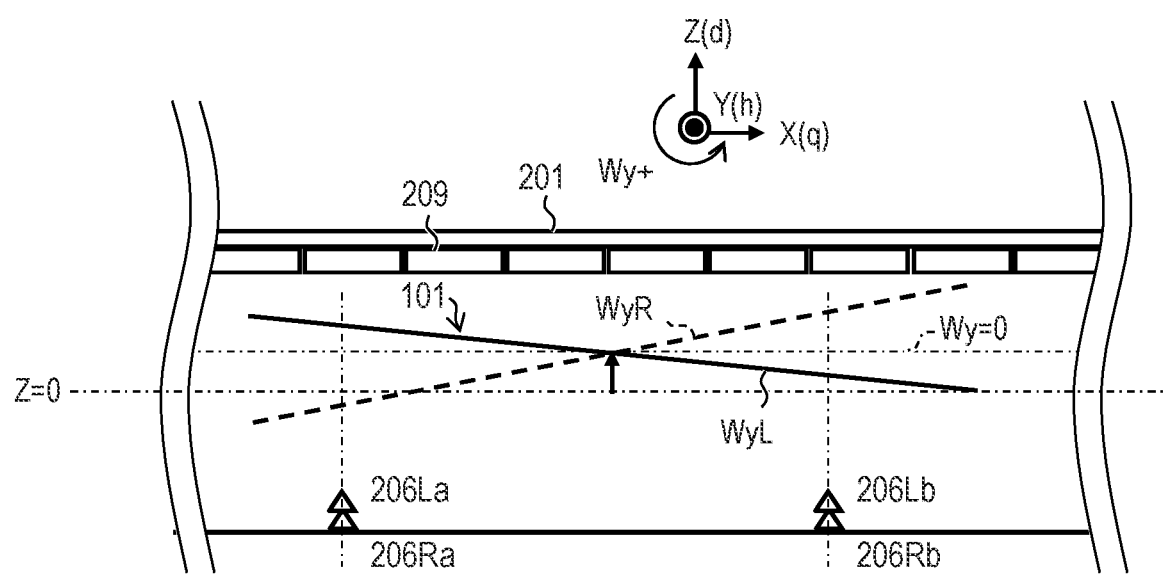
FIG. 23A is a schematic diagram schematically illustrating a case where a mover is transported in the X direction while being twisted in a transport system according to a fifth embodiment of the present invention.
Figure 23B:
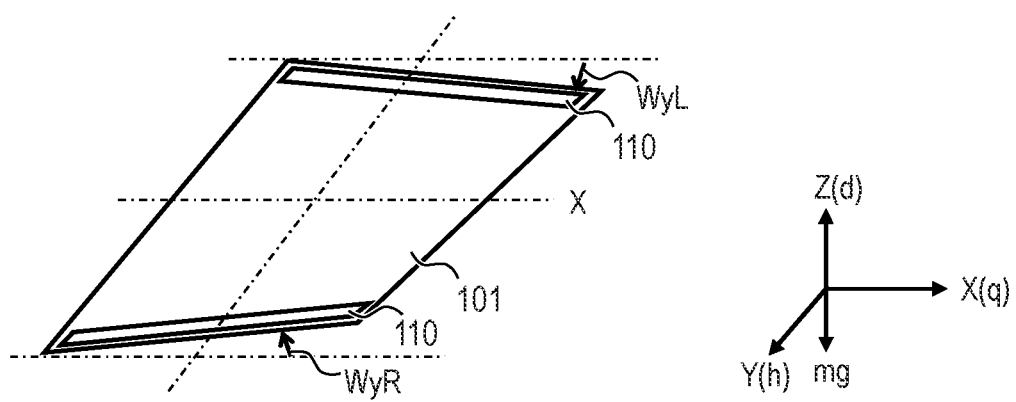
FIG. 23B is a schematic diagram schematically illustrating the case where the mover is transported in the X direction while being twisted in the transport system according to the fifth embodiment of the present invention.

FIG. 23A and FIG. 23B are schematic diagrams schematically illustrating a case where the mover 101 is transported in the X direction while being twisted. FIG. 23A is a diagram of the mover 101 when viewed from the Y direction, and the FIG. 23B is a diagram of the mover 101 when viewed from diagonally upper side.

As illustrated in FIG. 23A and FIG. 23B, the mover 101 may be transported while being deformed or vibrating in the twisted direction. A case where the mover 101 is twisted may include a case where the rotation angle WyR in the Wy direction on the R side of the mover 101 and the rotation angle WyL in the Wy direction on the L side of the mover 101 are different from each other, as illustrated in FIG. 23A. Such twist is one of the attitude components of the position and attitude P of the mover 101.

In the present embodiment, the Z-sensors 206 are arranged so as to be able to measure the displacements in the Wy direction of the mover 101 on the L side and the R side, respectively and independently. That is, the Z-sensors 206 are installed on the L side and the R side, respectively, and installed at intervals so that two or more Z-sensors 206 on each side can measure the displacement in the Wy direction of the mover 101 on each side wherever the mover 101 is present. For example, as illustrated in FIG. 23A, the displacement in the Wy direction of the mover 101 is measured by the Z-sensors 206La and 206Lb on the L side and the Z-sensors 206Ra and 206Rb on the R side. In general, if four or more Z-sensors 206 are installed and any three of them are not installed on one straight line, it is theoretically possible to calculate WyR and WyL separately. In the present embodiment, a plurality of Z-sensors 206 are installed so that WyR and WyL can be calculated separately.

In the present embodiment, the displacement in the Wy direction is measured by the Z-sensors 206 installed on the L side and the R side, respectively, to measure WyR and WyL. Then, in the same manner as in the case of other axes, a target value and the current value are used to calculate desired torque components TwyL and TwyR in the Wy direction to be applied to respective sides of the L side and the R side of the mover 101.

In more detail, in the present embodiment, instead of Equation (23e) in the fourth embodiment, the following Equations (23e1) and (23e2) are used.

$$TwyL = \Sigma L\{Ed(j,P)*X(j,P) - Eq(j,P)*Z(j,P)\}*Ij\} \qquad \text{Equation (23e1)}$$

$$TwyR = \Sigma R\{Ed(j,P)*X(j,P) - Eq(j,P)*Z(j,P)\}*Ij\} \qquad \text{Equation (23e2)}$$

In the following calculation, it is possible to obtain the coil current vector Is indicating current to be applied to the coil 209 by performing calculation in which the torque contribution matrix M and the pseudo current vector K are introduced in the same manner as in the fourth embodiment. Note that, in the present embodiment, the torque contribution matrix M is a matrix of seven rows by N columns, and the pseudo current vector K is a vector of seven rows by one column.

In such a way, in the present embodiment, when a twist of the mover 101 due to a displacement in the Wy direction occurs, it is possible to control the twist of the mover 101 by applying the torque components TwyL and TwyR in the Wy direction. For example, in the present embodiment, it is possible to apply the torque components TwyL and TwyR in the Wy direction to the mover 101 so as to cancel a twist of the mover 101 due to a displacement of the Wy direction.

As described above, according to the present embodiment, even when the mover 101 is twisted, it is possible to positively apply a torque component in the direction of the twist. Accordingly, it is possible to control a twist of the mover 101.

Thus, according to the present embodiment, it is possible to settle the displacement of the mover 101 in a shorter time because of positive application of torque rather than waiting for the twist or vibration to naturally stop. Therefore, according to the present embodiment, it is possible to transport the mover 101 more stably. In particular, the configuration according to the present embodiment is effective when the mover 101 is thin and has low rigidity in the Wy direction.

Note that, although the case where a twist of the mover 101 occurs due to a displacement in the Wy direction of the mover 101 has been described above, the case is not limited thereto. Also when a twist of the mover 101 occurs due to a displacement in the Wx direction of the mover 101 in the same manner as in the case of the Wy direction, it is possible to control the twist of the mover 101 in the same manner as in the case of the Wy direction.

Sixth Embodiment

A sixth embodiment of the present invention will be described with reference to FIG. 24A and FIG. 24B. Note that the same components as those in the above first to fifth embodiments are labeled with the same references, and the description thereof will be omitted or simplified.

The configuration of the transport system 1 according to the present embodiment will be described with reference to FIG. 24A. FIG. 24A is a schematic diagram illustrating the configuration of the transport system 1 including the mover 101 and the stator 201 according to the present embodiment. FIG. 24A is a diagram illustrating the mover 101 when viewed from the top to the bottom in the Z direction. Note that FIG. 24A illustrates the coils 209 shifted outward with respect to permanent magnet yoke composite arrays 111 for better visibility.

The transport system 1 according to the present embodiment differs from the configuration according to the fourth embodiment in that the permanent magnet yoke composite arrays 111 are installed instead of the permanent magnet arrays 110.

Figure 24A:
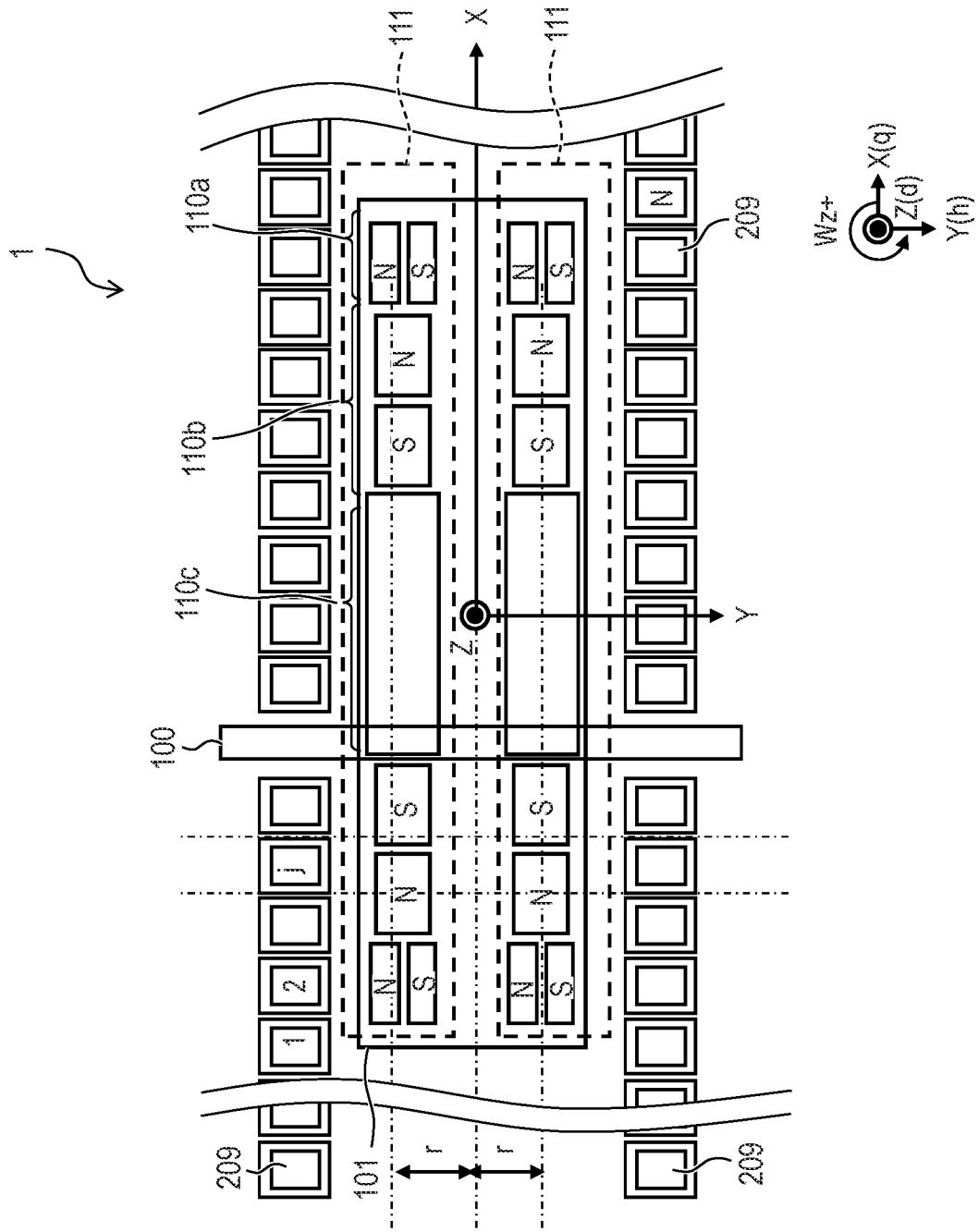
FIG. 24A is a schematic diagram illustrating a configuration of a transport system according to a sixth embodiment of the present invention.

As illustrated FIG. 24A, the mover 101 according to the present embodiment has the permanent magnet yoke composite arrays 111 instead of the permanent magnet arrays 110 as used in the fourth embodiment.

The permanent magnet yoke composite arrays 111 are installed in two lines parallel to the X direction at respective ends of the R side and the L side on the top face of the mover 101. Each array of the two lines of permanent magnet yoke composite arrays 111 has the same permanent magnet arrays 110a and 110b as those in the fourth embodiment and a yoke plate 110c. The yoke plate 110c is installed parallel to the X direction in the permanent magnet array 110b. The yoke plate 110c is an iron plate made of a substance having a large magnetic permeability, for example, iron.

Figure 24B:
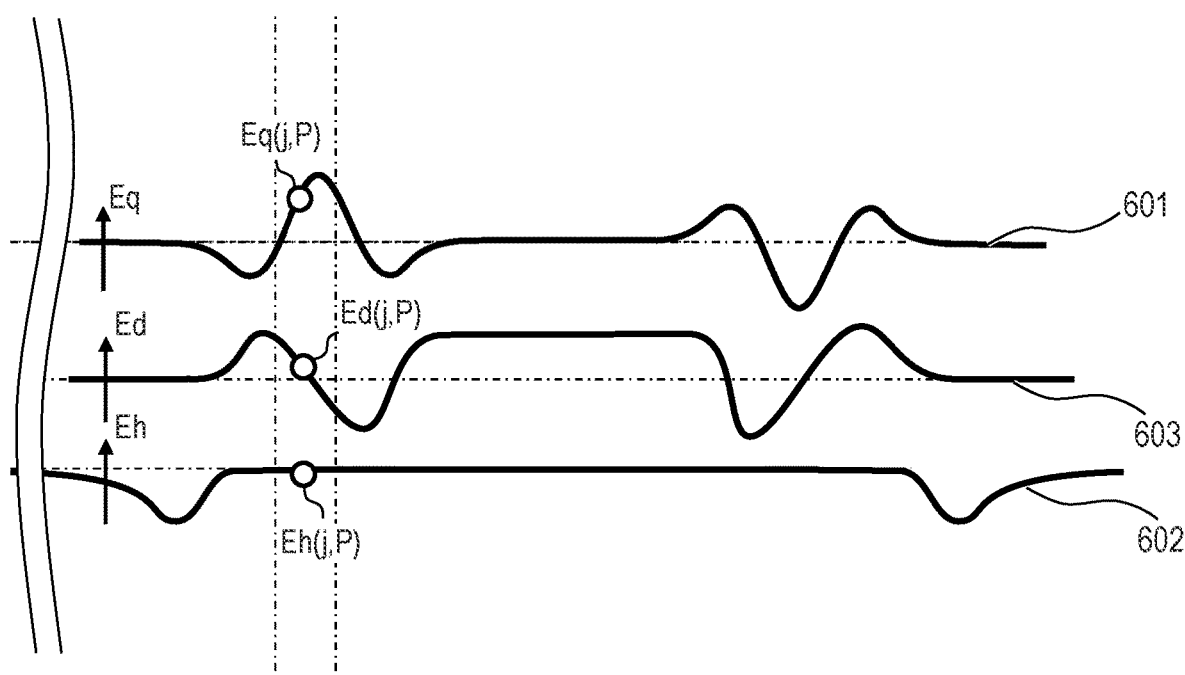
FIG. 24B is a graph illustrating a q-axis thrust constant profile, an h-axis constant profile, and a d-axis thrust constant profile in the transport system according to the sixth embodiment of the present invention.

In the present embodiment, because the yoke plate 110c is installed, the shapes of the q-axis thrust constant profile 601, the h-axis constant profile 602, and the d-axis thrust constant profile 603 differ from those of the fourth embodiment, as illustrated in FIG. 24B. Note that the dot-dashed lines arranged laterally in FIG. 24A and FIG. 24B indicate corresponding positions in the X direction.

Note that, also in the present embodiment, the coil current vector Is indicating current to be applied to the coil 209 can be obtained by the same method as that in the fourth embodiment.

In the present embodiment, since the yoke plate 110c is installed instead of permanent magnets, it is easy to cool the coil 209. In particular, the configuration according to the present embodiment is preferable when torque required in the X direction and the Y direction is small. Further, in the present embodiment, since usage of expensive permanent magnets can be reduced, a lower cost transport system 1 can be configured.

Seventh Embodiment

A seventh embodiment of the present invention will be described with reference to FIG. 25A and FIG. 25B. Note that the same components as those in the above first to sixth embodiments are labeled with the same references, and the description thereof will be omitted or simplified.

In the present embodiment, a case where the mover 101 is larger in the perpendicular direction than in the horizontal direction will be described with reference to FIG. 25A and FIG. 25B. FIG. 25A is a schematic diagram illustrating an example of the configuration of the transport system 1 when the mover 101 is larger in the perpendicular direction than in the horizontal direction. FIG. 25B is a schematic diagram illustrating another example of the configuration of the transport system 1 when the mover 101 is larger in the perpendicular direction than in the horizontal direction. FIG. 25A and FIG. 25B are diagrams of the mover 101 and the stator 201 when viewed from the X direction. In the present embodiment, the installation places of the permanent magnet arrays 110 and the coils 209 described in the fourth or fifth embodiment are changed, as described below.

Figure 25A:
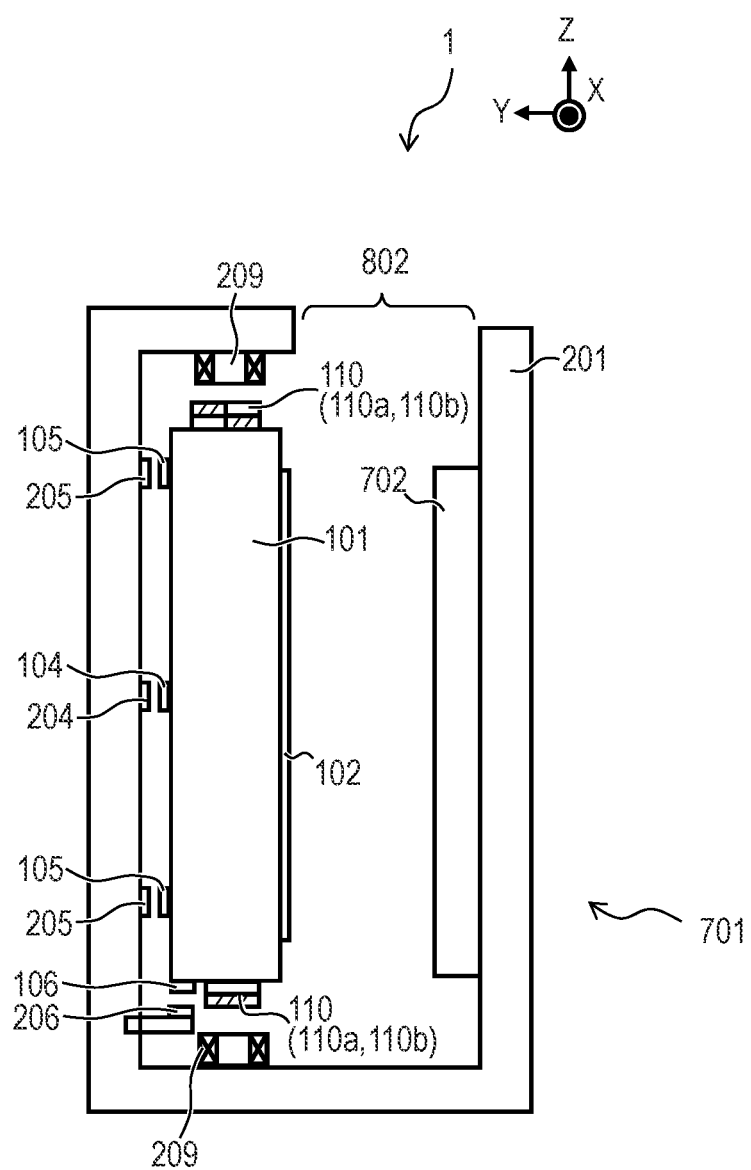
FIG. 25A is a schematic diagram illustrating a configuration of a transport system according to a seventh embodiment of the present invention.

As illustrated in FIG. 25A, the mover 101 is larger in the perpendicular direction than in the horizontal direction. That is, the mover 101 is larger in the Z direction than in the Y direction. Note that the mover 101 may be larger in the Z direction than in the X direction or may be smaller in the Z direction than in the X direction.

In the case of FIG. 25A, the permanent magnet arrays 110 are installed on the top face of the mover 101. Each permanent magnet array 110 installed on the top face of the mover 101 includes the permanent magnet arrays 110a and 110b. In the permanent magnet array 110a on the top face of the mover 101, two permanent magnets are installed such that the polarities of the outer magnetic poles facing the top on the stator 201 side differ alternatingly and the S-pole polarity and the N-pole polarity are arranged outside alternatingly in the Y direction. In the permanent magnet array 110b on the top face of the mover 101, a plurality of permanent magnets are installed such that the polarities of the outer magnetic poles facing the top on the stator 201 side differ alternatingly and the S-pole polarity and the N-pole polarity are arranged outside alternatingly in the X direction.

The coils 209 are installed on the top of the stator 201 so as to be able to face the permanent magnet array 110 on the top face of the mover 101 from the top along the Z direction. In such a way, large attractive force is generated between the permanent magnet array 110 installed on the top face of the mover 101 and the coils 209. Note that the yoke plate 103 may be installed instead of or in addition to the permanent magnet array 110 on the top face of the mover 101 so that the coils 209 face the yoke plate 103. Further, a magnet with a core can be used as the coil 209 in order to generate attractive force between the permanent magnet array 110 on the top face of the mover 101 and the coil 209 even when no current is applied thereto.

Further, as illustrated in FIG. 25A, the permanent magnet array 110 is installed on the under face of the mover 101. The permanent magnet array 110 installed on the under face of the mover 101 includes the permanent magnet arrays 110a and 110b. In the permanent magnet array 110a on the under face of the mover 101, two permanent magnets are installed such that the polarities of the outer magnetic poles facing the bottom on the stator 201 side differ alternatingly and the S-pole polarity and the N-pole polarity are arranged outside alternatingly in the Y direction. In the permanent magnet array 110b on the under face of the mover 101, a plurality of permanent magnets are installed such that the polarities of the outer magnetic poles facing the bottom on the stator 201 side differ alternatingly and the S-pole polarity and the N-pole polarity are arranged outside alternatingly in the X direction.

The coils 209 are installed on the bottom of the stator 201 so as to be able to face the permanent magnet array 110 on the under face of the mover 101 from the bottom along the Z direction.

The mover 101 that is larger in the perpendicular direction can be configured to hold the workpiece 102 such as s substrates on the side face of the mover 101. The vapor deposition source 702 that performs deposition on the workpiece 102 is installed on the stator 201 so as to face the workpiece 102 held on the side face of the mover 101.

Further, an opening 802 used for taking out the mover 101 is provided in the stator 201. The opening 802 is provided in the top of the stator 201. When an anomaly such as a power outage, a failure, or the like occurs, it is possible to raise the mover 101 via the opening 802 to evacuate by using a crane or the like from the upper side of the stator 201. This contributes to a stable operation of a production line including the transport system 1.

Further, the opening 802 can be easily provided in the stator 201 and thus is suitable for raising and collecting the mover 101 by using a crane or the like in a case of an anomaly.

Figure 25B:
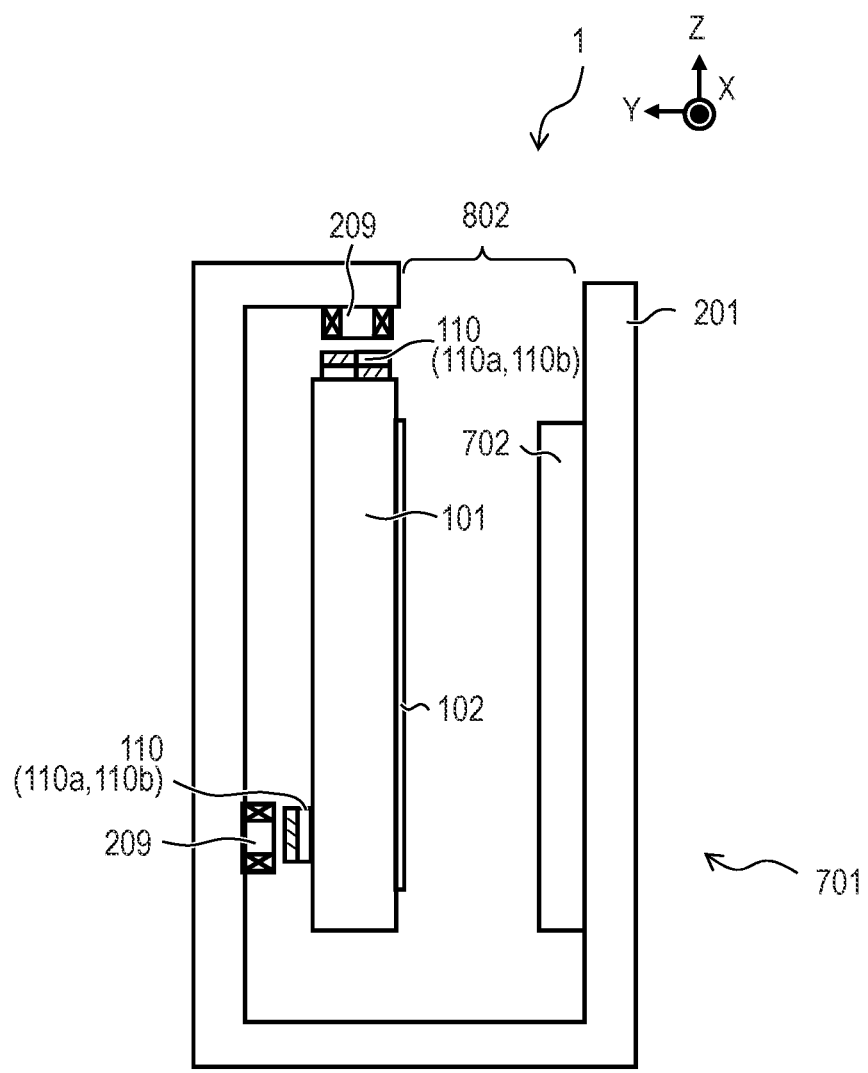
FIG. 25B is a schematic diagram illustrating the configuration of the transport system according to the seventh embodiment of the present invention.

Note that, instead of installing the permanent magnet array 110 on the under face of the mover 101, it is possible to install the permanent magnet array 110 on the side face of the mover 101, as illustrated in FIG. 25B. With such a configuration, the vertically long mover 101 can be more stably transported.

Note that, although the case where the installation places of the permanent magnet arrays 110 described in the fourth or fifth embodiment and the coils 209 are changed has been described above, the installation places of the permanent magnetic yoke composite arrays 111 described in the sixth embodiment can also be changed in the same manner as the case of the permanent magnet arrays 110 described above.

Eighth Embodiment

An eighth embodiment of the present invention will be described with reference to FIG. 26. Note that the same components as those in the above first to seventh embodiments are labeled with the same references, and the description thereof will be omitted or simplified.

In the present embodiment, a case where the permanent magnet arrays 110 are installed on the under face of the mover 101 will be described with reference to FIG. 26. FIG. 26 is a schematic diagram illustrating an example of the configuration of the transport system 1 when the permanent magnet arrays 110 are installed on the under face of the mover 101. FIG. 26 is a diagram of the mover 101 and the stator 201 when viewed from the X direction. In the present embodiment, the installation places of the permanent magnet arrays 110 and the coils 209 described in the fourth or fifth embodiment are changed, as described below.

Figure 26:
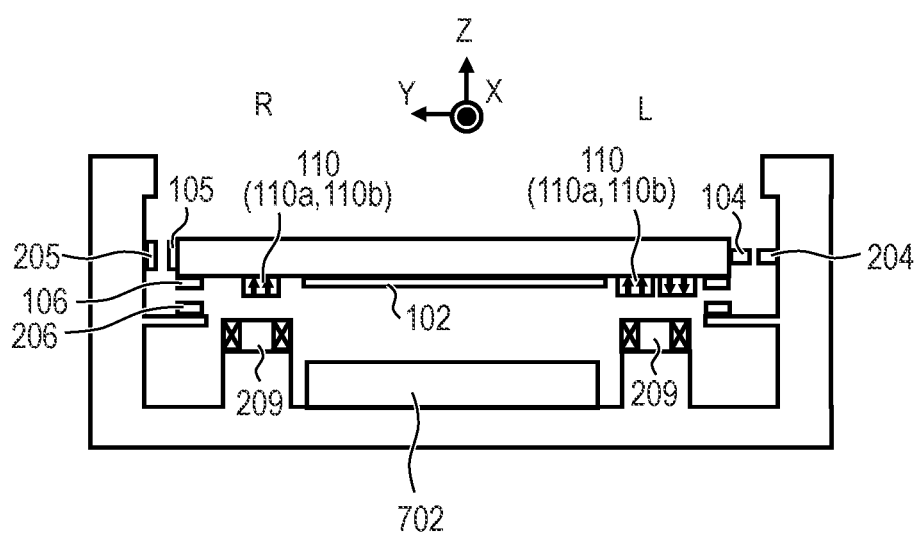
FIG. 26 is a schematic diagram illustrating a configuration of a transport system according to an eighth embodiment of the present invention.

As illustrated in FIG. 26, the permanent magnet arrays 110 are installed at respective ends on the L side and the R side on the under face of the mover 101. Each of the permanent magnet arrays 110 installed at respective ends of the L side and the R side includes permanent magnet arrays 110a and 110b. In the permanent magnet array 110a, two permanent magnets are installed such that the polarities of the outer magnetic poles facing the bottom on the stator 201 side differ alternatingly and the S-pole polarity and the N-pole polarity are arranged outside alternatingly in the Y direction. In the permanent magnet array 110b, a plurality of permanent magnets are installed such that the polarities of the outer magnetic poles facing the bottom on the stator 201 side differ alternatingly and the S-pole polarity and the N-pole polarity are arranged outside alternatingly in the X direction.

The coils 209 are installed on the stator 201 so as to be able to face the permanent magnet array 110 installed at respective ends on the L side and the R side on the under face of the mover 101 from the bottom along the Z direction.

In the case of the arrangement of the permanent magnet arrays 110 and the coils 209 illustrated in FIG. 26, the force between the permanent magnet array 110 and the coil 209 has a spring modulus in the positive direction, that is, when the current amount of the coil 209 is maintained at constant, the repulsive force created by the coil 209 increases as the mover 101 is lowered. Thus, the position of the mover 101 is stabilized in the Z direction. It is therefore possible to transport the mover 101 while more stabilizing the attitude of the mover 101.

Note that, although the case where the installation places of the permanent magnet arrays 110 described in the fourth or fifth embodiment and the coils 209 are changed has been described above, the installation places of the permanent magnetic yoke composite arrays 111 described in the sixth embodiment can also be changed in the same manner as the case of the permanent magnet arrays 110 described above.

Ninth Embodiment

A ninth embodiment of the present invention will be described with reference to FIG. 27. Note that the same components as those in the above first to eighth embodiments are labeled with the same references, and the description thereof will be omitted or simplified.

In the present embodiment, a case where the coil 202 used in the above embodiments has a permanent magnet 213 will be described with reference to FIG. 27. FIG. 27 is a diagram illustrating a cross section of the coil 202 according to the present embodiment when viewed from the X direction.

Figure 27:
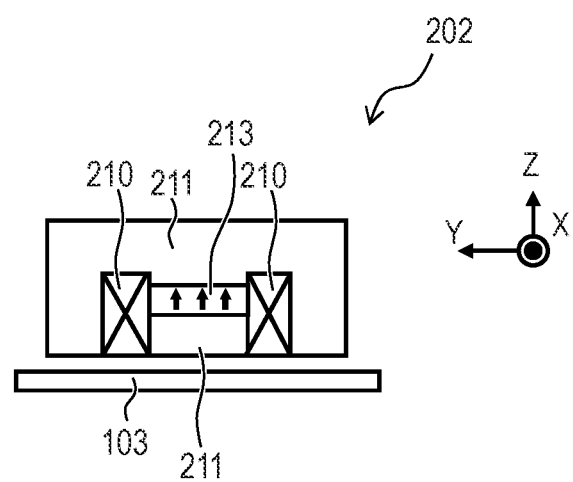
FIG. 27 is a schematic diagram illustrating a configuration of a transport system according to a ninth embodiment of the present invention.

As illustrated in FIG. 27, the coil 202 has the winding 210 and the core 211 around which the winding 210 is wound and further has the permanent magnet 213 inside the core 211. The permanent magnet 213 is provided inside the inner part of the core 211 wound with the winding 210 such that the N-pole and the S-pole are arranged in the Z direction as indicated by the arrows in FIG. 27.

For example, when the number of turns of a winding is 500 and the current value applied to the winding is 1 A in a coil, the magneto-motive force is 500 A, and if this is replaced with a neodymium magnet having magneto-motive force of 950 kA/m, the thickness of the magnet is around 1.05 mm. In such a way, the permanent magnet 213 exhibits the same effect as continuous application of constant current to the winding 210. It is therefore possible to design the thickness or the like of the permanent magnet 213 so that current applied to the winding 210 is reduced taking into consideration of the transport height of the referenced mover 101. With such use of the permanent magnet 213, current applied to the winding 210 during transportation of the mover 101 can be only the amount used for correcting the attitude variation of the mover 101, and it is possible to significantly reduce the current value applied to the coil 202.

Note that, other than the coil 202 described above, the coils 207, 208, and 209 as used in the above embodiments may be configured to have the permanent magnet 213.

Tenth Embodiment

A tenth embodiment of the present invention will be described with reference to FIG. 28A. Note that the same components as those in the above first to ninth embodiments are labeled with the same references, and the description thereof will be omitted or simplified.

In the present embodiment, a case where the shape of the core 211 of the coil 209 is changed in the configuration according to the fourth embodiment will be described with reference to FIG. 28A. FIG. 28A is a diagram illustrating a cross section of the coil 209 and the permanent magnet array 110a according to the present embodiment when viewed from the X direction.

The coil 209 according to the present embodiment is installed so as to face the permanent magnet array 110a including the permanent magnets 110aR and 110aL along the Z direction in the same manner as the case of the fourth embodiment illustrated in FIG. 22. The coil 209 has the winding 210 and the core 211 around which the winding 210 is wound. In the permanent magnet array 110a, the permanent magnets 110aR and 110aL are installed so as to be arranged in the Y direction.

Figure 28A:
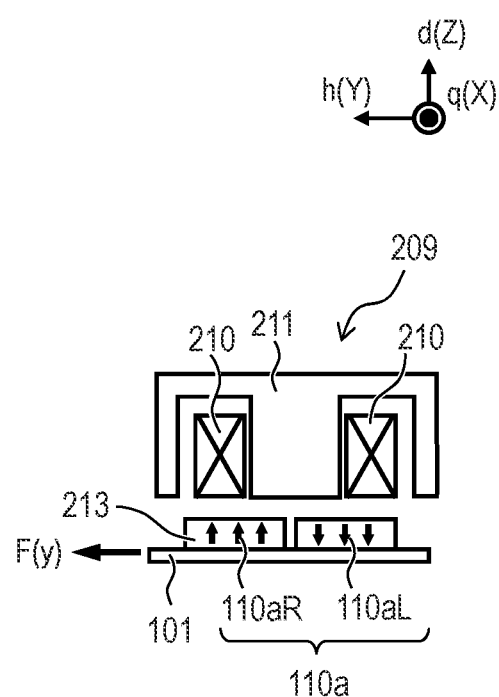
FIG. 28A is a schematic diagram illustrating a configuration of a transport system according to a tenth embodiment of the present invention.

On the other hand, unlike the case of the fourth embodiment illustrated in FIG. 22, the core 211 of the coil 209 has a center portion around which the winding 210 is wound and an extension portion extending from the center portion to the outside of the winding 210 along the Y direction as illustrated in FIG. 28A in the present embodiment. Note that the extension portion of the core 211 may extend to the outside of the winding 210 partially along the Y direction or may extend to the outside over the whole circumference of the winding 210.

In the present embodiment, with such a configuration in which the core 211 has the extension portion, a change in the interlinkage flux Φ when the permanent magnet array 110a moves in the h-axis direction (Y direction) increases. Thus, the present embodiment is advantageous because the force per unit current to the h-axis direction (Y direction) increases. Therefore, in the present embodiment, it is possible to more stably transport the mover 101.

Note that, although the case where the shape of the core 211 of the coil 209 is changed in the configuration according to the fourth embodiment has been described above, the shape of the core 211 can be changed in the same manner as the above also in the configuration of the fifth and sixth embodiments.

Eleventh Embodiment

An eleventh embodiment of the present invention will be described with reference to FIG. 28B. Note that the same components as those in the above first to tenth embodiments are labeled with the same references, and the description thereof will be omitted or simplified.

In the present embodiment, a case where the configuration of the permanent magnet array 110a is changed in the configuration according to the tenth embodiment will be described with reference to FIG. 28B. FIG. 28B is a diagram illustrating a cross section of the coil 209 and the permanent magnet array 110a according to the present embodiment when viewed from the X direction.

Figure 28B:
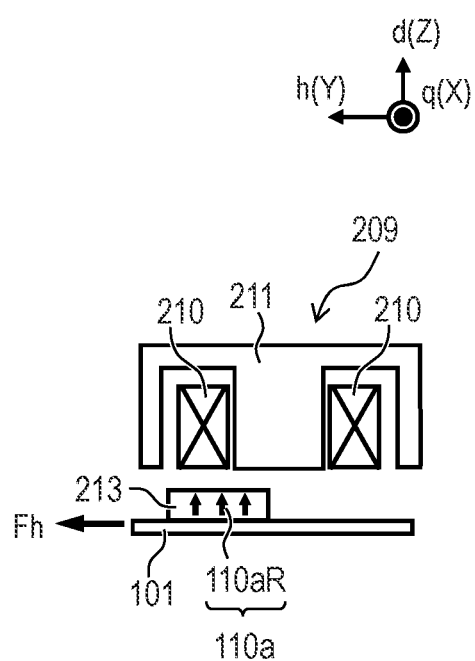
FIG. 28B is a schematic diagram illustrating a configuration of a transport system according to an eleventh embodiment of the present invention.

In the present embodiment, as illustrated in FIG. 28B, the permanent magnet 110aL that is one of the permanent magnets 110aR and 110aL in the permanent magnet array 110a is eliminated. Also in such a case, since there is a change in the interlinkage flux Φ when the permanent magnet array 110a moves in the h-axis direction (Y direction), force in the h-axis direction (Y direction) can be applied to the mover 101. In the present embodiment, although the magnitude of force applied in the Y direction is smaller, since the number of permanent magnets can be reduced, this is preferable for a case where a reduction in weight of the mover 101 is required or the like.

Twelfth Embodiment

A twelfth embodiment of the present invention will be described with reference to FIG. 29. Note that the same components as those in the above first to eleventh embodiments are labeled with the same references, and the description thereof will be omitted or simplified.

In the present embodiment, a case where the mover 101 is configured to be able to be inverted such that the top face and the under face are exchanged in the configuration according to the fourth embodiment will be described with reference to FIG. 29. FIG. 29 is a schematic diagram illustrating the configuration of the transport system 1 according to the present embodiment. FIG. 29 is a diagram of the mover 101 and the stator 201 according to the present embodiment when viewed from the X direction. In the present embodiment, even in a state where the permanent magnet arrays 110a and 110b are inverted due to the inversion of the mover 101 whose top face and under face are exchanged in the configuration of the fourth embodiment, the permanent magnet arrays 110a and 110b can be used for floating transportation of the mover 101.

When the process apparatus forming the processing system together with the transport system 1 is a vapor deposition apparatus, the workpiece 102 attached to the mover 101 is often a substrate such as a glass substrate. When the substrate as the workpiece 102 is attached to the mover 101, if it is possible to allow the workpiece holding face of the mover 101 that holds the workpiece 102 by adsorption or the like to face the upward direction, this can improve work efficiency and thus is preferable. When the workpiece 102 is held, the mover 101 is in a state where the work holding face that is the top face or the under face thereof, that is, a deposition face D is oriented upward. After the workpiece 102 is held by the mover 101 in the state, the mover 101 is rotated and inverted by 180 degrees in the Wy direction with the workpiece 102 being held by the mover 101, and transportation of the mover 101 can then be started.

In the present embodiment, when the mover 101 is transported as described above, the mover 101 is transported by using the same coil 209 for both of a case where the mover 101 is transported from the initial position thereof to a position where the workpiece 102 is held and a case where the mover 101 is transported after the workpiece 102 is held and inverted.

Figure 29:
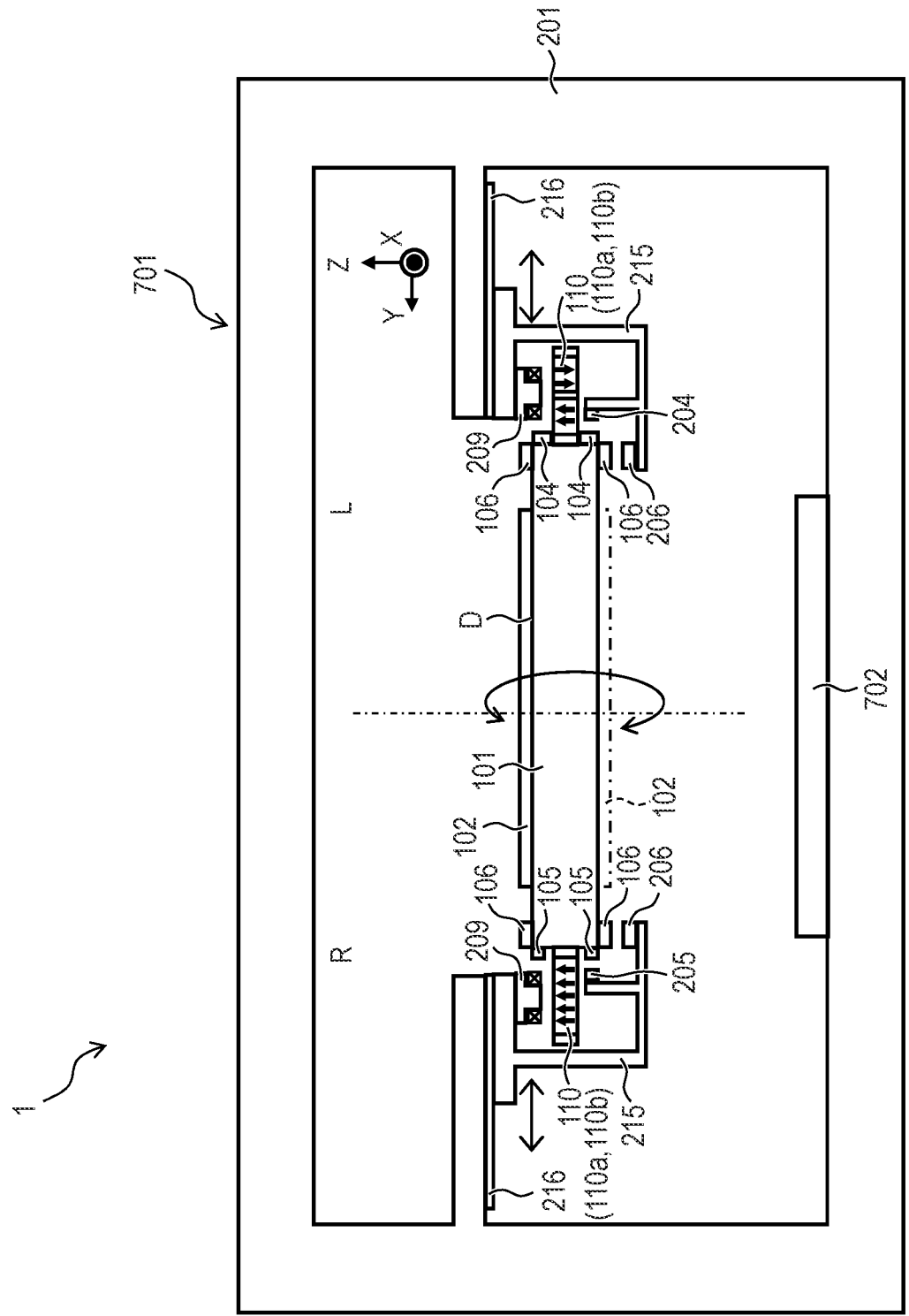
FIG. 29 is a schematic diagram illustrating a configuration of a transport system according to a twelfth embodiment of the present invention.

In the present embodiment, as illustrated in FIG. 29, the permanent magnet arrays 110 are installed on the side faces of the mover 101. That is, the permanent magnet array 110 including the permanent magnet arrays 110a and 110b are installed on each side face on the L side and the R side of the mover 101. In the permanent magnet array 110a, two permanent magnets are installed such that the polarities of the outer magnetic poles facing the top on the stator 201 side differ alternatingly and the S-pole polarity and the N-pole polarity are arranged outside alternatingly in the Y direction. In the permanent magnet array 110b, a plurality of permanent magnets are installed such that the polarities of the outer magnetic poles facing the top on the stator 201 side differ alternatingly and the S-pole polarity and the N-pole polarity are arranged outside alternatingly in the X direction.

In the present embodiment, no yoke is installed on the top face of the permanent magnet arrays 110a and 110b on the top face side of the mover 101. Further, similarly, no yoke is installed on the under face of the permanent magnet arrays 110a and 110b on the under face side of the mover 101. Since no yoke is installed, both the top face and the under face of the permanent magnet arrays 110a and 110b are opened. Thus, the permanent magnet arrays 110a and 110b are able to allow one or the other of the magnetic poles to face the coils 209 installed on the stator 201 for both cases where the mover 101 directs the deposition face D upward and directs the deposition face D downward.

As described above, the mover 101 on which the permanent magnet arrays 110 are installed can be inverted so that the top face and the under face are exchanged. The inversion of the permanent magnet array 110 is performed by an inversion mechanism installed at a place where the mover 101 is to be inverted.

The coils 209 are installed on the stator 201 via a bracket 215 and a rail 216 on each side of the L side and the R side so as to face the permanent magnet array 110 along the Z direction. The coils 209 facing the permanent magnet array 110 are attached and installed on the bracket 215, respectively, on each side of the L side and the R side. Each bracket 215 is installed on the rail 216 so as to be movable in the Y direction on the rail 216. Each bracket 215 can move on the rail 216 and evacuate outside when the mover 101 is inverted. While each bracket 215 has evacuated, an inversion apparatus (not illustrated) can perform an operation of exchanging the top face and the under face of the mover 101.

In such a way, in the present embodiment, the permanent magnet array 110 including the permanent magnet arrays 110a and 110b is provided to the mover 101 so that the plurality of coils 209 can face the permanent magnet array 110 before and after inversion of the mover 101.

Further, in the present embodiment, the linear scales 104, the Y-targets 105, and the Z-targets 106 are installed on the upper portion and the lower portion of the mover 101, respectively. The linear scales 104, the Y-targets 105, and the Z-targets 106 installed on the upper portion and the lower portion of the mover 101 are arranged in an axial symmetry manner around an inversion axis as a symmetry axis around which the mover 101 is rotated and inverted, for example, respectively.

The linear encoders 204 are installed on the stator 201 so as to be able to measure one of the linear scales 104 installed on the upper portion and the lower portion of the mover 101 for both cases where the deposition face D of the mover 101 faces upward and faces downward. Further, the Y-sensors 205 are installed on the stator 201 so as to be able to measure one of the Y-targets 105 installed on the upper portion and the lower portion of the mover 101 for both cases where the deposition face D of the mover 101 faces upward and faces downward. Further, the Z-sensors 206 are installed on the stator 201 so as to be able to measure one of the Z-targets 106 installed on the upper portion and the lower portion of the mover 101 for both cases where the deposition face D of the mover 101 faces upward and faces downward. In such a way, also in the present embodiment, the linear scales 104, the Y-sensors 205, and the Z-sensors 206 can be used to measure the position and attitude (X, Y, Z, Wx, Wy, Wz) of the mover 101 that can be inverted.

According to the present embodiment, even with the mover 101 that can be inverted, it is possible to transport the mover 101 in a contactless manner stably in the X direction while stabilizing the attitude of the mover 101 in the Y direction, the Z direction, the Wx direction, the Wy direction, and the Wz direction.

Note that, although the case where the mover 101 can be inverted so that the top face and the under face are exchanged in the configuration in the fourth embodiment has been described above, the mover 101 can also be inverted in the configuration of the fifth and sixth embodiments in the same manner as described above.

Modified Embodiments

The present invention is not limited to the embodiments described above, and various modifications are possible.

For example, although the cases where the position and the attitude of the mover 101 are controlled in the X direction, the Y direction, the Z direction, the Wx direction, the Wy direction, and the Wz direction have been described as examples in the above embodiments, the embodiment is not limited thereto. The displacement may be acquired in at least any one of directions of the X direction, the Y direction, the Z direction, the Wx direction, the Wy direction, and the Wz direction to control the position and the attitude.

Further, although the cases where the electromagnetic force received by the yoke plate 103 or the permanent magnet arrays 109 and 110 from the coils 202 or 209 is used as floating force to cause the mover 101 to float has been described as examples in the above embodiments, the embodiment is not limited thereto. For example, when the mass of the mover 101 or the mass of the workpiece 102 placed on the mover 101 is large and floating force to be applied in the perpendicular direction is large, a separate static pressure from a fluid such as air may be used for floating to assist the floating force.

Further, although the magnetic floating type transport system 1 that causes the mover 101 to float and transport the mover 101 in a contactless manner has been described in the above embodiments, the embodiment is not limited thereto. For example, the transport system 1 may be a system that transports the mover 101 configured to be movable along and in contact with a guide rail installed along the transport direction.

Further, although the cases where a predetermined number of lines of a plurality of coils 202, 207, 208, or 209 are arranged have been described as examples in the above embodiment, the embodiment is not limited thereto. A predetermined number of lines of each coil can be arranged in accordance with the yoke plate 103, the conductive plate 107, or the permanent magnet array 109 or 110 arranged in the mover 101.

Further, the transport system according to the present invention can be used as a transport system that transports a workpiece together with a mover to an operation area of each process apparatus such as a machine tool that performs each operation process on the workpiece that is an article in a manufacturing system that manufactures an article such as an electronic device. The process apparatus that performs the operation process may be any apparatus such as an apparatus that performs assembly of a component to a workpiece, an apparatus that performs painting, or the like. Further, the article to be manufactured is not limited to a particular article and may be any component.

As described above, the transport system according to the present invention can be used to transport a workpiece to an operation area, perform an operation process on the workpiece transported in the operation area, and manufacture an article. According to the embodiments described above, it is possible to transport a mover stably in a contactless state while controlling the attitude of the mover.

Other Embodiments

Embodiments of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiments and/or that includes one or more circuits (e.g., application specific integrated circuit (ASIC)) for performing the functions of one or more of the above-described embodiments, and by a method performed by the computer of the system or apparatus by, for example, reading out and executing the computer executable instructions from the storage medium to perform the functions of one or more of the above-described embodiments and/or controlling the one or more circuits to perform the functions of one or more of the above-described embodiments. The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2020-019842, filed Feb. 7, 2020, which is hereby incorporated by reference herein in its entirety.

What is claimed is:

1. A transport system comprising:
a mover that is movable in a transport direction;
a stator that has a plurality of coils arranged in the transport direction and applies force to the mover by using the plurality of coils to which current is applied;
an acquisition unit that acquires a position and an attitude of the mover moving in the transport direction; and
a control unit that controls the force by current applied to the plurality of coils based on the acquired position and the acquired attitude of the mover,
wherein the acquisition unit acquires, as the position and the attitude,
a displacement in a first direction that is the transport direction, and
at least one of a displacement in a second direction crossing the first direction, a displacement in a third direction crossing the first direction and the second direction, a displacement in a fourth direction around an axis along the first direction, a displacement in a fifth direction around an axis along the second direction, and a displacement in a sixth direction around an axis along the third direction,
wherein the mover has a permanent magnet array including a first permanent magnet array in which a plurality of permanent magnets are arranged along the first direction and a second permanent magnet array in which a plurality of permanent magnets are arranged along the third direction,
wherein the plurality of coils face the first permanent magnet array and the second permanent magnet array,
wherein the control unit controls at least one of respective components of the first to sixth directions by controlling current applied to the plurality of coils,
wherein the acquisition unit acquires a twist of a mover due to a displacement in the first direction or the third direction, and
wherein the control unit controls the twist of the mover by controlling current applied to the plurality of coils.

2. The transport system according to claim 1,
wherein the mover has a first yoke plate,
wherein the plurality of coils include a plurality of first coils facing the first yoke plate, and
wherein the control unit controls at least one of a component in the second direction of the force, a component in the fourth direction, and a component in the sixth direction by controlling current applied to the first coils.

3. The transport system according to claim 2, wherein the plurality of first coils face the first yoke plate along the second direction.

4. The transport system according to claim 3,
wherein the mover has a conductive plate,
wherein the plurality of coils include a plurality of third coils facing the conductive plate, and
wherein the control unit controls a component in the first direction of the force by controlling current applied to the plurality of third coils.

5. The transport system according to claim 2,
wherein the mover has a permanent magnet array in which a plurality of permanent magnets are arranged along the first direction,
wherein the plurality of coils include a plurality of second coils facing the permanent magnet array, and wherein the control unit controls at least any one of a component in the first direction of the force, a component in the third direction of the force, and a component in the fifth direction by controlling current applied to the plurality of second coils.

6. The transport system according to claim 1,
wherein the mover has a second yoke plate,
wherein the plurality of coils include a plurality of second coils facing the second yoke plate, and
wherein the control unit controls at least one of a component in the third direction of the force and a component in the fifth direction by controlling current applied to the plurality of second coils.

7. The transport system according to claim 6, wherein the plurality of second coils face the second yoke plate along the third direction.

8. The transport system according to claim 1,
wherein the mover has a permanent magnet array in which a plurality of permanent magnets are arranged along the first direction,
wherein the plurality of coils include a plurality of first coils facing the permanent magnet array, and
wherein the control unit controls at least one of a component in the first direction of the force, a component in the second direction of the force, a component in the fourth direction of the force, and a component in the sixth direction of the force by controlling current applied to the plurality of first coils.

9. The transport system according to claim 8,
wherein the mover has a yoke plate,
wherein the plurality of coils include a plurality of second coils facing the yoke plate, and
wherein the control unit controls at least any one of a component in the third direction of the force and a component in the fifth direction of the force by controlling current applied to the plurality of second coils.

10. The transport system according to claim 9, wherein the plurality of second coils face the yoke plate along the third direction.

11. The transport system according to claim 1, wherein a yoke plate installed along the first direction is further provided in the first permanent magnet array.

12. The transport system according to claim 1, wherein the permanent magnet array is installed on an under face of the mover.

13. The transport system according to claim 1,
wherein the coil has a core and a winding wound around the core, and
wherein a permanent magnet is provided inside the core.

14. A processing system comprising:
the transport system according to claim 1; and
a process apparatus that performs processing on a workpiece transported by the mover.

15. A transport system comprising:
a mover that is movable in a transport direction;
a stator that has a plurality of coils arranged in the transport direction and applies force to the mover by using the plurality of coils to which current is applied;
an acquisition unit that acquires a position and an attitude of the mover moving in the transport direction; and
a control unit that controls the force by current applied to the plurality of coils based on the acquired position and the acquired attitude of the mover,
wherein the acquisition unit acquires, as the position and the attitude,
a displacement in a first direction that is the transport direction, and
at least one of a displacement in a second direction crossing the first direction, a displacement in a third direction crossing the first direction and the second direction, a displacement in a fourth direction around an axis along the first direction, a displacement in a fifth direction around an axis along the second direction, and a displacement in a sixth direction around an axis along the third direction,
wherein the mover has a permanent magnet array including a first permanent magnet array in which a plurality of permanent magnets are arranged along the first direction and a second permanent magnet array in which a plurality of permanent magnets are arranged along the third direction,
wherein the plurality of coils face the first permanent magnet array and the second permanent magnet array,
wherein the control unit controls at least one of respective components of the first to sixth directions by controlling current applied to the plurality of coils,
wherein the mover is larger in the second direction than in the third direction, and
wherein the permanent magnet arrays are installed on at least one selected from a side face and an under face of the mover and on a top face of the mover.

16. A processing system comprising:
the transport system according to claim 15; and
a process apparatus that performs processing on a workpiece transported by the mover.

17. A transport system comprising:
a mover that is movable in a transport direction;
a stator that has a plurality of coils arranged in the transport direction and applies force to the mover by using the plurality of coils to which current is applied;
an acquisition unit that acquires a position and an attitude of the mover moving in the transport direction; and
a control unit that controls the force by current applied to the plurality of coils based on the acquired position and the acquired attitude of the mover,
wherein the acquisition unit acquires, as the position and the attitude,
a displacement in a first direction that is the transport direction, and
at least one of a displacement in a second direction crossing the first direction, a displacement in a third direction crossing the first direction and the second direction, a displacement in a fourth direction around an axis along the first direction, a displacement in a fifth direction around an axis along the second direction, and a displacement in a sixth direction around an axis along the third direction,
wherein the mover has a permanent magnet array including a first permanent magnet array in which a plurality of permanent magnets are arranged along the first direction and a second permanent magnet array in which a plurality of permanent magnets are arranged along the third direction,
wherein the plurality of coils face the first permanent magnet array and the second permanent magnet array,
wherein the control unit controls at least one of respective components of the first to sixth directions by controlling current applied to the plurality of coils,
wherein the mover is configured to be inverted so that a top face and an under face are exchanged, and
wherein the permanent magnet array is provided to the mover so that the plurality of coils are configured to face the mover before and after inversion of the mover.

18. A processing system comprising:
the transport system according to claim 17; and
a process apparatus that performs processing on a workpiece transported by the mover.

19. An article manufacturing method for manufacturing an article by using the processing system according to claim 14, the article manufacturing method comprising steps of:
transporting the workpiece by using the mover; and
performing, by using the process apparatus, the processing on the workpiece transported by the mover.

* * * * *